(12) United States Patent
Tanida et al.

(10) Patent No.: US 8,552,545 B2
(45) Date of Patent: Oct. 8, 2013

(54) MANUFACTURING METHOD FOR SEMICONDUCTOR DEVICE, SEMICONDUCTOR DEVICE AND SEMICONDUCTOR CHIP

(75) Inventors: Kazumasa Tanida, Miyagi (JP); Mitsuo Umemoto, Osaka (JP); Yukiharu Akiyama, Tokyo (JP)

(73) Assignees: Rohm Co., Ltd., Kyoto (JP); Renesas Technology Corp., Tokyo (JP)

( * ) Notice: Subject to any disclaimer, the term of this patent is extended or adjusted under 35 U.S.C. 154(b) by 807 days.

(21) Appl. No.: 11/085,265

(22) Filed: Mar. 22, 2005

(65) Prior Publication Data

US 2005/0230804 A1 Oct. 20, 2005

(51) Int. Cl.
H01L 23/02 (2006.01)
H01L 23/48 (2006.01)
H01L 23/52 (2006.01)

(52) U.S. Cl.
USPC ............................ 257/686; 257/698; 257/777

(58) Field of Classification Search
USPC ........... 257/685–686, 690, 698, 777, E23.085
See application file for complete search history.

(56) References Cited

U.S. PATENT DOCUMENTS

| 6,087,719 | A * | 7/2000 | Tsunashima ................ 257/686 |
| 6,362,529 | B1 | 3/2002 | Sumikawa et al. |
| 6,809,421 | B1 * | 10/2004 | Hayasaka et al. ............ 257/777 |
| 6,841,883 | B1 | 1/2005 | Farnworth et al. |
| 2002/0180020 | A1 * | 12/2002 | Lin et al. ....................... 257/686 |
| 2002/0182220 | A1 | 12/2002 | Srivastava |
| 2003/0062620 | A1 | 4/2003 | Shibata |
| 2003/0232486 | A1 | 12/2003 | Mashino |
| 2004/0188837 | A1 | 9/2004 | Kim et al. |
| 2005/0104171 | A1 * | 5/2005 | Benson et al. ................ 257/678 |

FOREIGN PATENT DOCUMENTS

| JP | 2001127243 | 5/2001 |
| JP | 2003282819 | 10/2003 |

OTHER PUBLICATIONS

Foreign Office Action issued on Jul. 25, 2008 in the corresponding CN application 200510059014.1 with an English translation.
"Proceedings of the 2003 VMIC (VLSI Multi-Level Interconnection) Conference," M. Hoshino et al., Sep. 2003, pp. 243-246.
"Proceedings of the 2003 Electronic Compounds and Technology Conference," Kazumasa Tanida et al., May 2003, pp. 1084-1089.

* cited by examiner

Primary Examiner — Cuong Q Nguyen
(74) Attorney, Agent, or Firm — Rabin & Berdo, P.C.

(57) ABSTRACT

A manufacturing method for a semiconductor device includes: the step of preparing a semiconductor chip which is provided with a functional element formed on a front surface side of a semiconductor substrate, a feedthrough electrode which is placed within a through hole that penetrates the semiconductor substrate, a front surface side connection member which protrudes from the front surface, and a rear surface side connection member which has a joining surface within a recess that is formed in a rear surface; the step of preparing a solid-state device where a solid-state device side connection member for connection to the front surface side connection member is formed on one surface; and the joining step of making the front surface of the semiconductor chip face the first surface of the solid-state device by holding the rear surface of the semiconductor chip, and of joining the front surface side connection member to the solid-state device side connection member.

11 Claims, 25 Drawing Sheets

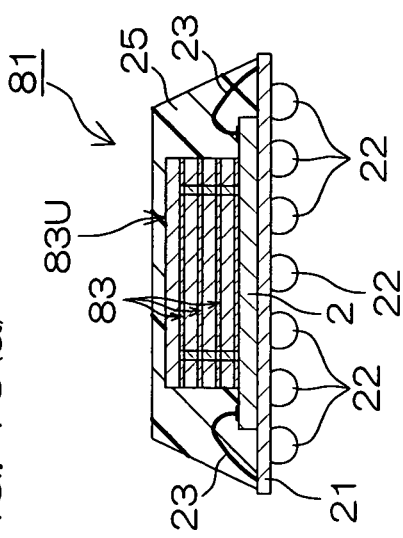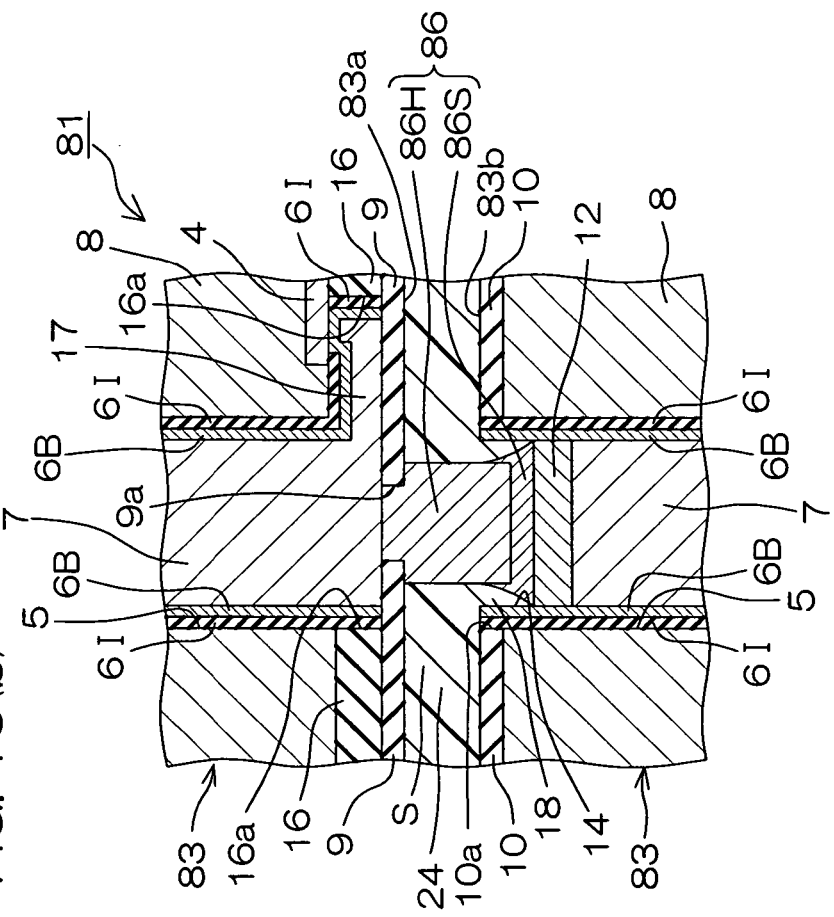
FIG. 16(a)
FIG. 16(b)

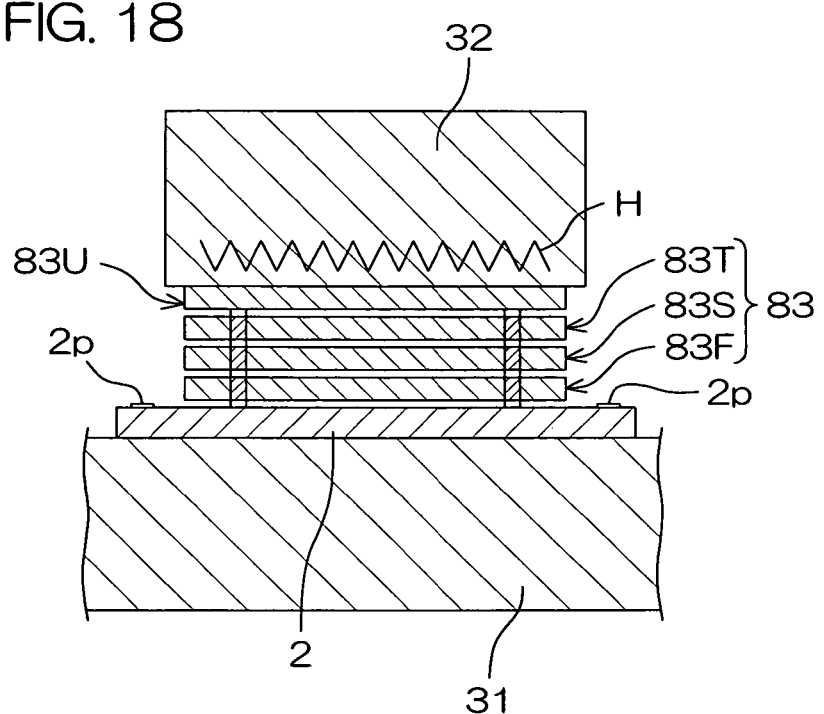

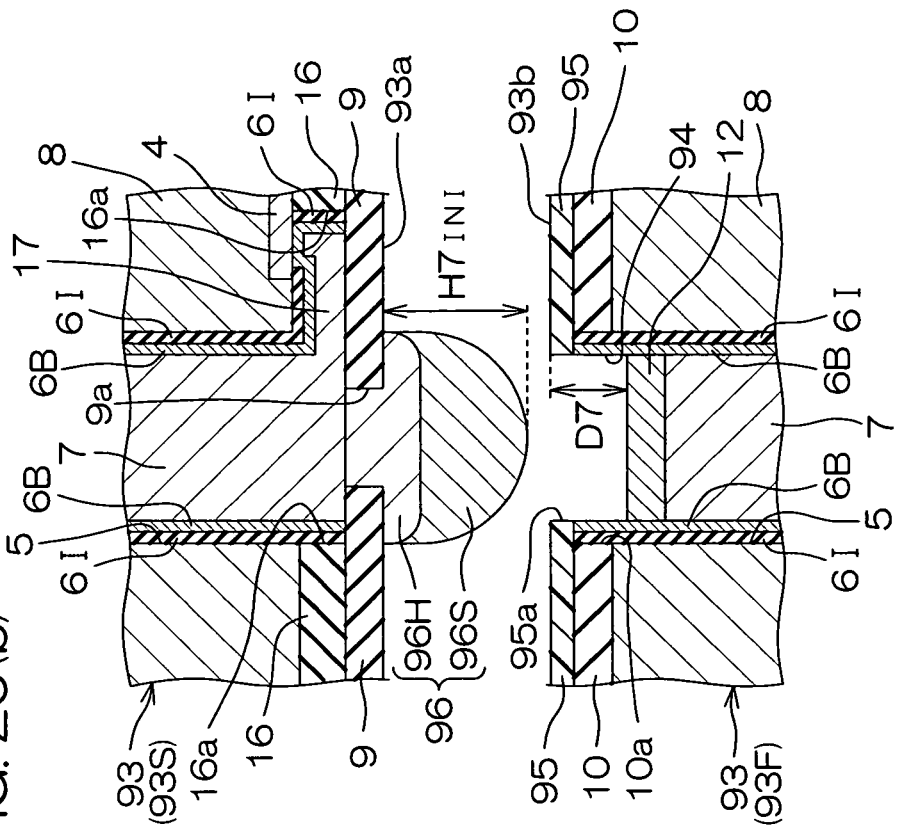

MANUFACTURING METHOD FOR SEMICONDUCTOR DEVICE, SEMICONDUCTOR DEVICE AND SEMICONDUCTOR CHIP

BACKGROUND OF THE INVENTION

1. Field of the Invention

This invention relates to a semiconductor device having a multi-chip stack structure, where a solid-state device and one or more semiconductor chips are stacked and joined, and a manufacturing method for the same, as well as a semiconductor chip which is used in such a manufacturing method.

2. Description of Related Art

A semiconductor device having a multi-chip stack structure where one or more semiconductor chips are stacked on the surface of a solid-state device such as a semiconductor chip or a wiring substrate has been conventionally known.

FIG. 30(a) and FIG. 30(b) are illustrative cross-sectional diagrams showing the structure of a conventional semiconductor device having a multi-chip stack structure. A semiconductor device having such a structure is disclosed in, for example, "Proceedings of the 2003 VMIC (VLSI Multi-Level Interconnection) Conference," M. Hoshino et al., September 2003, pp. 243-246.

This semiconductor device 101 includes a solid-state device 102, such as a wiring substrate or a semiconductor chip, and a plurality of (2, in this example) semiconductor chips 103 which are stacked on solid-state device 102. FIG. 30(a) shows an arrangement of solid-state device 102 and two semiconductor chips 103, and FIG. 30(b) shows a portion where two semiconductor chips 103 are joined and the area in the vicinity thereof, in an enlarged view.

These semiconductor chips 103 have structures which are similar to each other, and a functional element 104 (not shown in FIG. 30(a)) is formed on one of the surfaces (hereinafter referred to as "front surface") 103a of each chip. Each semiconductor chip 103 is joined to solid-state device 102 in a manner where its front surface 103a faces the solid-state device 102 side in a so-called facedown style.

Each semiconductor chip 103 is provided with a semiconductor substrate 108, where through holes 105 are formed so as to penetrate semiconductor substrate 108 in the direction of its thickness. The inside of each through hole 105 is almost completely filled with a feedthrough electrode 107. Feedthrough electrode 107 is electrically connected to functional element 104 so that feedthrough electrode 107 allows an electrical connection between surface (hereinafter referred to as "rear surface") 103b on the side opposite front surface 103a of semiconductor chip 103 and functional element 104.

An insulating film 106 (not shown in FIG. 30(a)) is formed on the inner wall of through hole 105 so that insulating film 106 electrically insulates feedthrough electrode 107 from semiconductor substrate 108.

The surfaces of semiconductor substrate 108 on the front surface 103a side and on the rear surface 103b side are respectively covered with a front surface protective film 109 and a rear surface protective film 110. Openings 109a and 110a are respectively formed in front surface protective film 109 and in rear surface protective film 110.

On the front surface 103a side, feedthrough electrode 107 has a surface which is approximately on the same plane as the surface of semiconductor substrate 108, and the surface of this feedthrough electrode 107 is exposed from opening 109a of front surface protective film 109. Meanwhile, on the rear surface 103b side, feedthrough electrode 107 penetrates through opening 110a of rear surface protective film 110, and has an exposed surface which is approximately on the same plane as rear surface 103b (surface of rear surface protective film 110). Rear surface 103b of semiconductor chip 103 is slightly elevated in the vicinity of feedthrough electrode 107.

A front surface side connection member 111 and a rear surface side connection member 112 are respectively connected to exposed portions of feedthrough electrode 107 on the front surface 103a side and on the rear surface 103b side. Front surface side connection member 111 is in the form of a bump that protrudes from front surface 103a, while rear surface side connection member 112 is in film form and covers the end surface (surface exposed from rear surface protective film 110) on the rear surface 103b side of feedthrough electrode 107. Rear surface side connection member 112 slightly protrudes from rear surface 103b.

Front surface side connection member 111 of one semiconductor chip 103 and rear surface side connection member 112 of another semiconductor chip 103 are joined between two adjacent semiconductor chips 103.

In reference to FIG. 30(a), a solid-state device side connection member 113 in film form for electrical connection and mechanical attachment to a semiconductor chip 103 is formed on the surface of solid-state device 102 on the side on which semiconductor chip 103 is connected. Solid-state device side connection member 113 and front surface side connection member 111 of an adjacent semiconductor chip 103 are joined.

In the above-described structure, functional elements 104 of any semiconductor chip 103 are electrically connected to solid-state device 102.

FIG. 31(a) and FIG. 31(b) are illustrative cross-sectional diagrams showing a manufacturing method for a semiconductor device 101. Such a manufacturing method is disclosed in, for example, "Proceedings of the 2003 Electronic Compounds and Technology Conference," Kazumasa Tanida et al., May 2003, pp. 1084-1089.

Semiconductor chips 103 are held one at a time by suction, and are stacked on solid-state device 102 by means of a bonding tool 122 which can hold a semiconductor chip 103 by suction. First, solid-state device 102 is mounted on a bonding stage 121 in a state where the surface on which solid-state device side connection member 113 has been formed faces upward and is approximately horizontal. In addition, a first semiconductor chip 103 is held by bonding tool 122 which attracts the rear surface 103b of the chip in a state where the front surface 103a of the chip faces downward and is approximately horizontal. The surface of bonding tool 122 which makes contact with semiconductor chip 103 is approximately flat.

Subsequently, bonding tool 122 is moved so that the surface of solid-state device 102 on which solid-state device side connection member 113 has been formed and front surface 103a of semiconductor chip 103 face each other, and then, solid-state device side connection member 113 and front surface side connection member 111 are positioned. Then, in this state, bonding tool 122 is lowered, and thereby, front surface side connection member 111 is pressed against solid-state device side connection member 113 with an appropriate load. As a result of this, solid-state device side connection member 113 and front surface side connection member 111 are joined.

Bonding tool 122 may be able to generate an ultrasonic vibration. In this case, bonding tool 122 applies an ultrasonic vibration to the portion where solid-state device side connection member 113 and front surface side connection member 111 make contact with each other (are joined), if necessary. When joining of solid-state device side connection member 113 to front surface side connection member 111 is completed, bonding tool 122 releases semiconductor chip 103 which was held by suction.

Next, bonding tool 122 holds a second semiconductor chip 103 by suction, in the same manner as in the case of first semiconductor chip 103.

Subsequently, bonding tool 122 is moved so that rear surface 103b of the semiconductor chip 103 that has been placed on and joined to solid-state device 102 and front surface 103a of the semiconductor chip 103 which is held by bonding tool 122 face each other, and then, rear surface side connection member 112 and front surface side connection member 111 are positioned.

In this state, bonding tool 122 is lowered, and thereby, this rear surface side connection member 112 and this front surface side connection member 111 are joined (see FIG. 31(a)). At this time, bonding tool 122 applies an ultrasonic vibration to the joining portion, if necessary. When joining of rear surface side connection member 112 to front surface side connection member 111 is completed, bonding tool 122 releases semiconductor chip 103 which was held by suction.

As a result of this, electrical connections and mechanical attachments are achieved between solid-state device 102 and semiconductor chip 103, as well as between a plurality of semiconductor chips 103.

However, rear surface side connection member 112 is provided on rear surface 103b of semiconductor chip 103 on which bonding tool 122 makes contact, so as to protrude from rear surface 103b (surface of rear surface protective film 110). Therefore, rear surface side connection member 112 is pressed against bonding tool 122 so as to be deformed in a manner where it spreads to the sides (in directions along rear surface 103b) when semiconductor chip 103 is pressed against solid-state device 102 or another semiconductor chip 103 in a state where its rear surface 103b is held by bonding tool 122 (see FIG. 31(b)). As a result of this, there is a risk that two rear surface side connection members 112 may be electrically short-circuited, causing a short-circuiting defect in the case where these rear surface side connection members 112 are placed in proximity.

In the same manner, front surface side connection member 111 also protrudes from front surface 103a (surface of front surface protective film 109), and therefore, front surface side connection member 111 is deformed in a manner where it spreads to the sides, together with rear surface side connection member 112, when pressed against rear surface side connection member 112 at the time when two semiconductor chips 103 are joined. There is a risk that short-circuiting defects will be caused by such deformations.

In addition, an ultrasonic vibration is provided by, for example, bonding tool 122 when semiconductor chip 103 is held by bonding tool 122 by suction, and thereby, in some cases, semiconductor chip 103 may be shifted relative to bonding tool 122 in a direction along the contact surface therebetween. That is, friction may be caused between semiconductor chip 103 and bonding tool 122.

As a result of this, cracks 114 and 115 may be caused in rear surface protective film 110 and insulating film 106, respectively (see FIG. 31(b)). In some cases, a crack may be caused in semiconductor substrate 108. In the following, these cracks are generally referred to as "chip cracks."

In addition, in the case where semiconductor substrate 108 is made of silicon, microscopic chips of silicon (hereinafter referred to as "silicon dust") that have been generated during the manufacturing process of semiconductor chip 103 or semiconductor device 101 may stick to bonding tool 122 or rear surface 103b of semiconductor chip 103. In such a case, semiconductor chip 103 is pressed by bonding tool 122 in a state where silicon dust intervenes between bonding tool 122 and rear surface 103b of semiconductor chip 103, and thereby, a chip crack (specifically, crack 114 in rear surface protective film 110) is generated.

Furthermore, in the case where an ultrasonic vibration is provided by bonding tool 122, rear surface side connection member 112 that makes contact with bonding tool 122 is deformed by this ultrasonic vibration. The ultrasonic vibration that is to be conveyed to portions where front surface side connection member 111 makes contact with solid-state device side connection member 113 and rear surface side connection member 112 of another semiconductor chip 103 is attenuated due to the deformation of rear surface side connection member 112 which makes contact with bonding tool 122. As a result of this, there is a risk that joining of semiconductor chip 103 to solid-state device 102 or another semiconductor chip 103 may not be sufficiently achieved.

Furthermore, at the time of joining, rear surface side connection member 112 that has been formed on rear surface 103b makes contact with bonding tool 122, and thereby, the surface of rear surface side connection member 112 is contaminated, and thus, there is a risk that the joining (connection) defect may be caused in the case where an additional semiconductor chip 103 or the like is joined to this rear surface side connection member 112.

SUMMARY OF THE INVENTION

Therefore, an object of this invention is to provide a manufacturing method for a semiconductor device where a short-circuiting defect is not easily generated by a connection member for connection to another semiconductor chip.

Another object of this invention is to provide a manufacturing method for a semiconductor device where cracking is not easily caused in a semiconductor chip.

Still another object of this invention is to provide a manufacturing method for a semiconductor device where a semiconductor chip is excellently joined to another semiconductor chip or a solid-state device.

Yet another object of this invention is to provide a semiconductor device that can be manufactured in a manner where a short-circuiting defect is not easily generated by a connection member for connection to another semiconductor chip.

Still yet another object of this invention is to provide a semiconductor device that can be manufactured in a manner where cracking is not easily caused in a semiconductor chip.

Another object of this invention is to provide a semiconductor device where a semiconductor chip is excellently joined to another semiconductor chip or a solid-state device.

Still another object of this invention is to provide a semiconductor chip where a short-circuiting defect is not easily generated by a connection member for connection to another semiconductor chip at the time of manufacture of a semiconductor device.

Yet another object of this invention is to provide a semiconductor chip where cracking is not easily caused at the time of manufacture of a semiconductor device.

Still yet another object of this invention is to provide a semiconductor chip that can be excellently joined to another semiconductor chip or a solid-state device.

A manufacturing method for a semiconductor device according to a first aspect of this invention includes: the step of preparing a semiconductor chip having a front surface and a rear surface, the semiconductor chip being provided with a semiconductor substrate, a functional element formed on the front surface side of the semiconductor substrate, a feedthrough electrode which is placed within a through hole that penetrates the semiconductor substrate in a direction of a thickness thereof and which is electrically connected to the functional element, a front surface side connection member which is electrically connected to the feedthrough electrode and which protrudes from the front surface, and a rear surface side connection member which is electrically connected to the feedthrough electrode and which has a joining surface within a recess that is formed in the rear surface; the step of preparing a solid-state device where a solid-state device side connection member for connection to the front surface side connection member is formed on one surface; and the joining step of making the front surface of the semiconductor chip face the one surface of the solid-state device by holding the rear surface of the semiconductor chip, and of joining the front surface side connection member to the solid-state device side connection member.

According to this invention, the joining surface (surface to be joined to a connection member of another semiconductor chip or the like) of the rear surface side connection member of the semiconductor chip is within a recess. That is, the rear surface side connection member does not protrude from the rear surface of the semiconductor chip. Therefore, no concentrated force is applied to the rear surface side connection member, even in the case where the rear surface of this semiconductor chip is held by a bonding tool at the time when the semiconductor chip is joined to the solid-state device. Accordingly, the rear surface side connection member is not deformed, and two adjacent rear surface side connection members are not electrically short-circuited. That is, according to this manufacturing method, a semiconductor device can be manufactured where a short-circuiting defect is not easily caused by a connection member for connection to another semiconductor chip.

In the case where the rear surface (excluding the recess portions) of the semiconductor chip and the surface of the bonding tool for making contact with the semiconductor chip are flat, the force applied to the semiconductor chip by the bonding tool can be approximately evenly received on the entirety of the rear surface of the semiconductor chip.

In addition, in the case where the bonding tool can generate an ultrasonic vibration, the ultrasonic vibration is not attenuated as a result of a deformation in the rear surface side connection member caused by the contact with the bonding tool, but is excellently conveyed to the portion where the solid-state device side connection member and the front surface side connection member of the semiconductor chip make contact with each other (are joined). Accordingly, the solid-state device and the semiconductor chip can be excellently joined, according to this manufacturing method.

The semiconductor chip is joined to the solid-state device with its front surface (surface on which a functional element is formed) facing the solid-state device side. Accordingly, a semiconductor device where a semiconductor chip is joined in a so-called facedown style can be manufactured according to this manufacturing method.

The joining surface of the rear surface side connection member may be on approximately the same plane as the rear surface of the semiconductor chip, or may be positioned deeper in the semiconductor chip in the direction of the thickness thereof.

The entirety of the front surface side connection member and the rear surface side connection member may both be made of a single type of material, or may be made of a plurality of types of material (for example, in a layered structure with a plurality of layers formed of different materials).

The above-described step preparing the semiconductor chip may include the step of preparing first and second semiconductor chips, which are the above-described semiconductor chips where a protrusion height of the front surface side connection member from the front surface of the second semiconductor chip is greater than a depth from the rear surface of the joining surface of the rear surface side connection member of the first semiconductor chip, and in this case, the joining step may include the step of making the front surface of the first semiconductor chip face the one surface of the solid-state device by holding the rear surface of the first semiconductor chip, and of joining the front surface side connection member of the first semiconductor chip to the solid-state device side connection member of the solid-state device. In this case, this manufacturing method may further include the chip-to-chip joining step of making the front surface of the second semiconductor chip face the rear surface of the first semiconductor chip by holding the rear surface of the second semiconductor chip, and of joining the front surface side connection member of the second semiconductor chip to the rear surface side connection member of the first semiconductor chip.

In this configuration, the protrusion height of the front surface side connection member from the front surface of the second semiconductor chip is greater than the depth from the rear surface of the joining surface of the rear surface side connection member of the first semiconductor chip, and this rear surface side connection member and this front surface side connection member are positioned so as to be proximate to each other, and thus, can be made to make contact with each other so as to be joined. As a result of this, a semiconductor device where two semiconductor chips are stacked on and joined to a solid-state device can be obtained.

In the case where the joining surface of the rear surface side connection member of the first semiconductor chip is positioned deeper than the rear surface (is provided so as to recede from the rear surface), the bonding tool does not make contact with the rear surface side connection member at the time when the first semiconductor chip is joined to the solid-state device, and therefore, the surface of the rear surface side connection member is not contaminated. Accordingly, the rear surface side connection member of the first semiconductor chip and the front surface side connection member of the second semiconductor chip can be excellently mechanically joined and electrically connected.

It is preferable to set the form and volume of the recess of the first semiconductor chip, as well as the form and size of the front surface side connection member of the second semiconductor chip in a manner where the state is such that the larger part of this front surface side connection member is contained within the recess when joining of this front surface side connection member to this rear surface side connection member is completed. In this case, even when the front surface side connection member is deformed when joined to the rear surface side connection member, this deformation does not make the front surface side connection member bulge out to the sides, and does not electrically short-circuit with another adjacent front surface side connection member.

It is preferable for the width (diameter) of the end of the front surface side connection member and the width (diameter) of the end of the rear surface side connection member to have a difference in a specific amount or greater. In this case, even when a positional shift is caused between the front surface side connection member and the rear surface side connection member at the time of joining, a specific connection area can always be secured, as long as the amount of this shift is within one half of the difference between the width (diameter) of the front surface side connection member and the width (diameter) of the rear surface side connection member.

This manufacturing method may further include the step of joining a front surface side connection member of another semiconductor chip to a rear surface side connection member of the second semiconductor chip that has been joined to the first semiconductor chip after the chip-to-chip joining step. As a result of this, a semiconductor device where three semiconductor chips are stacked on a solid-state device can be obtained. In the same manner, a semiconductor device where four or more semiconductor chips are stacked on a solid-state device can be obtained.

A manufacturing method for a semiconductor device according to the second aspect of this invention includes: the step of preparing first and second semiconductor chips, each of which is a semiconductor chip having a front surface and a rear surface, the semiconductor chip being provided with a semiconductor substrate, a functional element formed on the front surface side of the semiconductor substrate, a feedthrough electrode which is placed within a through hole that penetrates the semiconductor substrate in a direction of a thickness thereof and which is electrically connected to the functional element, a front surface side connection member which is electrically connected to the feedthrough electrode and which protrudes from the front surface, and a rear surface side connection member which is electrically connected to the feedthrough electrode and which has a joining surface within a recess that is formed in the rear surface, where a protrusion height of the front surface side connection member from the front surface of the second semiconductor chip is greater than a depth from the rear surface of the joining surface of the rear surface side connection member of the first semiconductor chip; and the chip-to-chip joining step of making the front surface of the second semiconductor chip face the rear surface of the first semiconductor chip by holding the rear surface of the second semiconductor chip, and of joining the front surface side connection member of the second semiconductor chip to the rear surface side connection member of the first semiconductor chip.

According to this invention, the joining surface of the rear surface side connection member of the second semiconductor chip is within a recess. That is, the rear surface side connection member does not protrude from the rear surface of the second semiconductor chip. Therefore, no concentrated force is applied to the rear surface side connection member, even in the case where the rear surface of the second semiconductor chip is held by a bonding tool at the time when the second semiconductor chip is joined to the first semiconductor chip.

Accordingly, the rear surface side connection member is not deformed, and two adjacent rear surface side connection members are not electrically short-circuited. That is, according to this manufacturing method, a semiconductor device can be manufactured where a short-circuiting defect is not easily caused by a connection member for connection to another semiconductor chip.

In addition, in the case where the bonding tool can generate an ultrasonic vibration, such an ultrasonic vibration is not attenuated as a result of a deformation in the rear surface side connection member caused by the contact with the bonding tool, but is excellently conveyed to the portion where the first semiconductor chip and the second semiconductor chip make contact with each other (are joined). Accordingly, the first semiconductor chip and the second semiconductor chip can be excellently joined, according to this manufacturing method.

This manufacturing method for a semiconductor device may include the block-joining step of joining a block where first and second semiconductor chips are joined to a wiring substrate (interposer). In this case, the block-joining step may include the step of die bonding the rear surface of the semiconductor chip that is included in the block to the wiring substrate. As a result of this, a semiconductor device where the front surfaces (surfaces on which the functional element is formed) of the semiconductor chips face the side opposite from the wiring substrate (the semiconductor chips are joined in a so-called face-up style) can be manufactured.

In a plan view where the first and second semiconductor chips are viewed vertically from the top, a region occupied by the rear surface side connection member of the first semiconductor chip may have a size that can include a region occupied by the front surface side connection member of the second semiconductor chip.

In this configuration, when the rear surface of the first semiconductor chip and the front surface of the second semiconductor chip are positioned so as to face each other, the region occupied by the front surface side connection member of the second semiconductor chip can be made to be completely included in the region occupied by the rear surface side connection member of the first semiconductor chip, in a plan view where the first and second semiconductor chips are viewed vertically from the top. In this state, the first semiconductor chip and the second semiconductor chip are made to be in close proximity to each other, so that the rear surface side connection member and the front surface side connection member can be joined.

In the case where the front surface side connection member and the rear surface side connection member are made of materials which have almost the same level of deformability and similar shapes, the front surface side connection member of which the region is smaller than that of the rear surface side connection member in a plan view is deformed to a greater degree, in order to contribute to the joining, when these members are pressed against each other.

Meanwhile, the rear surface side connection member is provided within a recess, and therefore, is sandwiched between a feedthrough electrode and a front surface side connection member at the time of joining, and thus has little room to deform freely. Therefore, in the case where the region occupied by the rear surface side connection member of the first semiconductor chip is too small to include the region occupied by the front surface side connection member of the second semiconductor chip in a plan view where the first and second semiconductor chips are viewed vertically from the top, the front surface side connection member of the second semiconductor chip is not deformed a great deal and the joining area is not increased, and therefore, the front surface side connection member cannot contribute to the joining. According to the present invention, such a defect can be reduced.

In addition, in the case where the front surface side connection member is easily deformed, even when stress is applied to the joining portion between the rear surface side connection member and the front surface side connection member at the time of or after the joining of the first semiconductor chip to the second semiconductor chip, the front surface side connection member is deformed, and thereby, this stress is absorbed. Thus, concentration of stress on the rear surface side connection member, as well as the feedthrough electrode and the semiconductor substrate in the vicinity thereof can be prevented, and chip cracking can be prevented from being generated.

Particularly, in the case where the semiconductor chips have a structure where an insulating film or a barrier metal layer (film for preventing (suppressing) metal atoms that form the feedthrough electrode from diffusing into the semiconductor substrate) intervenes between a feedthrough electrode and a semiconductor substrate, breakdown of the insulating film or the barrier metal layer (breakdown of the feedthrough electrode structure) due to concentration of stress can be prevented. As a result of this, a current leak between a feedthrough electrode and a semiconductor substrate, as well as deterioration in the device properties caused by metal atoms that form the feedthrough electrode diffusing into the semiconductor substrate, can be prevented from generating.

The front surface side connection member of the second semiconductor chip may be made of a material that is deformed more easily than the rear surface side connection member of the first semiconductor chip.

In this configuration, the front surface side connection member, which is made of a material that is deformed more easily (softer) than that of the rear surface side connection member, is deformed to a greater degree at the time of joining of the rear surface side connection member to the front surface side connection member. As a result of this, the front surface side connection member and the rear surface side connection member are joined with the joining area efficiently increased. In addition, stress is absorbed as a result of the deformation in the front surface side connection member, and thus, it becomes difficult for chip cracking to be generated.

Here, even in the case where the rear surface side connection member is made of a material that is deformed more easily than the front surface side connection member, stress can be absorbed as a result of deformation of the rear surface side connection member. However, at the time of manufacture of a semiconductor chip, the rear surface side connection member is formed within a recess, and therefore, is not necessarily formed to be thick enough to sufficiently absorb stress. On the other hand, the front surface side connection member protrudes from the front surface of the semiconductor chip, and can be formed to be sufficiently thick, and therefore, according to the present invention, the front surface side connection member is made of a material that is deformed more easily than that of the rear surface side connection member, and thereby, stress can be sufficiently absorbed.

Furthermore, in the case where the front surface side connection member is deformed sufficiently easily, even when the region occupied by the front surface side connection member of the second semiconductor chip is greater than the region occupied by the recess of the first semiconductor chip in a plan view where the first and second semiconductor chips are viewed vertically from the top, the front surface side connection member can be deformed so as to be put into the recess, and thereby, the front surface side connection member and the rear surface side connection member can be joined.

In the case where the rear surface side connection member is made of copper, the front surface side connection member can be made of a material that is deformed more easily than copper, such as gold.

The chip-to-chip joining step may include the step of joining the front surface side connection member of the second semiconductor chip to the rear surface side connection member of the first semiconductor chip in a manner where a gap is secured between the rear surface of the first semiconductor chip and the front surface of the second semiconductor chip, and in this case, this manufacturing method for a semiconductor device may further include the step of providing a sealing material that is deformed more easily than that of a joining portion between the front surface side connection member and the rear surface side connection member in the gap.

In this configuration, a semiconductor device where a sealing material intervenes in the gap between the first semiconductor chip and the second semiconductor chip can be obtained. Such a semiconductor device has a joining area between the first and second semiconductor chips which is greater than that in the case where the first and second semiconductor chips are joined only by means of the rear surface side connection member and the front surface side connection member, and therefore, the structural strength is increased.

In addition, the strength of the front surface side connection member and the rear surface side connection member is usually the lowest in the portion where they are joined, and the sealing material is deformed more easily than that of this joining portion, and thereby, the sealing material is deformed prior to this joining portion when stress is applied between the first and second semiconductor chips, and the stress applied to this joining portion can be reduced.

It is preferable for the step of providing a sealing material to include the step of providing the sealing material so that the gap between the first semiconductor chip and the second semiconductor chip is filled almost full. As a result of this, a semiconductor device where the gap between the first semiconductor chip and the second semiconductor chip is filled almost full with a sealing material is obtained. In such a semiconductor device, the above-described effects of stress reduction are great.

When a temperature cycle is applied to this semiconductor device, stress is applied to the front surface side connection member and the rear surface side connection member, as a result of the difference between the coefficient of thermal expansion of the front surface side connection member and the rear surface side connection member and the coefficient of thermal expansion of the sealing material. This stress becomes the maximum in the center portion between the front surface and the rear surface, which face each other, in the direction perpendicular to the front surface and the rear surface.

On the other hand, the joining portion between the first and second semiconductor chips is within a recess of the first semiconductor chip, That is, is in a position away from the position where stress that is applied to the front surface side connection member and the rear surface side connection member becomes maximum (center portion between front surface and rear surface that face each other). Accordingly, even in the case where such a sealing material is provided, breakdown of the joining portion between the front surface side connection member and the rear surface side connection member due to a temperature cycle does not easily occur.

The step of providing the sealing material may include the step of injecting a sealing material in liquid form (not cured) into a gap between the first semiconductor chip and the second semiconductor chip, and then curing this sealing material, after the chip-to-chip joining step, and may include the step of providing the sealing material on at least one of the rear surfaces of the first semiconductor chip and the front surface of the second semiconductor chip before the chip-to-chip joining step.

In the case where this manufacturing method for a semiconductor device includes the step of joining one or more other semiconductor chips being placed on and joined to the second semiconductor chip, semiconductor chips can be joined in a manner where a gap is formed between each pair of semiconductor chips in this step. In this case, this manufacturing method for a semiconductor device may further include the step of providing the sealing material into the gap between each pair of semiconductor chips. As a result of this, a semiconductor device where a sealing material is provided in a gap between each pair of semiconductor chips is obtained.

Furthermore, in the joining step (step of joining the solid-state device to the semiconductor chip), the solid-state device and the semiconductor chip may be joined in a manner where a gap is formed between the solid-state device and the semiconductor chip. In this case, this manufacturing method for a semiconductor device may further include the step of providing a sealing material that is deformed more easily than the joining portion between the solid-state device side connection member and the front surface side connection member in a gap between the solid-state device and the semiconductor chip.

At least one of the front surface side connection member and the rear surface side connection member may include a spherical connection member.

In this configuration, the first semiconductor chip and the second semiconductor chip can be joined via a spherical connection member. The spherical connection member has a form where the closer to the end (the other semiconductor chip side to which this spherical connection member is connected), the smaller (narrower) the diameter becomes, and a portion having a smaller diameter is easily deformed when the front surface side connection member and the rear surface side connection member are pressed against each other at the time of joining, and thus, can absorb the applied force. As a result of this, concentration of stress in the vicinity of the rear surface side connection member can be prevented, and thus, chip cracking can be prevented from being generated.

Particularly, in the case where a semiconductor chip includes an insulating film or a barrier metal layer which intervenes between a feedthrough electrode and a semiconductor substrate, breakdown of the insulating film or the barrier metal layer (breakdown of the feedthrough electrode structure) caused by concentration of stress can be prevented.

The spherical connection member may be a so-called ball bump which is formed as a spherical bump by melting the end of a bonding wire using a wire bonding technique, or may be a conductor in almost perfect spherical form. The spherical connection member which is a conductor in almost perfect spherical form may be a metal ball or a spherical body made of an insulator (such as resin) of which the surface is coated with a conductor. In addition, the spherical connection member made of a metal ball may be made of one type of metal or an alloy, or may be a plurality of types of metal or alloy formed in concentric form.

At least one of the front surface side connection member and the rear surface side connection member may include a solder material, and in this case, the chip-to-chip joining step may further include the heating step of heating the semiconductor chip to a temperature that is on or above the solidus temperature of the solder material.

In this configuration, the solder material is melted in the heating step, and thereby, the rear surface side connection member and the front surface side connection member can be joined. The melt of the solder material is easily deformed, and the joining of the rear surface side connection member to the front surface side connection member is achieved primarily through the formation of an alloy layer through the melt of the solder material, and therefore, force (load for joining) that is applied to the rear surface side connection member and the front surface side connection member for joining can be reduced a great deal.

As a result of this, local application of a large force and the occurrence of chip cracking can be prevented. Particularly, in the case where an insulating film or a barrier metal layer intervenes between a feedthrough electrode and a semiconductor substrate, breakdown of the insulating film or the barrier metal layer (breakdown of the feedthrough electrode structure) caused by concentration of stress can be prevented.

As a result of the formation of an alloy layer, the rear surface side connection member and the front surface side connection member are firmly joined.

In addition, in the case where the front surface side connection member of the second semiconductor chip has a size that makes it impossible to be put into a recess of the first semiconductor chip without being deformed, and this front surface side connection member includes a solder material, as described above, this solder material is melted, so that the melt of this solder material can easily be put into the recess. Therefore, the front surface side connection member and the rear surface side connection member can be joined without damaging the vicinity of the edge portion of the recess.

The front surface side connection member and the rear surface side connection member may be made to make contact with each other after the solder material has been melted in the heating step. In addition, the joining step may include the temporary placement step of temporarily placing a second semiconductor chip on a first semiconductor chip in the state where the rear surface side connection member of the first semiconductor chip and the front surface side connection member of the second semiconductor chip are positioned, and in this case, the heating step can be carried out after the temporary placement step.

It is preferable for the solidus temperature of the solder material to be 60° C. to 370° C.

The temporary placement step may include the step of temporarily fixing the rear surface side connection member of the first semiconductor chip to the front surface side connection member of the second semiconductor chip by means of a flux.

The temporary placement step may include the step of temporarily placing the first semiconductor chip on the solid-state device in a state where the solid-state device side connection member of the solid-state device and the front surface side connection member (that includes a solder material, as described above) of the first semiconductor chip are set in place, and/or the step of temporarily placing another semiconductor chip on the second semiconductor chip in a state where the rear surface side connection member of the second semiconductor chip and the front surface side connection member of the other semiconductor chip are set in place.

In this case, in the heating step, joining between the solid-state device and the first semiconductor chip and joining between the second semiconductor chip and another semiconductor chip, in addition to joining between the first semiconductor chip and the second semiconductor chip, can be correctly carried out in block.

A solder resist may be formed on the rear surface of the first semiconductor chip.

In this configuration, even in the case where the solder material is melted, the melt does not get wet to and spread over the rear surface of the first semiconductor chip. Therefore, reduction of the pitch of the front surface side connection members and the rear surface side connection members can be achieved, while preventing the occurrence of a short-circuiting defect.

A solder resist may be formed on the front surface of the second semiconductor chip.

A dummy front surface side connection member for supporting the first semiconductor chip from its front surface side may be provided in a position on the front surface of the first semiconductor chip that corresponds to the front surface side connection member of the second semiconductor chip.

In this configuration, the first semiconductor chip is supported on the solid-state device by the front surface side connection member and the dummy front surface side connection member, as a result of the joining step. Then, in the chip-to-chip joining step, the front surface side connection member of the second semiconductor chip is pressed against the first semiconductor chip in a position that corresponds to the front surface side connection member or the dummy front surface side connection member of the first semiconductor chip (such as a position that approximately overlaps the front surface connection member or the dummy front surface side connection member of the first semiconductor chip in a plan view where the first and second semiconductor chips are viewed vertically from the top).

Therefore, even in the case where the first semiconductor chip is easily warped, the front surface side connection member of the second semiconductor chip is pressed against the first semiconductor chip, preventing it from being warped. Accordingly, the rear surface side connection member of the first semiconductor chip and the front surface side connection member of the second semiconductor chip can be excellently joined.

The dummy front surface side connection member can be made so as not to contribute to an electrical connection between the first semiconductor chip and the solid-state device.

In the case where one or more semiconductor chips are additionally placed on and joined to the second semiconductor chip, a front surface side connection member or a dummy front surface side connection member can be provided for all the semiconductor chips which are joined prior to an arbitrary semiconductor chip, in positions that correspond to the front surface side connection member of this arbitrary semiconductor chip.

In the above-described manufacturing method for a semiconductor device, the recess may be within the through hole. In this case, the through hole is not fully filled in with the feedthrough electrode in the vicinity of the rear surface of the semiconductor chip, for example, and thereby, a recess can be formed above the feedthrough electrode within the through hole.

In addition, in this case, the rear surface side connection member is placed within the through hole. In this case, the rear surface side connection member may be the end portion of the feedthrough electrode on the rear surface side, or may be formed of another member on the feedthrough electrode. Accordingly, the rear surface side connection member may be made of the same type of material as that of the feedthrough electrode, or may be made of a different material from that of the feedthrough electrode.

In addition, the semiconductor chip may further include an additional wire for electrically connecting the rear surface side connection member to the feedthrough electrode, and a rear surface protective film that is provided to cover this additional wire, and in this case, the recess may include an opening that is formed in the rear surface protective film.

The rear side surface connection member is connected to the additional wire that leads out from the feedthrough electrode, and thereby, the rear surface side connection member can be provided in an arbitrary position on the rear surface of the semiconductor chip.

The rear surface protective film can be made of a material having electrically insulating properties. As a result of this, the additional wire can be physically protected, and the rear surface of the semiconductor chip can be electrically insulated.

An insulating film for electrically insulating the additional wire from the semiconductor substrate may intervene therebetween, and in this case, a barrier metal layer for preventing (suppressing) metal atoms that form the additional wire from diffusing into the semiconductor substrate may intervene between the insulating film and the additional wire.

The rear surface side connection member may be another member that is connected to the additional wire. In addition, the additional wire may be exposed from an opening that is formed in the rear surface protective film, and in this case, the rear surface side connection member may be a portion of the additional wire that is exposed from this opening.

The rear surface side of the semiconductor chip may be covered with a resin material layer.

In this configuration, portions made of hard fragile materials are covered with the resin material layer, and are not exposed, on the rear surface of the semiconductor chip. When the semiconductor chip is held by a bonding tool, this bonding tool makes contact with the resin material layer that is formed on the rear surface of the semiconductor chip.

The resin material layer has elasticity and ductility, and therefore, no cracking is generated in the resin material layer or in the semiconductor chip, even in the case where a shift occurs between the bonding tool and the resin material layer. In addition, even in the case where silicon dust intervenes between the bonding tool and the semiconductor chip, the resin material layer in the vicinity of the silicon dust is deformed, and thereby, local concentration of stress is relaxed, preventing cracking of the semiconductor chip from occurring.

It is preferable for the resin material layer to be made of a fluorine resin (tetrafluoroethylene resin) or a polyimide.

The above-described semiconductor chip may include a plurality of front surface side connection members which is the same as the above-described front surface side connection member, and in this case, it is preferable for the front surface side connection members to be placed approximately uniformly on the front surface of the semiconductor chip.

In this configuration, the semiconductor chip that is joined to a solid-state device or another semiconductor chip is supported by the plurality of front surface side connection members, which have been placed approximately uniformly (at an approximately constant density) on its front surface. As a result of this, even in the case where the semiconductor chip is easily warped, the amount of warp can be reduced.

In the case where the semiconductor chip includes dummy front surface side connection members, the front surface side connection members and the dummy front surface side connection members can be uniformly placed on the front surface of the semiconductor chip.

The semiconductor device that is obtained according to the above-described manufacturing method may be in a so-called BGA (ball grid array) form, may be in QFN (quad flat nonlead) form, or may be in other arbitrary package forms.

The semiconductor chip may be connected to a wiring substrate (interposer) or a lead frame via the solid-state device. The solid-state device or the semiconductor chip and the wiring substrate or the lead frame may be electrically connected by means of, for example, bonding wires.

A semiconductor device according to a third aspect of this invention includes: first and second semiconductor chips each of which has a front surface and a rear surface, and is provided with a semiconductor substrate, a functional element formed on the front surface side of the semiconductor substrate, and a feedthrough electrode which is placed within a through hole that penetrates the semiconductor substrate in a direction of a thickness thereof and which is electrically connected to the functional element; a connection member which is provided between a bottom of a recess that is formed in the rear surface of the first semiconductor chip and the front surface of the second semiconductor chip in a manner that a gap within the recess is formed at least partially between an inner wall surface of the recess and the connection member and which electrically connects the feedthrough electrode of the first semiconductor chip to the feedthrough electrode of the second semiconductor chip; and an external connection member for external connection, which is electrically connected to the first and second semiconductor chips.

The feedthrough electrode of the first semiconductor chip and the feedthrough electrode of the second semiconductor chip may be electrically connected directly by means of the connection member, or the feedthrough electrodes may be electrically connected via another wiring member.

A semiconductor device according to a fourth aspect of this invention includes: first and second semiconductor chips each of which has a front surface and a rear surface, and is provided with a semiconductor substrate, a functional element formed on the front surface side of the semiconductor substrate, a feedthrough electrode which is placed within a through hole that penetrates the semiconductor substrate in a direction of a thickness thereof and which is electrically connected to the functional element; a connection member which is provided between a bottom of a recess that is formed in the rear surface of the first semiconductor chip and the front surface of the second semiconductor chip, which electrically connects the feedthrough electrode of the first semiconductor chip and the feedthrough electrode of the second semiconductor chip, the connection member including a solder material; a solder resist provided on the rear surface of the first semiconductor chip; and an external connection member for external connection, which is electrically connected to the first and second semiconductor chips.

The external connection member may be a metal ball. In this case, this semiconductor device may be in BGA (ball grid array) package form.

In addition, the external connection member may be a lead frame. In this case, this semiconductor device may, for example, be in QFN (quad flat non-lead) package form.

A semiconductor chip according to a fifth aspect of this invention is a semiconductor chip having a front surface and a rear surface, which is provided with: a semiconductor substrate; a functional element formed on the front surface side of the semiconductor substrate; a feedthrough electrode which is placed within a through hole that penetrates the semiconductor substrate in a direction of a thickness thereof and which is electrically connected to the functional element; a front surface side connection member which is electrically connected to the feedthrough electrode and which protrudes from the front surface; and a rear surface side connection member which is electrically connected to the feedthrough electrode and which has a joining surface within a recess that is formed in the rear surface.

This semiconductor chip can be used in the above-described manufacturing method for a semiconductor device, and the same effects as in the above-described manufacturing method for a semiconductor device can be obtained.

The depth from the rear surface of the joining surface of the rear surface side connection member may be smaller than the protrusion height from the front surface of the front surface side connection member.

A region occupied by the rear surface side connection member may have a size that can include a region occupied by the front surface side connection member in a plan view where the semiconductor chip is viewed vertically from the top.

The front surface side connection member may be made of a material that is deformed more easily than that of the rear surface side connection member.

At least one of the front surface side connection member and the rear surface side connection member may include a spherical connection member.

At least one of the front surface side connection member and the rear surface side connection member may include a solder material.

A solder resist may be formed on the rear surface.

The recess may be within the through hole.

This semiconductor chip may further include: an additional wire which is provided on the rear surface side, and which electrically connects the rear surface side connection member to the feedthrough electrode; and a rear surface protective film which is provided on the rear surface side so as to cover the additional wire, and in this case, the recess may include an opening that is formed in the rear surface protective film.

The rear surface side may be covered with a resin material layer.

The above-described or other objects, characteristics and effects according to the present invention are clarified in the following descriptions of the embodiments in reference to the attached drawings.

BRIEF DESCRIPTION OF THE DRAWINGS

FIG. 16(a) and FIG. 16(b) are illustrative cross-sectional diagrams showing the structure of a semiconductor device according to the sixth embodiment of the present invention;

FIG. 18 is an illustrative cross-sectional diagram for explaining a method for joining the top layer chip, semiconductor chips and a solid-state device to each other;

FIG. 20(a) and FIG. 20(b) are illustrative cross-sectional diagrams showing a portion where two semiconductor chips face each other during the manufacturing process for the semiconductor device shown in FIG. 19(a) and FIG. 19(b);

DESCRIPTION OF THE PREFERRED EMBODIMENTS

Figure 1:
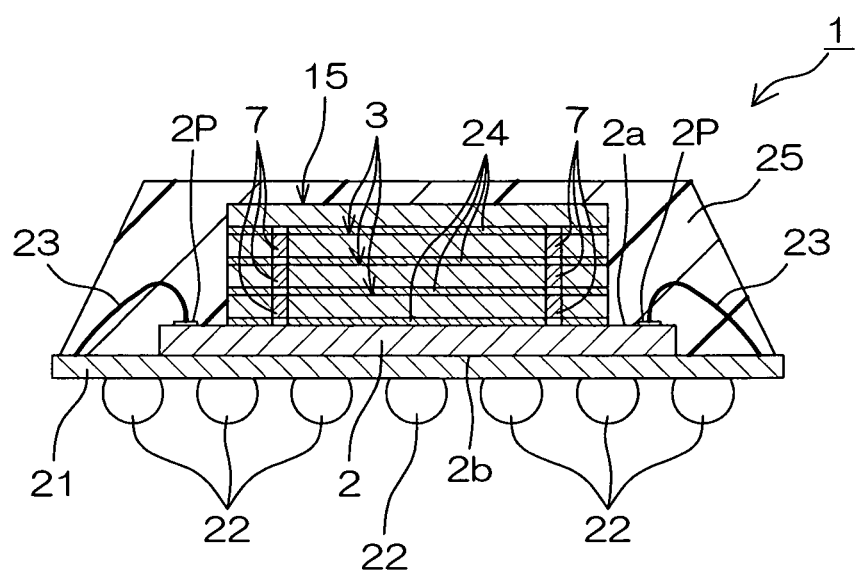
FIG. 1 is an illustrative cross-sectional diagram showing the structure of a semiconductor device according to the first embodiment of the present invention.

FIG. 1 is an illustrative cross-sectional diagram showing the structure of a semiconductor device according to the first embodiment of the present invention.

This semiconductor device 1 has a so-called BGA (ball grid array) type package form and a multi-chip stack structure, and is provided with a wiring substrate (an interposer) 21, a solid-state device 2 such as a semiconductor chip or a wiring substrate, and semiconductor chips 3 and 15 which are in plate form and are stacked approximately parallel to each other, as well as metal balls 22.

Wiring substrate 21 is made of an insulator and wires are provided on the surfaces and/or inside thereof. Solid-state device 2, a plurality of (three in this embodiment) semiconductor chips 3 having feedthrough electrodes 7, semiconductor chip 15 which does not have feedthrough electrode 7 are sequentially stacked on one surface side of wiring substrate 21. Metal balls (for example, solder balls) 22 are joined to the other surface (surface on the side opposite to the solid-state device 2 side) of wiring substrate 21.

Solid-state device 2 is smaller than wiring substrate 21 and is joined to approximately the center portion of wiring substrate 21 in a plan view where wiring substrate 21 and solid-state device 2 are viewed vertically from the top. Semiconductor chips 3 and 15 are smaller than solid-state device 2 and are joined to approximately the center portion of solid-state device 2 in a plan view where solid-state device 2 and semiconductor chips 3 and 15 are viewed vertically from the top. Semiconductor chips 3 and 15 have approximately the same dimensions and forms and are placed so as to approximately overlap each other in a plan view where these chips are viewed vertically from the top.

Electrode pads (not shown) are provided in the outer peripheral region of the above-described surface of wiring substrate 21, which is not faced with solid-state device 2, and these electrode pads are rewired in the wiring substrate 21 or on the surface of wiring substrate 21 so as to be electrically connected to metal balls 22, which are provided on the other surface of wiring substrate 21.

External connection pads 2P are formed in the outer peripheral region of one surface (surface on the side opposite wiring substrate 21), which does not face semiconductor chip 3, of solid-state device 2. The electrode pads provided on wiring substrate 21 and external connection pads 2P of solid-state device 2 are electrically connected by means of bonding wires 23.

Gaps are formed between respective semiconductor chips 3 and 15 as well as between semiconductor chip 3 and solid-state device 2 and these gaps are filled in with an interlayer sealing material 24 made of a resin. Interlayer sealing material 24 is put into the gap between solid-state device 2 and semiconductor chip 3, gaps S between each pair of adjacent two semiconductor chips 3 and the gap between semiconductor chips 3 and 15 after all of semiconductor chips 3 and 15 have been stacked on solid-state device 2. Interlayer sealing material 24 in liquid form (not cured) is injected into these gaps from a side by utilizing capillary action.

Interlayer sealing material 24 may be provided before semiconductor chips 3 and 15 are joined. In this case, interlayer sealing material 24, which is not cured, is potted (preformed) on the regions of front surface 2a of solid-state device 2 and of rear surfaces 3b of semiconductor chips 3, to which semiconductor chips 3 and are joined. Interlayer sealing material 24 in film form, instead of interlayer sealing material 24 in liquid form, may be precoated on front surface 2a of solid-state device 2 and on rear surfaces 3b of semiconductor chips 3, or on front surfaces 3a of semiconductor chips 3 and on the front surface of semiconductor chip 15.

Subsequently, a semiconductor chip 3 or 15 are joined to solid-state device 2 or a semiconductor chip 3 in the above-described state so as to sandwich interlayer sealing material 24 in liquid form or in film form. In the case where interlayer sealing material 24 is in liquid form, interlayer sealing material 24 is subsequently cured. According to the above-described method, the gaps between each pair of solid-state device 2 as well as semiconductor chips 3 and 15 can be filled in with interlayer sealing material 24.

Semiconductor chips 3 and 15, solid-state device 2, bonding wires 23 and the surface of wiring substrate 21 on the solid-state device 2 side are molded in a sealing resin (mold resin) 25.

This semiconductor device 1 can be mounted on another wiring substrate by means of metal balls 22. Solid-state device 2 and a plurality of semiconductor chips 3 and 15 are stacked on top of each other and thereby the mounting area for this semiconductor device 1 has been reduced.

FIG. 2(*a*) and FIG. 2(*b*) are illustrative cross-sectional diagrams showing portions of semiconductor device 1 in an enlarged view. FIG. 2(*a*) shows solid-state device 2 and two semiconductor chips 3 which are adjacent to solid-state device 2 while FIG. 2(*b*) shows a portion where two adjacent semiconductor chips 3 are joined. Interlayer sealing material 24 and sealing resin 25 are omitted in FIG. 2(*a*).

In reference to FIG. 2(*b*), a functional element 4 is formed on one surface (hereinafter referred to as "front surface") of each semiconductor chip 3 and front surface 3a of each semiconductor chip 3 faces the solid-state device 2 side and is stacked on solid-state device 2 in a so-called face down style.

Semiconductor chips 3 are provided with a semiconductor substrate 8 which has been divided from a larger semiconductor substrate such as a semiconductor wafer. Through holes 5 are formed in semiconductor substrate 8 so as to penetrate in the direction of its thickness.

A hard mask 16 made of silicon oxide is formed on the front surface 3a side of semiconductor substrate 8 and openings 16a are formed in hard mask 16. A portion of functional element 4 and a through hole 5 exist within an opening 16a in a plan view where front surface 3a of semiconductor chip 3 is viewed vertically from the top.

An insulating film 6I made of an insulator such as silicon oxide ($SiO_2$) is formed on the inner walls of through hole 5 and opening 16a as well as on the surface of semiconductor substrate 8 that is exposed through opening 16a. A barrier metal layer (diffusion preventive film) 6B is formed on insulating film 6I of, for example, titanium nitride (TiN), tantalum nitride (TaN), titanium tungsten (TiW) or the like. A portion of functional element 4 is exposed from insulating film 6I.

The insides of through hole 5 and opening 16a which extends from the through hole 5, are filled to almost full with feedthrough electrode 7. Feedthrough electrode 7 and functional element 4 (portion exposed from insulating film 6I) are electrically connected by means of a wiring member which is integrated with feedthrough electrode 7 and which fills the remaining portion of opening 16a. As a result of this, functional element 4 can be electrically connected from the surface (hereinafter referred to as "rear surface") 3b side which is the side opposite front surface 3a of semiconductor chip 3. Feedthrough electrodes 7 of respective semiconductor chips 3 are arranged so as to approximately overlap in a plan view where these semiconductor chips 3 are viewed vertically from the top.

Feedthrough electrode 7 and wiring member 17 are electrically insulated from semiconductor substrate 8 (excluding the lead electrode for functional element 4) by means of insulating film 6I. In addition, barrier metal layer 6B is provided between semiconductor substrate 8 (insulating film 6I) and feedthrough electrode 7, and between semiconductor substrate 8 and wiring member 17 and thereby metal atoms that form feedthrough electrode 7 and wiring member 17 can be prevented (suppressed) from diffusing into semiconductor substrate 8 during and after the manufacture of semiconductor chip 3. As a result of this, device properties of semiconductor chip 3 can be prevented from deteriorating.

The end surface of feedthrough electrode 7 on front surface 3a side, the surface of wiring member 17 and the surface of hard mask 16 are approximately on the same plane and a front surface protective film 9 is formed so as to cover these surfaces. An opening 9a having a width which is slightly smaller than the width of feedthrough electrode 7 in the cross section of FIG. 2(*b*) is formed in front surface protective film 9 so as to expose feedthrough electrode 7.

A front surface side connection member 11 in pillar form which protrudes from front surface 3a of semiconductor chip 3 is joined to feedthrough electrode 7 via opening 9a. In the cross section of FIG. 2(*b*), the width of front surface side connection member 11 is smaller than the width of through hole 5 and is greater than the width of opening 9a.

The end surface of feedthrough electrode 7 on the rear surface 3b side is provided with a rear surface side connection member 12. Rear surface side connection member 12 is in film form and covers almost the entirety of the end surface of feedthrough electrode 7 on the rear surface 3b side. That is, in the cross section of FIG. 2(*b*), the width of rear surface side connection member 12 is slightly smaller than the width of through hole 5 and is greater than the width of front surface side connection member 11. In other words, front surface side connection member 11 is narrower than rear surface side connection member 12.

The upper surface of rear surface side connection member 12 is a joining surface which joins to another semiconductor chip 3 and this joining surface is within through hole 5. That is, a region within through hole 5 in the vicinity of rear surface 3 is not filled in with feedthrough electrode 7 or rear surface side connection member 12 in a manner where a recess 14 is formed above rear surface side connection member 12.

A rear surface protective film 10 is provided on the rear surface 3b side of semiconductor chip 3 so as to cover semiconductor substrate 8. An opening 10a is formed in rear surface protective film 10. The width of opening 10a is approximately the same as the width of through hole 5 and the inner wall surface of through hole 5 and the inner wall surface of opening 10a form a continuous surface. Insulating film 6I and barrier metal layer 6B are also formed on the inner wall surface of opening 10a. The surface of rear surface protective film 10 (rear surface 3b of semiconductor chip 3) is flat excluding the portion of opening 10a.

Front surface protective film 9 and rear surface protective film 10 are made of an electrical insulating material such as silicon nitride (SiN) or silicon oxide. The front surface 3a side and the rear surface 3b side of semiconductor substrate 8 are electrically insulated excluding front surface side connection member 11 and rear surface side connection member 12 by means of front surface protective film 9 and rear surface protective film 10.

Front surface side connection member 11 is made of a metal material which is deformed more easily (softer) than rear surface side connection member 12. In the case where rear surface side connection member 12 is made of copper (Cu), for example, front surface side connection member 11 can be made of gold (Au).

Front surface side connection member 11 and rear surface side connection member 12 may be made of the same type of material as feedthrough electrode 7 or may be formed of a different material. In the case where front surface side connection member 11 or rear surface side connection member 12 is made of the same type of material as feedthrough electrode 7, they may be formed integrally or may be formed as separate bodies.

In addition, in the case where front surface side connection member 11 or rear surface side connection member 12 is primarily made of atoms which easily diffuse into feedthrough electrode 7, front surface side connection member 11 or rear surface side connection member 12 can include a barrier metal layer for preventing (suppressing) such a diffusion between front surface side connection member 11 or rear surface side connection member 12 and feedthrough electrode 7. In the case where feedthrough electrode 7 is made of copper and front surface side connection member 11 is primarily made of gold, for example, gold atoms easily diffuse into copper, and therefore, front surface side connection member 11 can include a barrier metal layer that is made of nickel (Ni) or titanium tungsten (TiW) between front surface side connection member 11 and feedthrough electrode 7 in order to prevent (suppress) such a diffusion.

As described above, front surface side connection member 11 and rear surface side connection member 12 may be made of a single material or may be made of a plurality of materials.

Protrusion height H1 of front surface side connection member 11 from front surface 3a (surface of front surface protective film 9) is greater than depth D1 from rear surface 3b (surface of rear surface protective film 10) of the joining surface of rear surface side connection member 12. Between two adjacent semiconductor chips 3, front surface side connection member 11 of one semiconductor chip 3 and rear surface side connection member 12 of the other semiconductor chip 3 are joined. Accordingly, front surface side connection member 11 is provided between the bottom of recess 14 of one semiconductor chip 3 and the other semiconductor chip 3. The joining surface (portion where front surface side connection member 11 and rear surface side connection member 12 are joined) of rear surface side connection member 12 is within through hole 5 (recess 14).

The region occupied by front surface side connection member 11 is completely included within the region occupied by rear surface side connection member 12 in a plan view where semiconductor chips 3 are viewed vertically from the top. Therefore, a gap 18 within a recess is formed between front surface side connection member 11 and the inner wall surface of recess 14 (surface of barrier metal layer 6B that has been formed on the inner wall surfaces of opening 10a and through hole 5). The size of gap 18 within the recess is, for example, approximately 2 μm.

As a result of the above-described relationship between protrusion height H1 of front surface side connection member 11 and depth D1 of the joining surface of rear surface side connection member 12, a gap S is formed between rear surface 3b of one semiconductor chip 3 and front surface 3a of the other semiconductor chip 3. This gap S is filled in with an interlayer sealing material 24 to approximately full.

When interlayer sealing material 24 in liquid form is injected into the gaps between each pair of solid-state device 2 as well as semiconductor chips 3 and 15, in the case where gap S is narrow, interlayer sealing material 24 in liquid form having a high viscosity (for example, material having a large amount of filler contents) does not easily enter into gap S. Therefore, it is necessary to make protrusion height H1 of front surface side connection member 11 large enough to secure a sufficiently large gap S. Accordingly, the aspect ratio of front surface side connection member 11 becomes large in comparison with, for example, the aspect ratio of the bumps in the case where bumps in protrusion form are joined.

Interlayer sealing material 24 is made of a material that is deformed more easily than the portion where front surface side connection member 11 and rear surface side connection member 12 are joined. In the case where front surface side connection member 11 is made of gold and rear surface side connection member 12 is made of nickel/gold, for example, interlayer sealing material 24 is made of, for example, an epoxy based resin.

The area where two adjacent semiconductor chips 3 are joined by the existence of interlayer sealing material 24 becomes greater than that in the case where semiconductor chips 3 are joined solely by means of rear surface side connection member 12 and front surface side connection member 11, and thus, the structural strength is increased in semiconductor device 1.

In addition, although the strength of front surface side connection member 11 and rear surface side connection member 12 usually becomes the lowest in the portion where they are joined, interlayer sealing material 24 is deformed more easily than this joining portion so that interlayer sealing material 24 is deformed prior to this joining portion when a stress is applied between two adjacent semiconductor chips 3 and thereby the stress applied to this joining portion can be reduced.

Due to the difference between the coefficient of thermal expansion of front surface side connection member 11 or rear surface side connection member 12 and the coefficient of thermal expansion of interlayer sealing material 24, a stress is applied to front surface side connection member 11 or rear surface side connection member 12 when a temperature cycle is applied to this semiconductor device 1. This stress becomes the maximum in the center portion between front surface 3a and rear surface 3b which face each other in the direction perpendicular to front surface 3a and rear surface 3b.

On the other hand, the portion where front surface side connection member 11 and rear surface side connection member 12 are joined is within through hole 5 of one semiconductor chip, That is, in a position that is away from the place where the stress applied to front surface side connection member 11 and rear surface side connection member 12 becomes the maximum (center portion between front surface 3a and rear surface 3b which face each other). Accordingly, even in the case where such an interlayer sealing material 24 is provided, breakdown of the portion where front surface side connection member 11 and rear surface side connection member 12 are joined does not easily occur due to a temperature cycle.

Figure 2A:
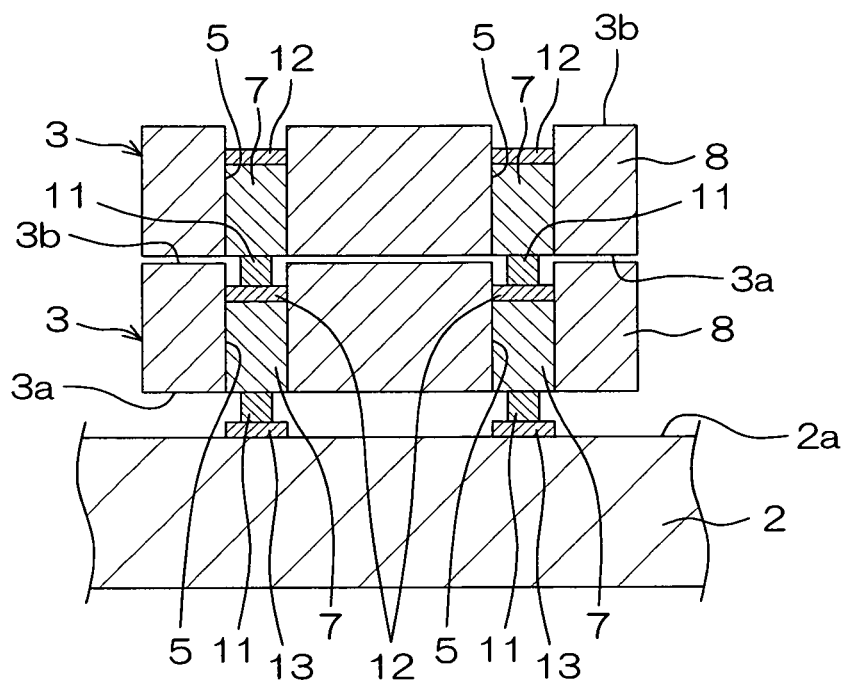
FIG. 2(a) and FIG. 2(b) are enlarged illustrative cross-sectional diagrams showing portions of the semiconductor device shown in FIG. 1.

In reference to FIG. 2(a), a solid-state device side connection member 13 in film form for electrical connection and for mechanical attachment to semiconductor chip 3 is formed on the surface of solid-state device 2 on the side where semiconductor chip 3 is connected. The width of solid-state device side connection member 13 is greater than the width of front surface side connection member 11 of semiconductor chip 3.

Solid-state device side connection member 13 and front surface side connection member 11 of one semiconductor chip 3 are electrically connected and mechanically joined between solid-state device 2 and semiconductor chip 3. The region occupied by front surface side connection member 11 is completely included within the region occupied by solid-state device side connection member 13 in a plan view where solid-state device 2 and semiconductor chips 3 are viewed vertically from the top.

Semiconductor chip 15 (see FIG. 1) has the same structure as that of semiconductor chips 3 except in that through hole 5, feedthrough electrode 7 and rear surface side connection member 12 are not formed. The front surface (surface on which a functional element 4 has been formed) of semiconductor chip 15 faces the solid-state device 2 side. Front surface side connection member 11 of semiconductor chip 15 is joined to rear surface side connection member 12 of adjacent semiconductor chip 3. A semiconductor chip where feedthrough electrodes 7 and rear surface side connection members 12 are formed like semiconductor chips 3 may be placed instead of semiconductor chip 15.

Figure 2B:
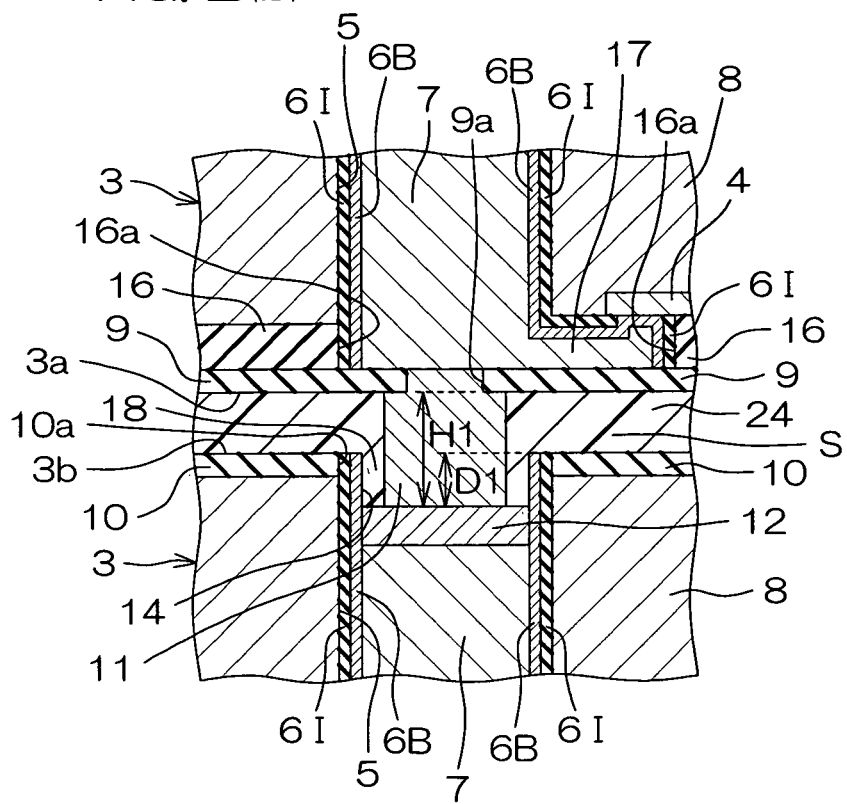

In reference to FIG. 1, FIG. 2(a) and FIG. 2(b), in the above-described configuration, functional elements 4 provided to respective semiconductor chips 3 and 15 are electrically connected to predetermined metal balls 22 via wiring members 17, feedthrough electrodes 7, front surface side connection members 11, rear surface side connection members 12, solid-state device side connection members 13, solid-state device 2, external connection pads 2P, bonding wires 23 and wiring substrate 21.

FIG. 3A to FIG. 3D are illustrative cross-sectional diagrams showing a manufacturing method for semiconductor device 1 shown in FIG. 1, FIG. 2(a) and FIG. 2(b).

First, a solid-state device 2 and semiconductor chips 3 and 15 shown in FIG. 1, FIG. 2(a) and FIG. 2(b) are prepared. Rear surface side connection members 12 can be formed, for example, by means of electroless plating. In this case, electroless plating is carried out on rear surface 3b of semiconductor substrate 8 where recesses are formed above feedthrough electrodes 7 on the rear surface 3b side and thereby, rear surface side connection members 12 can be selectively formed on feedthrough electrodes 7. The surface of rear surface side connection members 12 (surface to which front surface side connection members 11 of another semiconductor chip 3 are joined) can be deeply placed from rear surface 3b by controlling the film thickness of rear surface side connection members 12 through plating time or the like.

A semiconductor chip 3 is obtained by collectively forming feedthrough electrodes 7, front surface side connection members 11, rear surface side connection members 12 and the like, on a larger semiconductor substrate such as a semiconductor wafer and after that by dividing this semiconductor substrate into semiconductor substrates 8. In the same manner, semiconductor chip 15 is obtained by collectively forming front surface side connection members 11 on a larger semiconductor substrate such as a semiconductor wafer and after that, by dividing this semiconductor substrate into semiconductor substrates 8.

It is preferable for the top surfaces of front surface side connection members 11 and rear surface side connection members 12 before joining to be made of gold. In the case where front surface side connection members 11 are primarily made of gold and rear surface side connection members 12 are primarily made of copper, for example, it is preferable for thin films of gold to be formed on the top surfaces of rear surface side connection members 12.

Next, solid-state device 2 is placed approximately horizontally on a bonding stage 31 in the state where surface 2a on which solid-state device side connection members 13 are formed (hereinafter referred to as "front surface") faces upward. Then, semiconductor chips 3 and 15 are held by suction one at a time by means of a bonding tool 32 which can hold a semiconductor chip 3 or 15 by suction and are stacked on solid-state device 2.

First, rear surface 3b of first semiconductor chip 3 (hereinafter referred to as "first semiconductor chip 3F") is suctioned by bonding tool 32. As a result of this, first semiconductor chip 3F is held approximately horizontal in the state where front surface 3a face downward.

Figure 4:
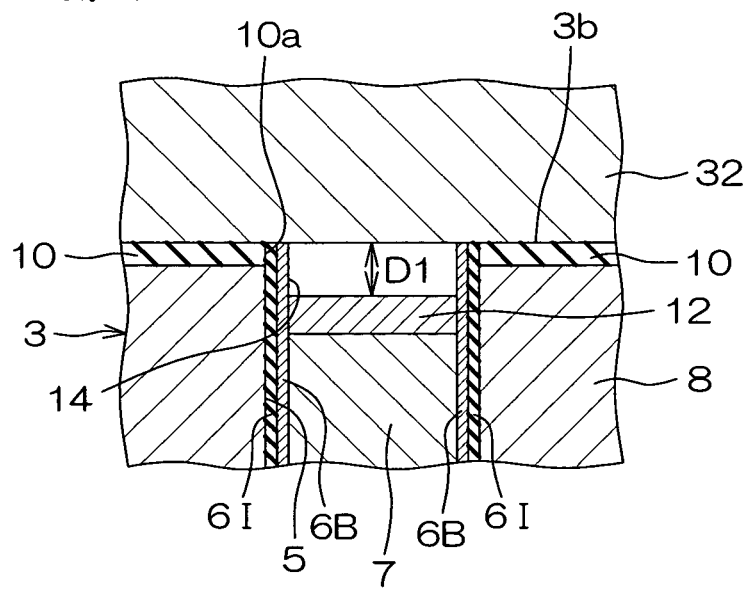
FIG. 4 is an illustrative cross-sectional diagram showing a portion where a bonding tool and a semiconductor chip make contact with each other.

FIG. 4 is an illustrative cross-sectional diagram showing the portion where bonding tool 32 and semiconductor chip 3 make contact with each other and an area in the vicinity thereof in an enlarged manner.

The surface of bonding tool 32 which makes contact with semiconductor chip 3 is almost flat. Rear surface 3b of semiconductor chip 3 (surface of rear surface protective film 10) is flat and therefore, almost the entire rear surface 3b of semiconductor chip 3 excluding the portions of openings 10a makes contact with bonding tool 32. As a result of this, the force applied to semiconductor chip 3 from bonding tool 32 is received almost evenly by rear surface 3b of semiconductor chip 3.

In addition, the joining surface (upper end surface) of rear surface side connection member 12 is located at depth D1 from rear surface 3b and therefore, rear surface side connection member 12 does not make contact with bonding tool 32. Accordingly, the surface of rear surface side connection member 12 is not contaminated by making contact with bonding tool 32.

Figure 3A:
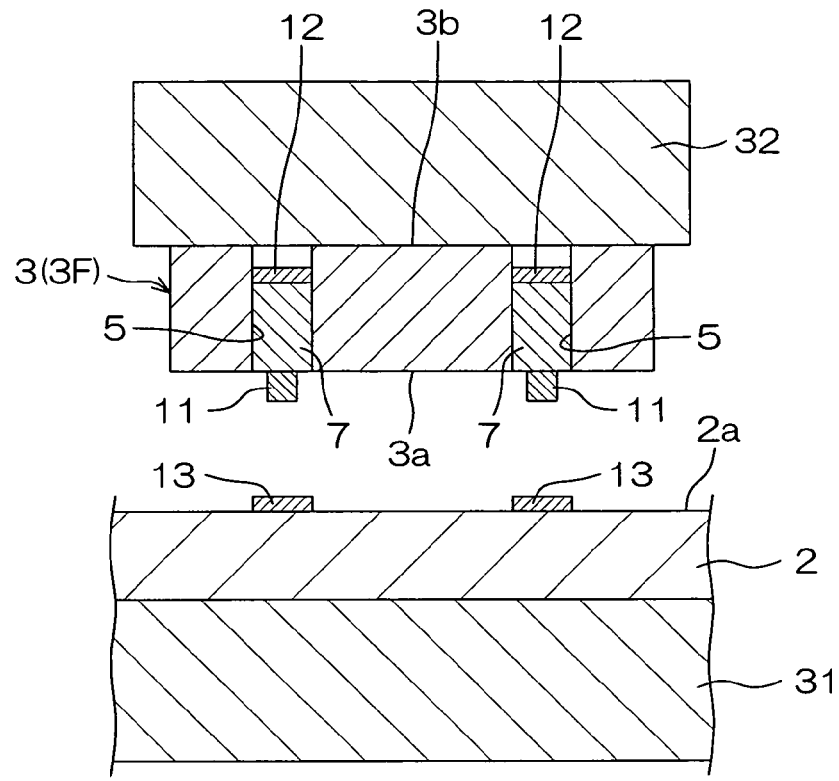
FIG. 3A to FIG. 3D are illustrative cross-sectional diagrams for explaining a manufacturing method for the semiconductor device shown in FIG. 1.

In reference to FIG. 3A, bonding tool 32 is subsequently moved so that front surface 2a of solid-state device 2 that has been placed on bonding stage 31 and front surface 3a of first semiconductor chip 3F face each other and thus a solid-state device side connection member 13 and the corresponding front surface side connection member 11 are positioned.

The positioning is carried out by inserting a recognition camera, which can observe front surface 2a of solid-state device 2 and front surface 3a of first semiconductor chip 3F, between solid-state device 2 and first semiconductor chip 3F. At this time, an alignment mark that has been formed in advance in a region of solid-state device 2 which is not in the portion that faces semiconductor chip 3 is utilized.

As a result of the positioning, the region occupied by front surface side connection member 11 is completely included within the region occupied by solid-state device side connection member 13 in a plan view where solid-state device 2 and first semiconductor chip 3F are viewed vertically from the top.

Figure 3B:
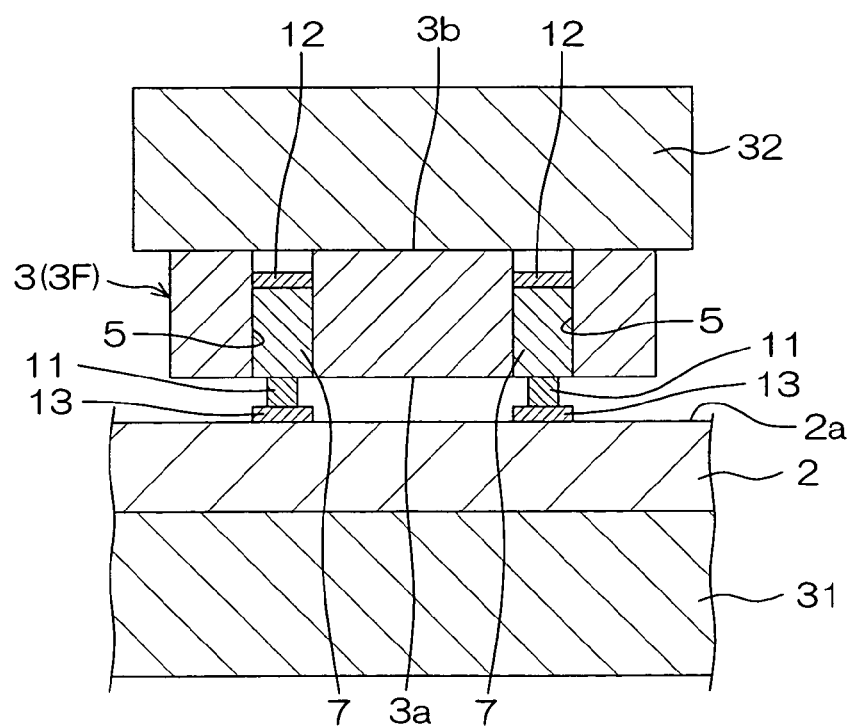

When the positioning is completed, bonding tool 32 is lowered and front surface side connection member 11 of first semiconductor chip 3F is pressed against solid-state device side connection member 13 with an appropriate load (see FIG. 3B). As a result of this, solid-state device side connection member 13 and front surface side connection member 11 are joined, and thus, mechanical joining and electrical connection between solid-state device 2 and first semiconductor chip 3F are achieved.

At this time, bonding tool 32 does not make contact with a rear surface side connection member 12 and thereby, rear surface side connection member 12 is not deformed (see FIG. 4). Accordingly, two adjacent rear surface side connection members 12 are not electrically short-circuited. That is, according to this manufacturing method, a short-circuiting defect generated by rear surface side connection member 12 can be made difficult to occur during the manufacture of semiconductor device 1.

Bonding tool 32 may be able to generate an ultrasonic vibration or may be able to apply heat to a semiconductor chip that is being held (see FIG. 18). In the case of the former, bonding tool 32 applies an ultrasonic vibration to the portion (joining portion), where solid-state device side connection member 13 and front surface side connection member 11 make contact with each other, via first semiconductor chip 3F if necessary.

Figure 31A:
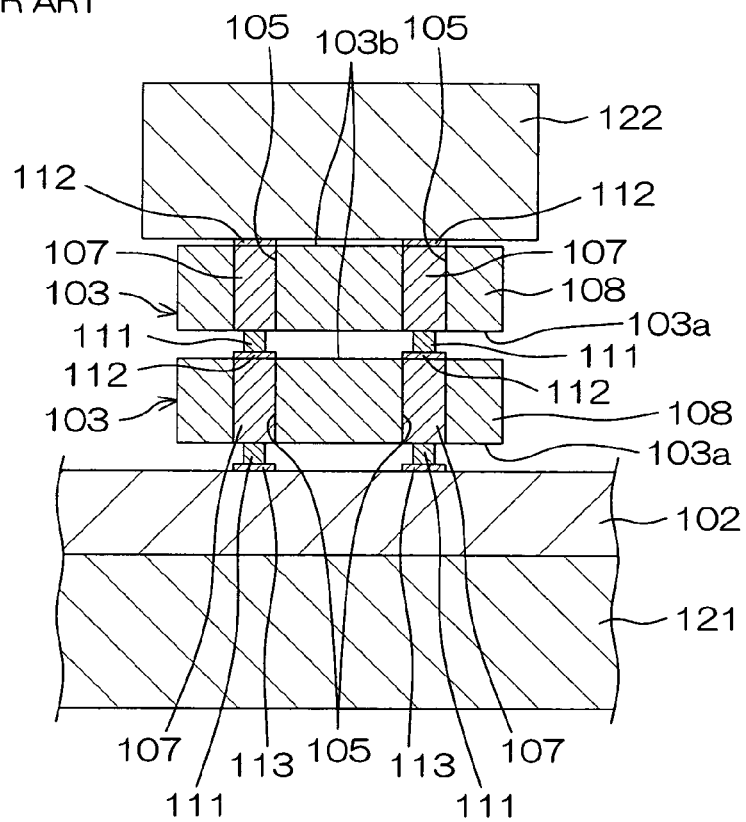
FIG. 31(a) and FIG. 31(b) are illustrative cross-sectional diagrams for explaining a manufacturing method for the semiconductor device shown in FIG. 30(a) and FIG. 30(b).
Figure 31B:
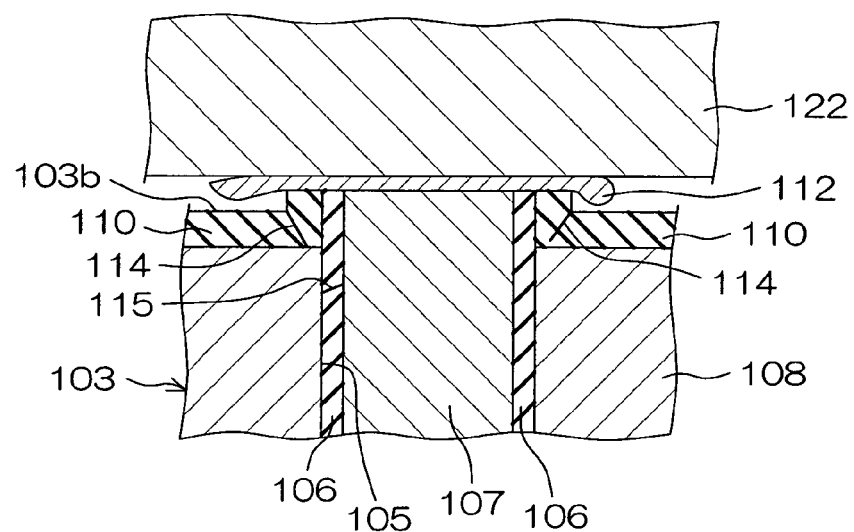

Bonding tool 32 does not make contact with rear surface side connection member 12 and thereby, such an ultrasonic vibration does not attenuate due to the deformation of rear surface side connection member 112 (see FIG. 31(b)) which was caused by making contact with bonding tool 122 unlike the case of a conventional manufacturing method for semiconductor device 101. Accordingly, the ultrasonic vibration is fully conveyed to the portion (joining portion) where solid-state device side connection member 13 and front surface side connection member 11 make contact with each other, and thus, solid-state device side connection member 13 and front surface side connection member 11 are firmly joined. A gap is secured between front surface 2a of solid-state device 2 and front surface 3a of first semiconductor chip 3F.

When joining of solid-state device side connection member 13 to front surface side connection member 11 is completed, bonding tool 32 releases first semiconductor chip 3F from the state where it is being held by suction.

Next, second semiconductor chip 3 (hereinafter referred to as "second semiconductor chip 3S") is held by suction by bonding tool 32 in the same manner as in the case of first semiconductor chip 3F. Then, bonding tool 32 is moved so that rear surface 3b of first semiconductor chip 3F that has been placed on and joined to solid-state device 2 and front surface 3a of second semiconductor chip 3S that has been held by bonding tool 32 are made to face each other.

Figure 3C:
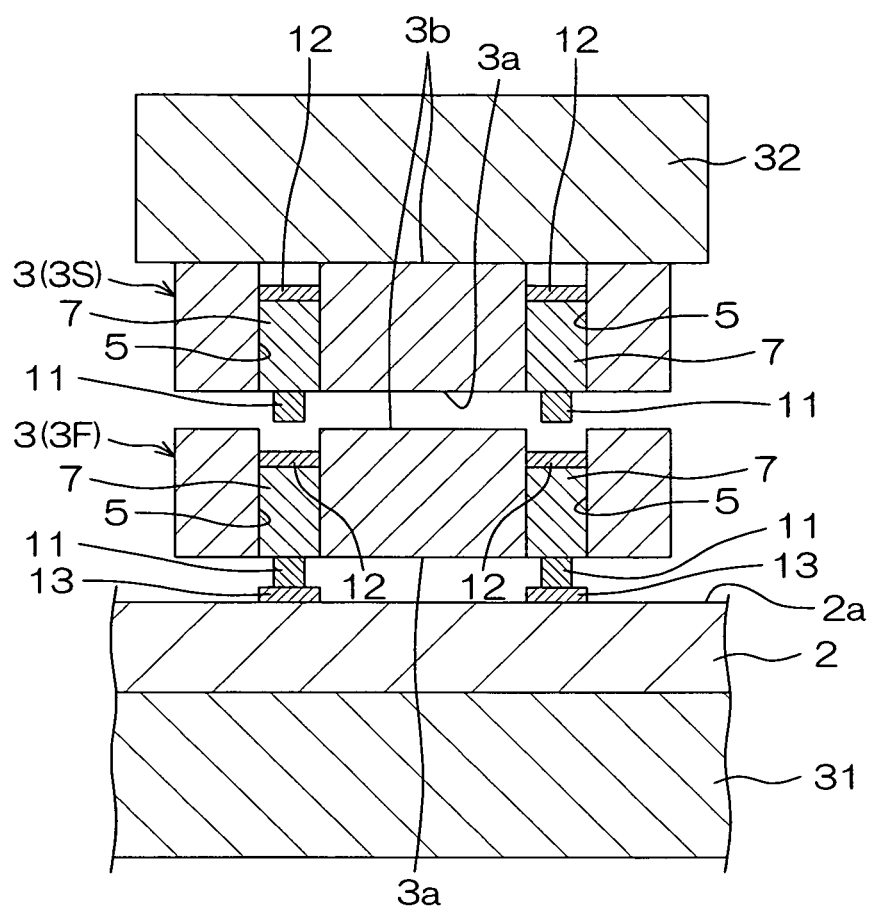
Figure 3D:
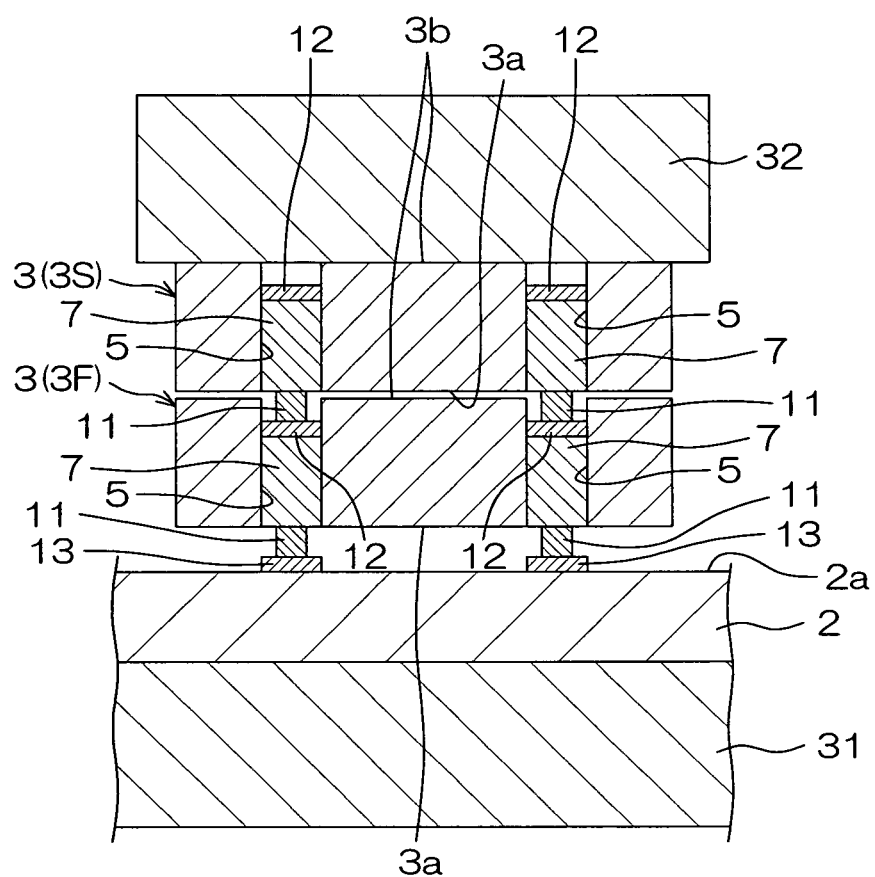

Subsequently, a rear surface side connection member 12 of first semiconductor chip 3F and the corresponding front surface side connection member 11 of second semiconductor chip 3S are positioned. This state is shown in FIG. 3C. The positioning is carried out by using a recognition camera in the same manner as in the case of positioning of solid-state device 2 and first semiconductor chip 3F. An alignment mark is formed in a region of solid-state device 2 which excludes the portion that faces semiconductor chip 3, and thereby, the recognition camera can recognize this alignment mark even after first semiconductor chip 3F has been joined to solid-state device 2.

Figure 5:
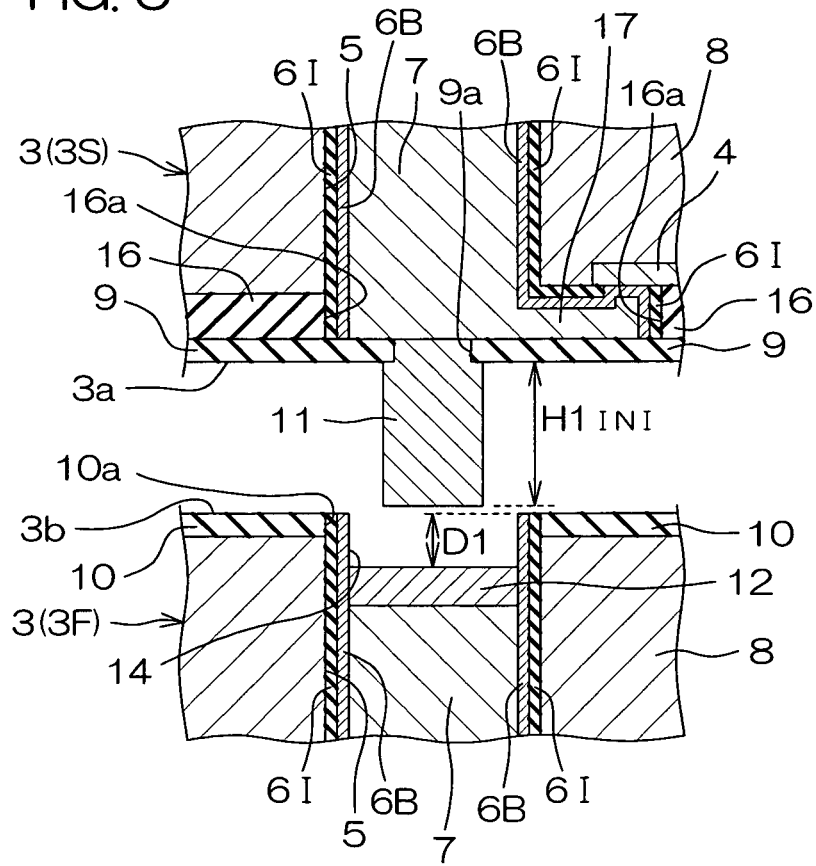
FIG. 5 is an illustrative cross-sectional diagram showing a portion where two semiconductor chips face each other.

FIG. 5 is an illustrative cross-sectional diagram showing a portion where first semiconductor chip 3F and second semiconductor chip 3S face each other in an enlarged manner.

Protrusion height $H1_{INI}$ of front surface side connection member 11 from front surface 3a (surface of front surface protective film 9) before being joined to solid-state device 2 or semiconductor chip 3 is greater than protrusion height H1 (see FIG. 2(b)) of front surface side connection member 11 after joining, and accordingly, is greater than depth D1 from rear surface 3b (surface of rear surface protective film 10) of the joining surface (upper end surface) of rear surface side connection member 12.

The form and dimensions of front surface side connection member 11 before joining, as well as the form and volume of recess 14, are set so that a state where a large portion of the front surface side connection member 11 is contained within recess 14 (see FIG. 2(b)) is obtained when joining of front surface side connection member 11 to rear surface side connection member 12 has been completed. As a result of this, even in the case where front surface side connection member 11 is deformed when it is joined to rear surface side connection member 12, this deformation does not make front surface side connection member 11 bulge out to the side (in a direction along front surface 3a), and front surface side connection member 11 is not electrically short-circuited with another adjacent front surface side connection member 11.

As a result of positioning, the region occupied by front surface side connection member 11 of second semiconductor chip 3S is completely included within the region occupied by rear surface side connection member 12 of first semiconductor chip 3F (within recess 14) in a plan view where first and second semiconductor chips 3F and 3S are viewed vertically from the top.

Subsequently, bonding tool 32 is lowered, and thereby, front surface side connection member 11 of second semiconductor chip 3S and rear surface side connection member 12 of first semiconductor chip 3F make contact with each other and are pressed against each other. At this time, front surface side connection member 11 is made of a material that is deformed more easily than that of rear surface side connection member 12, and thereby, front surface side connection member 11 is deformed to a greater extent than rear surface side connection member 12.

The region occupied by this front surface side connection member 11 is included in the region occupied by this rear side connection member 12 in a plan view where first and second semiconductor chips 3F and 3S are viewed vertically from the top, that is, this front surface side connection member 11 is narrower than this rear surface side connection member 12, and thereby, this front surface side connection member 11 is deformed to a greater extent. In accordance with this, the area of the portion where rear surface side connection member 12 and front surface side connection member 11 make contact with each other increases, so that rear surface side connection member 12 and front surface side connection member 11 are excellently joined.

Furthermore, rear surface side connection member 12 of first semiconductor chip 3F is not contaminated by bonding tool 32, and thereby, this joining is excellently achieved.

Here, rear surface side connection member 12 is formed on feedthrough electrode 7 so as to be in film form (thin), and therefore, cannot be deformed to a great extent in comparison with front surface side connection member 11 that has been formed thick and in pillar form. In addition, rear surface side connection member 12 is formed so that the peripheral portion thereof makes contact with barrier metal layer 6B that has been formed along the inner wall of through hole 5, and therefore, rear surface side connection member 12 must enter the gap between barrier metal layer 6B and front surface side connection member 11 in order for rear surface side connection member 12 to be deformed. However, rear surface side connection member 12 that is made of a solid, such as a metal, does not easily enter such a narrow gap.

Accordingly, in the case where rear surface side connection member 12 is made of a material that is deformed more easily than that of front surface side connection member 11, the amount of deformation of both rear surface side connection member 12 and front surface side connection member 11 becomes small, and thus, excellent joining cannot be achieved.

In addition, in the case where the amount of deformation of both rear surface side connection member 12 and front surface side connection member 11 becomes small at the time of joining, stress is concentrated in the vicinity of the portion where the two make contact with each other, and there is a risk that barrier metal layer 6B and insulating film 6I which intervene between semiconductor substrate 8 and feedthrough electrode 7 may be broken (breakdown of feedthrough electrode structure). In this case, a current leaks between feedthrough electrode 7 and semiconductor substrate 8 or metal atoms that form feedthrough electrode 7 diffuse into semiconductor substrate 8, and thereby, deterioration in the device properties is induced.

Next, in the case where the region occupied by front surface side connection member 11 of second semiconductor chip 3S is not included in the region occupied by rear surface side connection member 12 of first semiconductor chip 3F in a plan view where first and second semiconductor chips 3F and 3S are viewed vertically from the top, the following defect occurs.

In the case where the region occupied by front surface side connection member 11 is too large to be included in the region occupied by recess 14 (through hole 5), for example, front surface side connection member 11 cannot enter into the inside of recess 14 without being deformed. In this case, there is a risk that cracking (hereinafter referred to as "chip cracking") may occur in rear surface protective film 10, barrier metal layer 6B, insulating film 6I or semiconductor substrate 8, in the vicinity of the edges of recess 14 (opening 10a) on the rear surface 3b side of first semiconductor chip 3F.

On the other hand, according to a manufacturing method of the present embodiment, front surface side connection member 11 is made of a material that is deformed more easily than that of rear surface side connection member 12, and the region occupied by front surface side connection member 11 of second semiconductor chip 3S is included in the region occupied by rear surface side connection member 12 of first semiconductor chip 3F in a plan view where first and second semiconductor chips 3F and 3S are viewed vertically from the top, and thereby, the above-described problems do not occur.

At the time when rear surface side connection member 12 and front surface side connection member 11 are joined to each other, an ultrasonic vibration is applied to the joining portion by bonding tool 32, if necessary. In the same manner as in the case of joining of solid-state device side connection member 13 front surface side connection member 11, rear surface side connection member 12 is not deformed by making contact with bonding tool 32, and thereby, the ultrasonic vibration is not attenuated. Accordingly, the ultrasonic vibration is fully conveyed to the portion (joining portion) where rear surface side connection member 12 and front surface side connection member 11 make contact with each other, so that rear surface side connection member 12 and front surface side connection member 11 are excellently joined.

As a result of this, mechanical joining and electrical connection between first and second semiconductor chips 3F and 3S are achieved. The protrusion height of front surface side connection member 11 from front surface 3a becomes H1 that is smaller than $H1_{INI}$ as a result of deformation at the time of joining. Here, joining conditions, such as the joining load, are set so that gap S (see FIG. 2(b)) is secured between rear surface 3b of first semiconductor chip 3F and front surface 3a of second semiconductor chip 3S, even in the case where front surface side connection member 11 is deformed.

When joining is completed, bonding tool 32 releases second semiconductor chip 3S from the state where it is held by suction.

In the same manner, a third semiconductor chip 3 is placed on and joined to second semiconductor chip 3S, and furthermore, semiconductor chip 15 is placed and joined to this third semiconductor chip 3.

Interlayer sealing material 24 may be formed before solid-state device 2 and semiconductor chips 3 and 15 are joined (stacked), or may be formed after they are joined, as described above.

Next, surface (rear surface) 2b of solid-state device 2 on the side opposite front surface 2a is joined to approximately the center portion of the surface of wiring substrate 21 on which electrode pads, not shown, have been formed (see FIG. 1). Subsequently, external connection pads 2P of solid-state device 2 and electrode pads of wiring substrate 21 are connected by means of bonding wires 23.

Next, semiconductor chips 3 and 15, solid-state device 2, bonding wires 23 and the surface of wiring substrate 21 on the solid-state device 2 side are molded in sealing resin 25 by means of mold formation. After that, metal balls 22 are joined to predetermined positions of the surface of wiring substrate 21 on the side opposite solid-state device 2, and thus, semiconductor device 1 shown in FIG. 1 is obtained.

According to the above-described manufacturing method, solid-state device 2 may be placed on and joined to wiring substrate 21 before semiconductor chips 3 and 15 are placed on and joined to solid-state device 2. In such a case, wiring substrate 21 to which solid-state device 2 has been joined is placed on bonding stage 31 in a state where solid-state device 2 faces upward, and respective semiconductor chips 3 and 15 can be placed on and joined to solid-state device 2 in this state, in the same manner as in the above-described method.

Figure 6A:
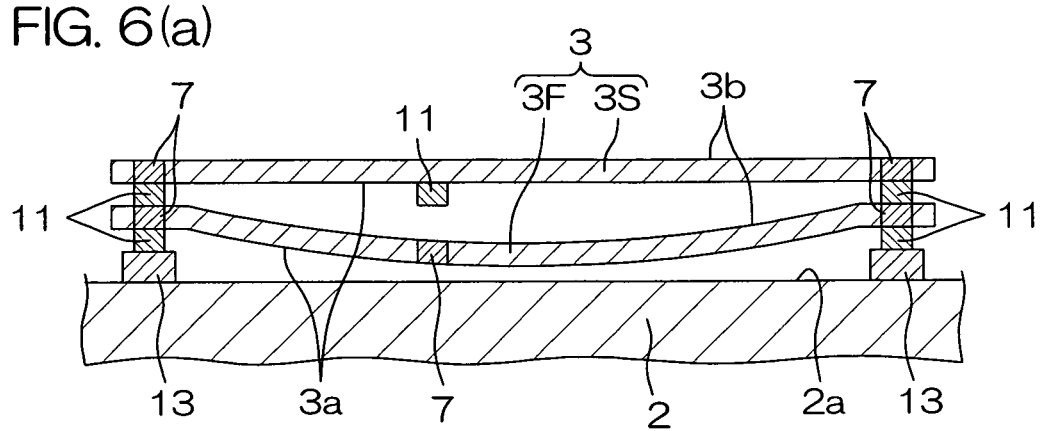
FIG. 6(a) to FIG. 6(c) are illustrative cross-sectional diagrams showing arrangements of front surface side connection members and feedthrough electrodes.
Figure 6B:
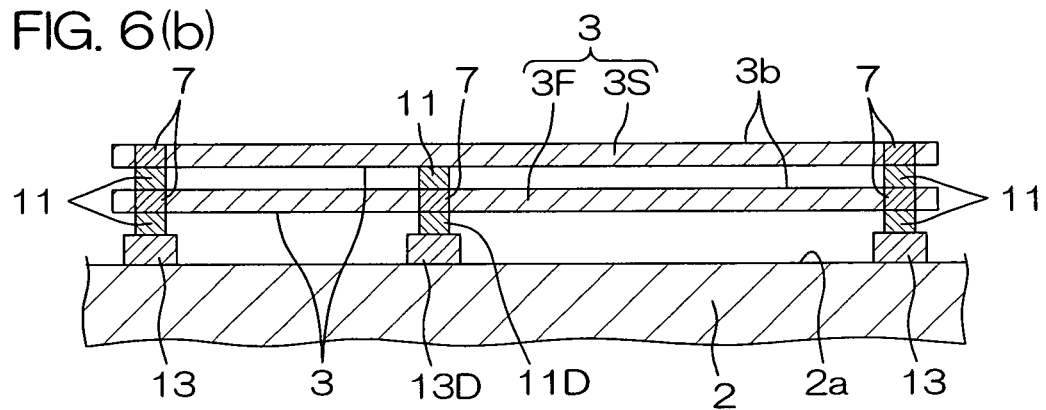
Figure 6C:
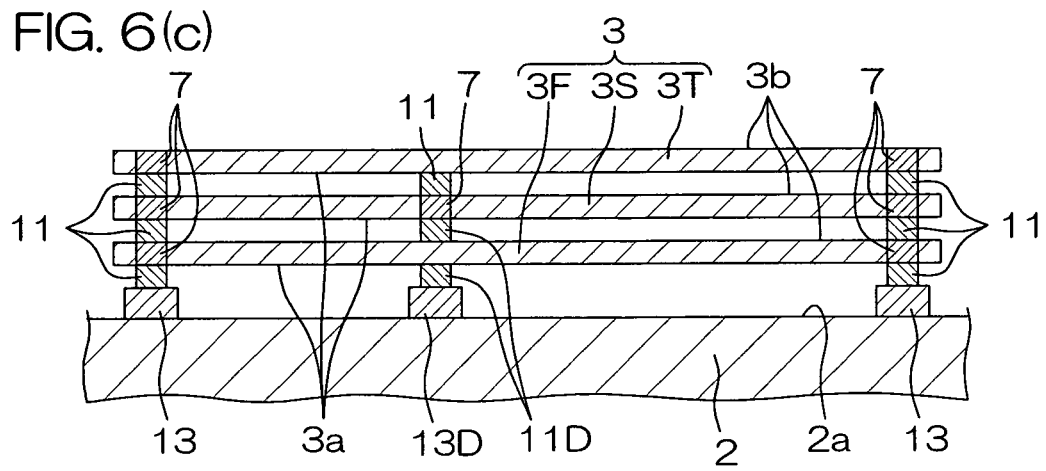

FIG. 6(a) to FIG. 6(c) are illustrative cross-sectional diagrams showing an arrangement of front surface side connection members 11 and feedthrough electrodes 7 of a plurality of semiconductor chips 3 that have been stacked on solid-state device 2, and show a state where solid-state device 2 and semiconductor chips 3 are joined. In the cross-sections shown in FIG. 6(a) to FIG. 6(c), greater numbers of feedthrough electrodes 7 and front surface side connection members 11 than those in the cross-sections shown in FIG. 1, FIG. 2(a) and FIG. 3A to FIG. 3D are shown. Although rear surface side connection members 12 are omitted in FIG. 6(a) to FIG. 6(c), they are formed on the rear surface 3b side of respective feedthrough electrodes 7.

In the cross-section shown in FIG. 6(a), feedthrough electrodes 7 appear in two places in the peripheral portions (vicinity of both end portions) of first and second semiconductor chips 3F and 3S, as well as in the center portion of first semiconductor chip 3F. On the other hand, front surface side connection members 11 are joined to feedthrough electrodes 7 that have been provided in the peripheral portions of first and second semiconductor chips 3F and 3S, as well as to the center portion of front surface 3a of second semiconductor chip 3S, and is not joined to feedthrough electrode 7 that is provided in the center portion of first semiconductor chip 3F.

Respective front surface side connection members 11 of second semiconductor chip 3S are provided in positions that correspond to respective feedthrough electrodes 7 of first semiconductor chip 3F. It is assumed that these front surface side connection members 11 need to be electrically respectively connected to corresponding feedthrough electrodes 7.

Solid-state device side connection members 13 are provided on front surface 2a of solid-state device 2, in positions which correspond to front surface side connection members 11 of first semiconductor chip 3F.

Here, in the case where the thickness of first semiconductor chip 3F has been reduced to as thin as approximately 50 μm, for example, first semiconductor chip 3F becomes easily warped (arched), due to thermal expansion/contraction of first semiconductor chip 3F itself caused by, for example, a change in temperature at the time of joining. As a result of this, in the case where a plurality of front surface side connection members 11 are not uniformly arranged on front surface 3a of first semiconductor chip 3F, that is, in the case where, for example, they are placed non-uniformly, in the peripheral portion of first semiconductor chip 3F, as shown in FIG. 6(a), warping occurs in first semiconductor chip 3F. In this example, the center portion of first semiconductor chip 3F is not supported from below, and therefore, first semiconductor chip 3F is warped (arched) in a manner where this portion is lowered.

As a result of this, the coplanarity of the portions of feedthrough electrodes 7 of first semiconductor chip 3F to which front surface side connection members 11 of second semiconductor chip 3S are to be joined (surface of rear surface side connection member 12) becomes worse. Therefore, although feedthrough electrodes 7 provided in the peripheral portion and front surface side connection members 11 provided in the peripheral portion can be joined between first and second semiconductor chips 3F and 3S, in some cases, feedthrough electrodes 7 provided in the center portion and front surface side connection members 11 provided in the center portion fail to make contact and establish electrical connection with each other. FIG. 6(a) shows a state where a feedthrough electrode 7 provided in the center portion of first semiconductor chip 3F and a front surface side connection member 11 provided in the center portion of second semiconductor chip 3S fail to establish electrical connection with each other, for the above-described reason.

In addition, even in the case where first semiconductor chip 3F is not warped before second semiconductor chip 3S is joined, first semiconductor chip 3F is warped when a front surface side connection member 11 on the center portion of second semiconductor chip 3S is pressed against a feedthrough electrode 7 on the center portion of first semiconductor chip 3F at the time of joining of second semiconductor chip 3S to first semiconductor chip 3F, and thus, this front surface side connection member 11 and this feedthrough electrode 7 are not excellently joined.

Furthermore, in the case where the center portion of first semiconductor chip 3F is lowered, the gap between solid-state device 2 and first semiconductor chip 3F becomes narrow in this portion, and therefore, it becomes difficult to inject interlayer sealing material 24 in liquid form into this gap.

Therefore, as shown in FIG. 6(b), a dummy front surface side connection member 11D having approximately the same protrusion height as front surface side connection members 11 is provided in a position on front surface 3a of first semiconductor chip 3F that corresponds to feedthrough electrode 7 in the center portion. In this case, a dummy solid-state device side connection member 13D having approximately the same protrusion height as solid-state device side connection member 13 is provided in a position on front surface 2a of solid-state device 2 that corresponds to dummy front surfaces side connection member 11D. Dummy front surface side connection member 11D does not contribute to electrical connection between solid-state device 2 and first semiconductor chip 3F. Therefore, an insulating film may be inserted between dummy front surface side connection member 11D and feedthrough electrode 7 in first semiconductor chip 3F.

As a result of this, the center portion of first semiconductor chip 3F is supported from below by dummy front surface side connection member 11D, and therefore, it becomes difficult for first semiconductor chip 3F to be warped, both before and after joining of second semiconductor chip 3S. Therefore, feedthrough electrode 7 that is provided in the center portion of first semiconductor chip 3F and front surface side connection member 11 that is provided in the center portion of second semiconductor chip 3S can be made to make contact and establish electrical connection with each other. In addition, the gap between solid-state device 2 and first semiconductor chip 3F does not become narrow in the vicinity of the center portion of first semiconductor chip 3F, and therefore, interlayer sealing material 24 in liquid form can be easily injected.

In the case where another semiconductor chip 3 (hereinafter referred to as "third semiconductor chip 3T") is additionally placed on and joined to second semiconductor chip 3S, the same structure can be provided.

FIG. 6(c) shows a case where three semiconductor chips 3 are stacked on solid-state device 2 and are joined. In the cross-section shown in FIG. 6(c), feedthrough electrodes 7 appear in two places in the peripheral portions (vicinity of both end portions) of first to third semiconductor chips 3F, 3S and 3T, and in the center portion of second semiconductor chip 3S. Meanwhile, front surface side connection members 11 are joined to feedthrough electrodes 7 which are provided on the peripheral portions of first to third semiconductor chips 3F, 3S and 3T, as well as to the center portion of front surface 3a of third semiconductor chip 3T.

Respective front surface side connection members 11 of second semiconductor chip 3S are provided in positions that correspond to respective feedthrough electrodes 7 of first semiconductor chip 3F, and respective front surface side connection members 11 of third semiconductor chip 3T are provided in positions that correspond to respective feedthrough electrodes 7 of second semiconductor chip 3S. It is assumed that these front surface side connection members 11 and corresponding feedthrough electrodes 7 need to be electrically connected.

Dummy front surface side connection members 11D having approximately the same protrusion height as front surface side connection members 11 that are provided on respective semiconductor chips 3F and 3S are respectively provided in positions in the center portions of front surfaces 3a of first and second semiconductor chips 3F and 3S that correspond to front surface side connection member 11 in the center portion of third semiconductor chip 3T.

The peripheral portions and the center portions of first and second semiconductor chips 3F and 3S are supported from below by front surface side connection members 11 and dummy front surface side connection members 11D which are respectively arranged approximately uniformly (with an approximately constant density) on surfaces 3a. In addition, a front surface side connection member 11 or a dummy front surface side connection member 11D always exists on second semiconductor chip 3S beneath a feedthrough electrode 7 (rear surface connection member 12) against which a front surface side connection member 11 of third semiconductor chip 3T is pressed.

As described above, second and first semiconductor chips 3S and 3F are not warped before and at the time of joining of third semiconductor chip 3T. Accordingly, a front surface side connection member 11 in the center portion of third semiconductor chip 3T and a feedthrough electrode 7 in the center portion of second semiconductor chip 3S can be electrically connected, and interlayer sealing material 24 in liquid from can be easily injected into the gap between each pair of solid-state device 2 and first to third semiconductor chips 3F, 3S and 3T.

As described above, it is preferable for front surface side connection members 11 and dummy front surface side connection members 11D to be arranged approximately uniformly (with an approximately constant density) on front surface 3a of each semiconductor chip 3. As a result of this, semiconductor chips 3 are supported almost uniformly in any direction in the plane by means of front surface side connection members 11 and dummy front surface side connection members 11D, and therefore, warping can be prevented (reduced).

In addition, it is preferable for a front surface side connection member 11 or a dummy front surface side connection member 11D to be provided in positions which correspond to a front surface side connection member 11 of an arbitrary semiconductor chip 3, for all semiconductor chips 3 that exist below this arbitrary semiconductor chip (on the solid-state device 2 side). As a result of this, semiconductor chip 3 which has a feedthrough electrode 7 (rear surface side connection member 12) against which a front surface side connection member 11 is pressed can be prevented from being warped, and this front surface side connection member 11 and this feedthrough electrode 7 can be excellently joined.

Figure 7A:
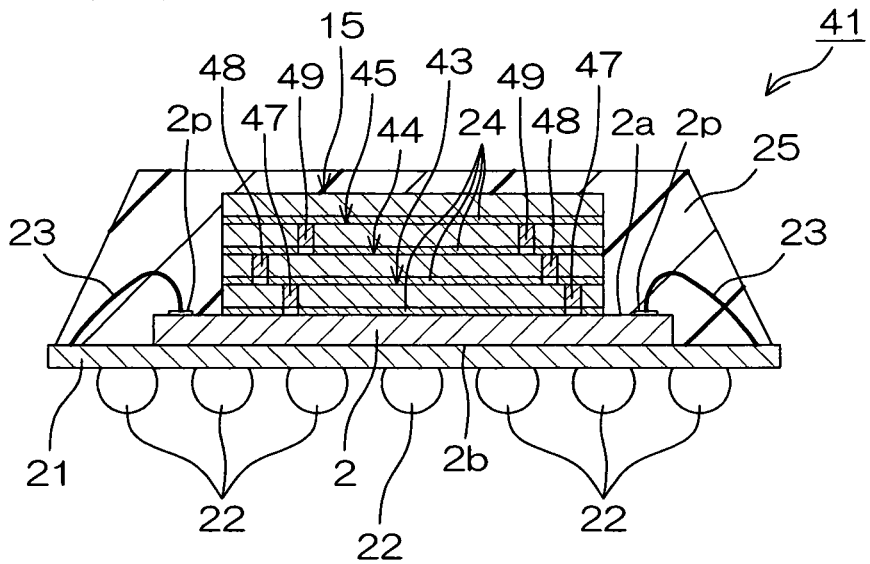
FIG. 7(a) and FIG. 7(b) are illustrative cross-sectional diagrams showing the structure of a semiconductor device according to the second embodiment of the present invention.
Figure 7B:
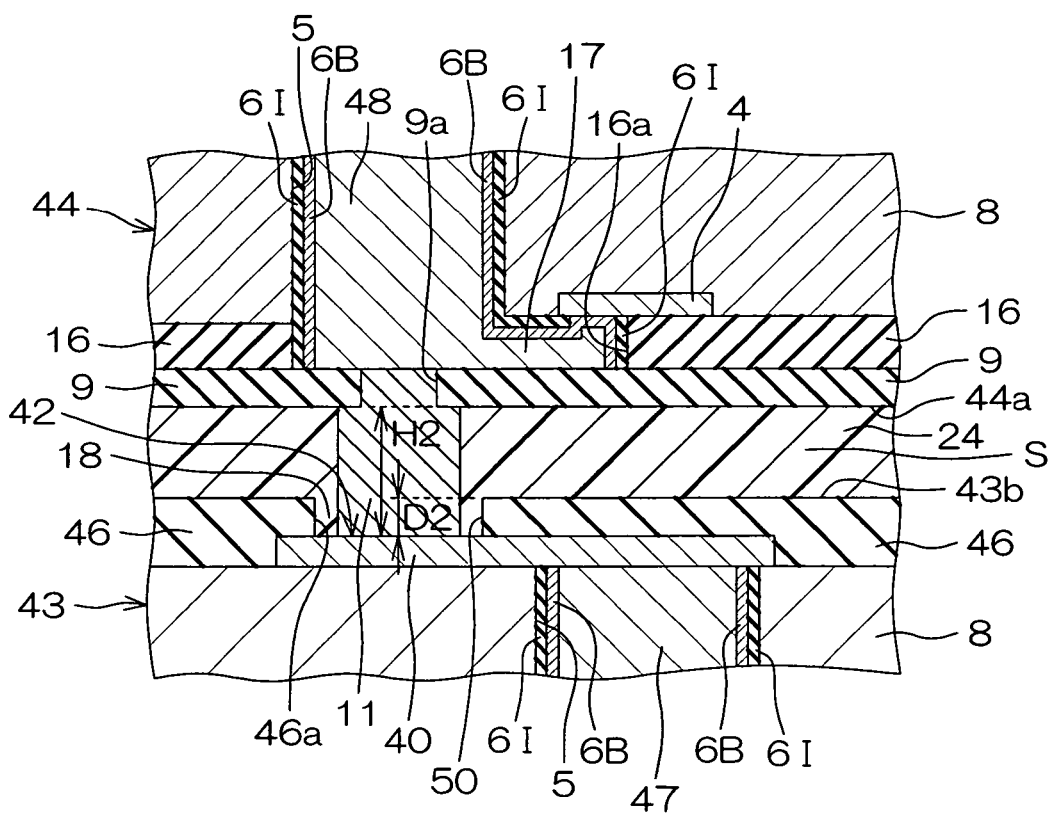

FIG. 7(a) and FIG. 7(b) are illustrative cross-sectional diagrams showing the structure of a semiconductor device according to the second embodiment of the present invention. In FIG. 7(a) and FIG. 7(b), the same reference symbols as in FIG. 1, FIG. 2(a) and FIG. 2(b) are attached to parts that correspond to the respective parts shown in FIG. 1, FIG. 2(a) and FIG. 2(b), and overlapping descriptions thereof are omitted. FIG. 7(a) shows the entirety of this semiconductor device, and FIG. 7(b) shows an area in the vicinity of a portion where two semiconductor chips are adjacent to each other in an enlarged manner.

In reference to FIG. 7(a), this semiconductor device 41 is provided with three semiconductor chips 43, 44 and 45, which are sequentially placed from the solid-state device 2 side instead of the three semiconductor chips 3 of semiconductor device 1 shown in FIG. 1, FIG. 2(a) and FIG. 2(b). Semiconductor chips 43, 44 and 45 respectively have feedthrough electrodes 47, 48 and 49. Feedthrough electrodes 47, 48 and 49 of respective semiconductor chips 43, 44 and 45 are placed so as not to overlap feedthrough electrodes 47, 48 and 49 of other semiconductor chips 43, 44 and 45 in a plan view where semiconductor chips 43, 44 and 45 are viewed vertically from the top.

FIG. 7(b) shows a portion where semiconductor chip 43 and semiconductor chip 44 face each other. The inside of through holes 5 is almost completely filled in with feedthrough electrodes 47 and 48. Front surface side connection member 11 is joined to feedthrough electrode 48 on the front surface 44a side of semiconductor chip 44, and front surface side connection member 11 protrudes from front surface 44a.

The end surface of feedthrough electrode 47 and the surface of semiconductor substrate 8 are approximately on the same plane on the rear surface 43b side of semiconductor chip 43, and an additional wire 40, which is connected to feedthrough electrode 47, is formed on this surface. Rear surface protective film 46 is formed on the rear surface 43b side of semiconductor substrate 8 so as to cover semiconductor substrate 8 and additional wire 40. Rear surface protective film 46 has a thickness that is greater than that of additional wire 40.

An insulating film (not shown) is formed on the entirety of the surface, excluding the portion of through hole 5 on the rear surface 43b side of semiconductor substrate 8 (between semiconductor substrate 8 and additional wire 40 and between semiconductor substrate 8 and rear surface protective film 46). As a result of this, additional wire 40 and semiconductor substrate 8 are electrically insulated from each other. In addition, a barrier metal layer (not shown) is formed between this insulating film and additional wire 40, so as to approximately overlap additional wire 40 in a plan view where semiconductor substrate 8 is viewed vertically from the top. As a result of this, even in the case where additional wire 40 is made of metal atoms which easily diffuse into semiconductor substrate 8, such metal atoms can be prevented (suppressed) from diffusing into semiconductor substrate 8.

Opening 46a is formed in rear surface protective film 46. A portion of additional wire 40 is exposed through this opening 46a. The portion of additional wire 40 that is exposed through opening 46a becomes a rear surface side connection member 42. The surface of rear surface protective film 46 (rear surface 43b of semiconductor chip 43) is flat, except for the portion of opening 46a.

Rear surface protective film 46 is made of an electrically insulating material, in the same manner as rear surface protective film 10 of semiconductor device 1. Front surface protective film 9 and rear surface protective film 46 electrically insulate semiconductor substrate 8, excluding front surface side connection members 11 and rear surface side connection members 42. In addition, additional wire 40 is physically protected by rear surface protective film 46.

Semiconductor chips 43, 44 and 45 have the same structure, except for the positions where feedthrough electrodes 47, 48 and 49 are formed.

Front surface side connection member 11 is made of a material that is deformed more easily (softer) than rear surface side connection member 42 (additional wire 40). In addition, the region occupied by front surface side connection member 11 of semiconductor chip 44 is almost completely included in the region occupied by rear surface side connection member 42 of semiconductor chip 43 in a plan view where semiconductor chips 43 and 44 are viewed vertically from the top.

In semiconductor chip 43, the upper surface of rear surface side connection member 42 is a joining surface for joining to semiconductor chip 44, and this joining surface is located at depth D2 from rear surface 43b (surface of rear surface protective film 46). A recess 50 is formed in rear surface 43b as a portion of opening 46a, and the joining surface of rear surface side connection member 42 forms the bottom of recess 50. Front surface side connection member 11 protrudes from front surface 44a (surface of front surface protective film 9) by a protrusion height of H2 in semiconductor chip 44. Protrusion height H2 is greater than depth D2.

Front surface side connection member 11 of semiconductor chip 44 is joined to rear surface side connection member 42 of semiconductor chip 43. As a result of this, semiconductor chip 43 and semiconductor chip 44 are mechanically joined, and at the same time, are electrically connected. The joining surface (portion that joins to front surface side connection member 11 of semiconductor chip 44) of rear surface side connection member 42 of semiconductor chip 43 is within recess 50. A gap 18 within the recess is formed between front surface side connection member 11 and the inner sidewall of recess 50 (opening 46a).

Semiconductor chip 44 and semiconductor chip 45 are joined in the same manner as in the case of semiconductor chips 43 and 44.

This semiconductor device 41 can be manufactured according to the same method as that for the semiconductor device 1 shown in FIG. 1, FIG. 2(a) and FIG. 2(b). Rear surfaces 43b of semiconductor chips 43, 44 and 45 are held by suction by bonding tool 32, and thus, these semiconductor chips 43, 44 and 45 can be joined to solid-state device 2 and other semiconductor chips 43 and 44.

Figure 8:
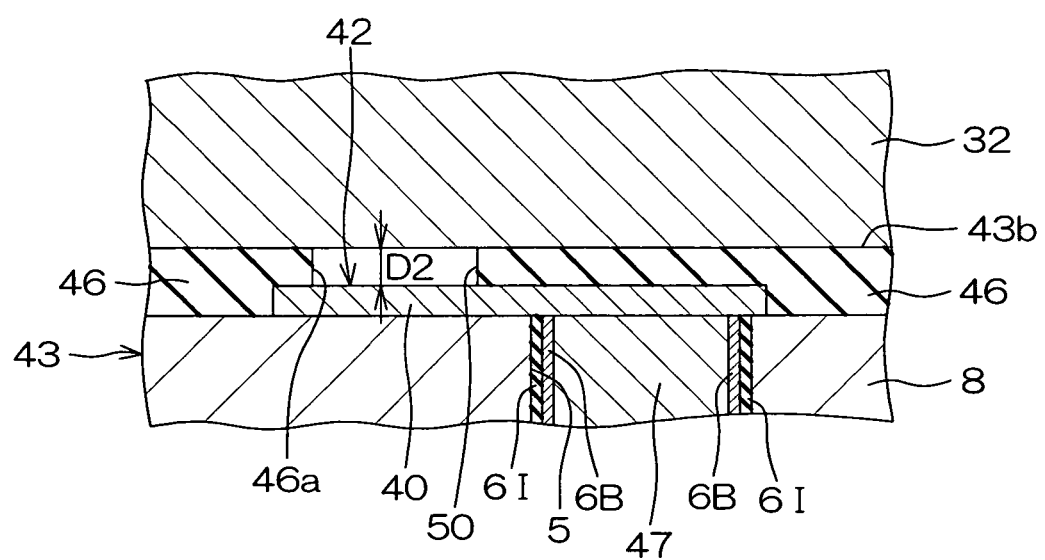
FIG. 8 is an illustrative cross-sectional diagram showing an area in the vicinity of a portion where a bonding tool and a semiconductor chip make contact with each other during the manufacturing process of the semiconductor device shown in FIG. 7(a) and FIG. 7(b)

FIG. 8 is an illustrative cross-sectional diagram showing an area in the vicinity of the portion where bonding tool 32 and semiconductor chip 43 make contact with each other in an enlarged manner.

The surface of bonding tool 32 that makes contact with semiconductor chip 43 and rear surface 43b of semiconductor chip 43 (surface of rear surface protective film 46) are flat, and therefore, almost the entirety of rear surface 43b of semiconductor chip 43 excluding the portion of opening of 46a makes contact with bonding tool 32. Therefore, the force that is applied to semiconductor chip 43 by bonding tool 32 is received almost evenly by the entirety of rear surface 43b of semiconductor chip 43.

In addition, the joining surface of rear surface side connection member 42 is located at depth D2 from rear surface 43b, and therefore, rear surface side connection member 42 does not make contact with bonding tool 32. Accordingly, the surface of rear surface side connection member 42 is not contaminated by making contact with bonding tool 32, and in addition, rear surface side connection member 42 is not deformed and two adjacent rear surface side connection members 42 are not electrically short-circuited.

Furthermore, since rear surface side connection member 42 is not deformed, in the case where an ultrasonic vibration is applied to semiconductor chips 43, 44 and 45 from bonding tool 32, this ultrasonic vibration is conveyed to the joining portions (portions where front surface side connection members 11 of semiconductor chips 43, 44 and 45 and solid-state device side connection members 13 of solid-state device 2 or rear surface side connection members 42 of semiconductor chips 43 and 44 make contact with each other, etc.) without attenuating to a great extent. As a result of this, front surface side connection members 11 of semiconductor chip 43 and 44 and solid-state device side connection members 13 of solid-state device 2 or rear surface side connection members 42 of semiconductor chip 43 are excellently joined.

Figure 9A:
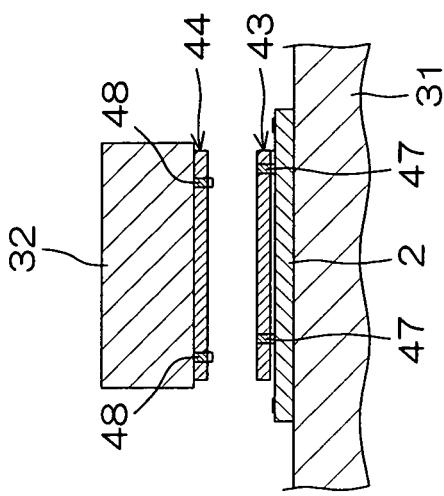
FIG. 9(a) and FIG. 9(b) are illustrative cross-sectional diagrams showing a portion where two semiconductor chips face each other during the manufacturing process for the semiconductor device shown in FIG. 7(a) and FIG. 7(b)
Figure 9B:
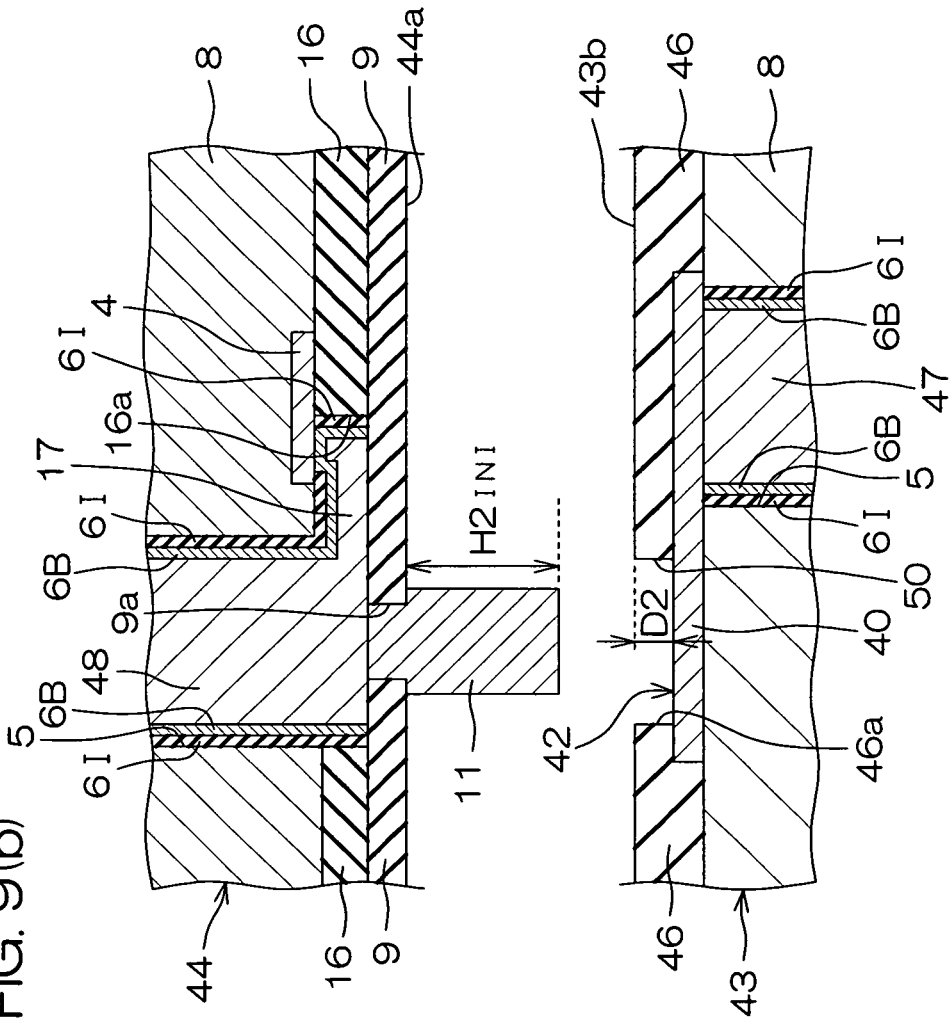

FIG. 9(a) and FIG. 9(b) are illustrative cross-sectional diagrams showing the state at the time when semiconductor chip 44 is joined to semiconductor chip 43 that has been joined to solid-state device 2. FIG. 9(a) shows the entirety of solid-state device 2 and semiconductor chips 43 and 44 while FIG. 9(b) shows a portion where rear surface 43b of semiconductor chip 43 and front surface 44a of semiconductor chip 44 face each other in an enlarged manner.

In reference to FIG. 9(b), protrusion height $H2_{INI}$ of front surface side connection member 11 from front surface 44a (surface of front surface protective film 9) before being joined to solid-state device 2 or semiconductor chip 43 is greater than protrusion height H2 (see FIG. 7(a) and FIG. 7(b)) of front surface side connection member 11 after being joined, and accordingly, is greater than depth D2 from rear surface 43b (surface of rear surface protective film 46) of the joining surface of rear surface side connection member 42.

As a result of positioning, the region occupied by front surface side connection member 11 is completely included within the region occupied by rear surface side connection member 42 (within recess 50) in a plan view where semiconductor chips 43 and 44 are viewed vertically from the top.

Subsequently, bonding tool 32 is lowered, and thereby, front surface side connection member 11 and rear surface side connection member 42 make contact with each other and are pressed against each other so as to be joined. At the time when rear surface side connection member 42 and front surface side connection member 11 are joined, an ultrasonic vibration is applied to the joining portion by bonding tool 32, if necessary. Thus, rear surface side connection member 42 of semiconductor chip 43 and front surface side connection member 11 of semiconductor chip 44 are excellently joined.

Figure 10:
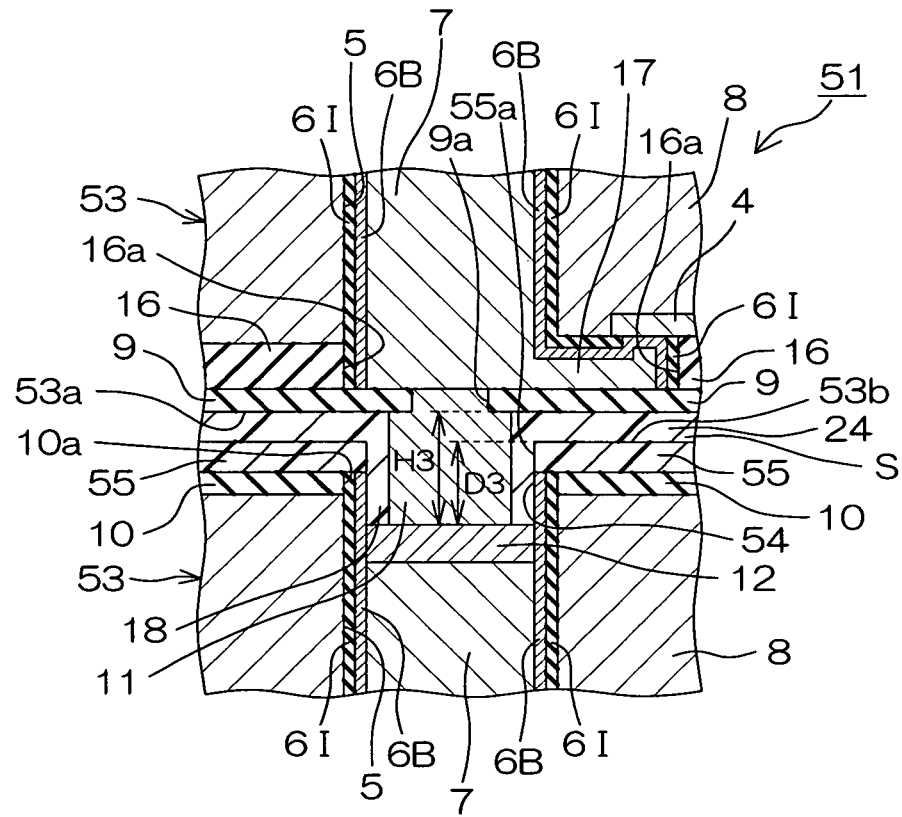
FIG. 10 is an illustrative cross-sectional diagram showing a semiconductor device according to the third embodiment of the present invention.

FIG. 10 is an illustrative cross-sectional diagram showing the structure of a semiconductor device according to the third embodiment of the present invention. In FIG. 10, the same reference symbols as those in FIG. 1, FIG. 2(a) and FIG. 2(b) are attached to parts that correspond to the respective parts shown in FIG. 1, FIG. 2(a) and FIG. 2(b), and descriptions thereof are omitted.

This semiconductor device 51 has a structure which is similar to that of semiconductor device 1 shown in FIG. 1, FIG. 2(a) and FIG. 2(b) and is provided with semiconductor chips 53 instead of semiconductor chips 3.

Semiconductor chip 53 has a structure which is similar to that of semiconductor chip 3 and a resin material layer 55 is formed on rear surface protective film 10. Although it is preferable for resin material layer 55 to be made of a fluorine resin (tetrafluoroethylene resin) or polyimide, resin material layer 55 may be made of an epoxy based resin, an acryl based resin, or the like. In addition, in the case where resin material layer 55 is made of a material having a high electrical insulation such as polyimide, rear surface protective film 10 may be substituted with resin material layer 55. That is, in such a case rear surface protective film 10 need not be additionally provided.

An opening 55a is formed in resin material layer 55 so as to approximately overlap opening 10a of rear surface protective film 10 in a plan view where semiconductor chip 53 is viewed vertically from the top. The front surface of resin material layer 55 is approximately flat except for the portion of opening 55a. The upper surface of rear surface side connection member 12 is a joining surface that is to be joined to another semiconductor chip 53. This joining surface is located at depth D3 from rear surface 53b (surface of resin material layer 55) of semiconductor chip 53 and a recess 54 is formed above rear surface side connection member 12.

Protrusion height H3 of front surface side connection member 11 from front surface 53a is greater than depth D3.

Such a semiconductor device 51 can be manufactured according to a method that is the same as the manufacturing method for semiconductor device 1 (see FIG. 3A to FIG. 3D) and semiconductor chip 53 can be held by bonding tool 32 and joined to solid-state device 2 or another semiconductor chip 53 that has been joined to solid-state device 2.

Figure 11:
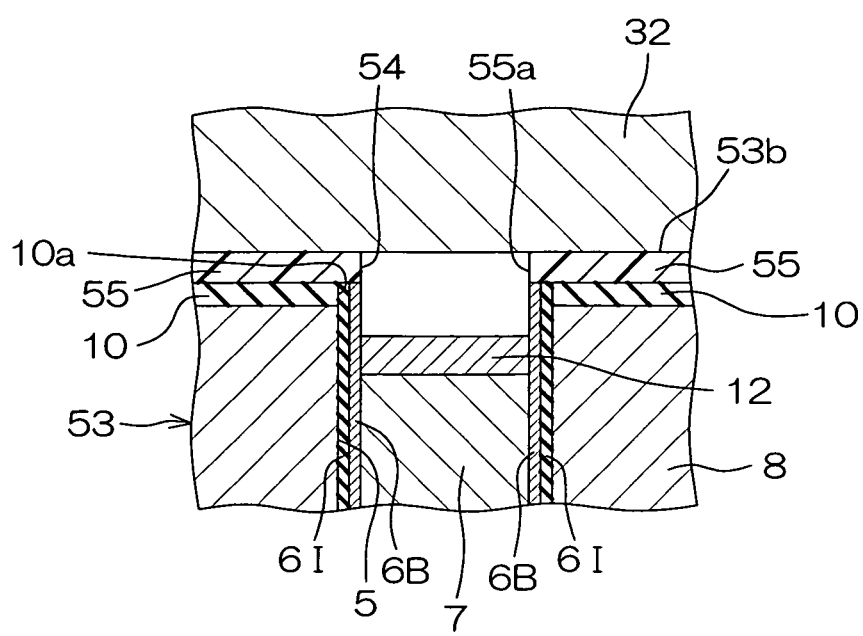
FIG. 11 is an illustrative cross-sectional diagram showing an area in the vicinity of a portion where a bonding tool and a semiconductor chip make contact with each other during the manufacturing process for the semiconductor device shown in FIG. 10.

FIG. 11 is an illustrative cross-sectional diagram showing an area in the vicinity of a portion where semiconductor chip 53 and bonding tool 32 make contact with each other.

Rear surface 53b of semiconductor chip 53 is held by suction by bonding tool 32 in a manner where resin material layer 55 and bonding tool 32 make contact with each other.

When an ultrasonic vibration is applied to semiconductor chip 53 from bonding tool 32 at the time of joining, there may be a case where bonding tool 32 and semiconductor chip 53 are shifted within the surface where they make contact with each other.

In the case where resin material layer 55 is not formed on rear surface 3b as in semiconductor chip 3 (see FIG. 2(b)) of semiconductor device 1, chip cracking may be generated in semiconductor chip 3 when bonding tool 32 and semiconductor chip 3 rub against each other as described above. In the case where rear surface protective film 10 is made of a fragile material such as silicon nitride or silicon oxide, such cracking occurs in rear surface protective film 10.

In addition, in the case where semiconductor substrate 8 is made of silicon, microscopic pieces of silicon (hereinafter referred to as "silicon dust") that have been generated during the manufacturing process (such as a scribing process) for semiconductor chip 3 and 53 or semiconductor device 1 and 51 may stick to bonding tool 32 or rear surface 3b or 53b of semiconductor chip 3 or 53. In such a case, silicon dust may intervene between bonding tool 32 and semiconductor chip 3 or 53 when semiconductor chip 3 or 53 is held by suction by bonding tool 32.

In the case where resin material layer 55 is not formed on rear surface 3b as in semiconductor chip 3, cracking may occur in the vicinity of rear surface 3b (for example, rear surface protective film 10) of semiconductor chip 3 due to silicon dust when force is applied to semiconductor chip 3 by bonding tool 32 in the state where such silicon dust intervenes.

Contrarily to this, resin material layer 55 is formed on rear surface 53b as in semiconductor chip 53, bonding tool 32 makes contact with this resin material layer 55 and does not make direct contact with a portion of semiconductor chip 53, such as rear surface protective film 10, which is made of a fragile material. Resin material layer 55 has elasticity and ductility, and therefore, cracking does not occur in semiconductor chip 53 (resin material layer 55 or rear surface protective film 10) even in the case where a shift occurs between bonding tool 32 and resin material layer 55.

In addition, even in the case where silicon dust intervenes between bonding tool 32 and semiconductor chip 53, resin material layer 55 in the vicinity of the silicon dust is deformed, and thereby, the local stress concentration is relieved, thus, preventing the occurrence of cracking in semiconductor chip 53.

Figure 12:
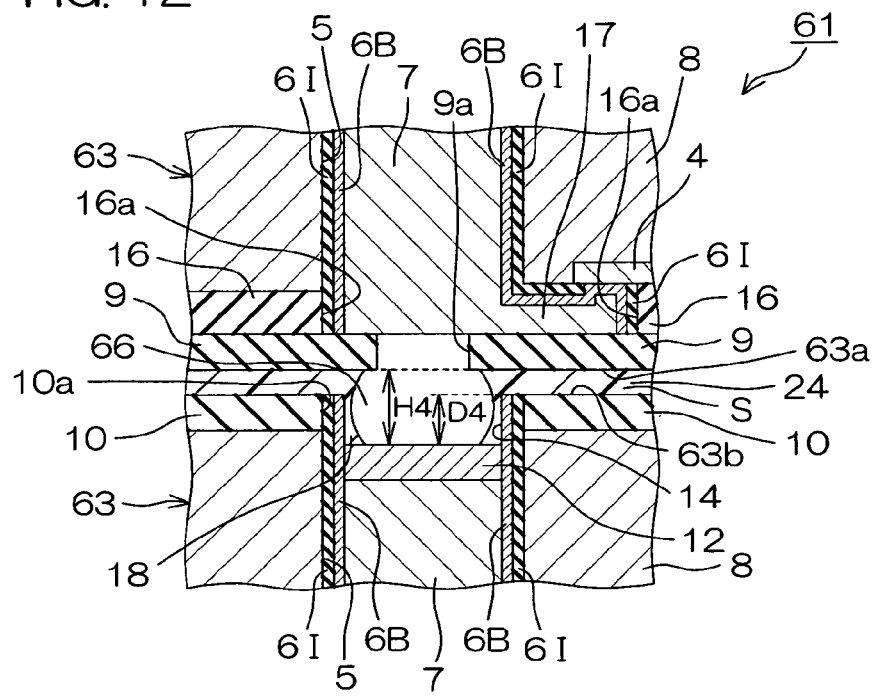
FIG. 12 is an illustrative cross-sectional diagram showing the structure of a semiconductor device according to the fourth embodiment of the present invention.

FIG. 12 is an illustrative cross-sectional diagram showing the structure of a semiconductor device according to the fourth embodiment of the present invention. In FIG. 12, the same reference symbols as those in FIG. 1, FIG. 2(a) and FIG. 2(b) are attached to parts that correspond to the respective parts shown in FIG. 1, FIG. 2(a) and FIG. 2(b) and overlapping descriptions thereof are omitted.

This semiconductor device 61 has a structure which is similar to that of semiconductor device 1 shown in FIG. 1, FIG. 2(a) and FIG. 2(b) and is provided with semiconductor chips 63 instead of semiconductor chips 3. Semiconductor chip 63 has a structure similar to that of semiconductor chip 3 and a front surface side connection member 66, which is a connection member in depressed spherical form, is provided to feedthrough electrode 7 instead of front surface side connection member 11 on the front surface 63a side. Front surface side connection member 66 is made of, for example, gold.

Protrusion height H4 of front surface side connection member 66 from front surface 63a (surface of front surface protective film 9) of semiconductor chip 63 is greater than depth D4 from rear surface 63b (surface of rear surface protective film 10) of the upper end surface (joining surface for joining to another semiconductor chip 63) of rear surface side connection member 12. Between two adjacent semiconductor chips 63, front surface side connection member 66 of one semiconductor chip 63 and rear surface side connection member 12 of the other semiconductor chip 63 are joined.

This semiconductor device 61 can be manufactured according to a method that is similar to a manufacturing method for semiconductor device 1 (see FIG. 3A to FIG. 3D).

Figure 13:
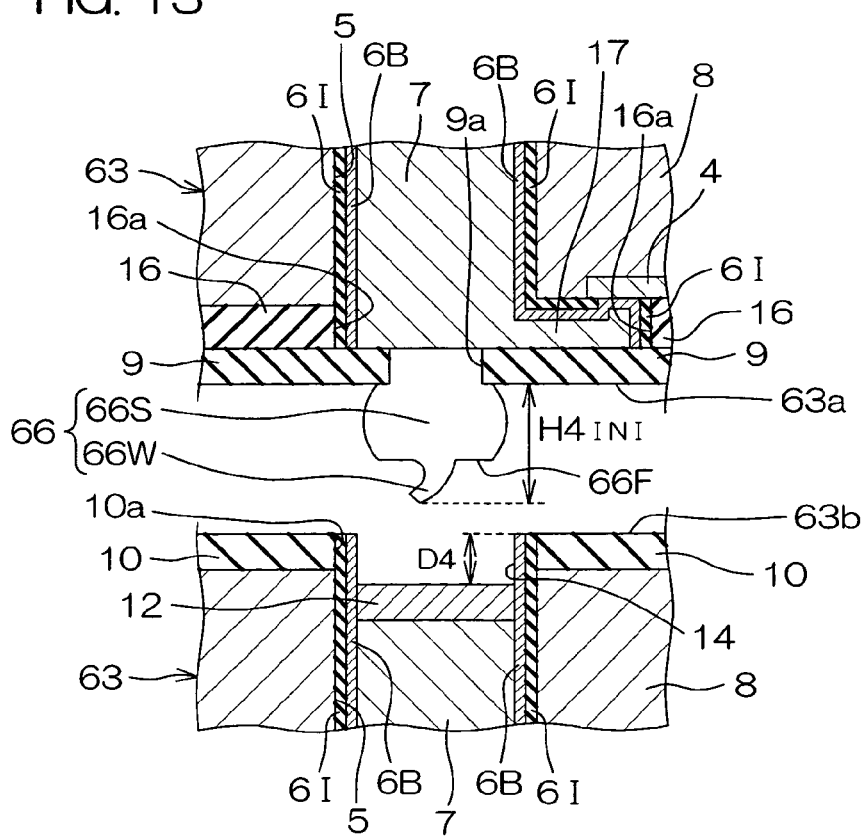
FIG. 13 is an illustrative cross-sectional diagram showing a portion where two semiconductor chips face each other during the manufacturing process for the semiconductor device shown in FIG. 12.

FIG. 13 is an illustrative cross-sectional diagram showing a manufacturing method for semiconductor device 61 and shows a portion where rear surface 63b of semiconductor chip 63 that has been joined to solid-state device 2 and front surface 63a of semiconductor chip 63 that has been held by bonding tool 32 face each other.

Front surface side connection member 66 is a so-called ball bump which is formed by using a wire bonding technique. The end of a depressed spherical portion 66S of front surface side connection member 66 before joining has a protrusion 66W in a short wire form of which the diameter is smaller than this spherical portion 66S. Height $H4_{INI}$ of the end of protrusion 66W from front surface 63a is greater than protrusion height H4 from front surface 63a of front surface side connection member 66 after joining. Spherical portion 66S has a flat surface 66F around the portion to which protrusion 66W is connected.

Front surface side connection member 66 in such a form can be formed according to the following method. First, a wire bonder with a capillary through which a bonding wire can be inserted is used where an appropriate length of a bonding wire (bonding wire made of gold in the case where front surface side connection member 66 is to be formed of gold) is made to protrude from the end of the capillary. Then this protruding portion of the bonding wire is melted by a torch into a ball form. The size of the portion of the ball form is adjusted so that the maximum width thereof becomes smaller than the width of recess 14 (opening 10a).

Subsequently, the capillary is moved so that this portion in ball form is pressed against and adhered to feedthrough electrode 7 on front surface 63a of semiconductor chip 63. At this time, the portion in ball form is pressed against the end of the capillary, and thereby, flat surface 66F is formed. Finally, the bonding wire is cut in the vicinity of the portion in ball form (spherical portion 66S), and thus, front surface side connection member 66 that has been joined to feedthrough electrode 7 is obtained. The bonding wire that has remained on the spherical portion 66S side after being cut becomes protrusion 66W.

At the time when front surface side connection member 66 and rear surface side connection member 12 are joined, protrusion 66W at the end of front surface side connection member 66 is initially pressed against rear surface side connection member 12. Protrusion 66W in wire form can be easily deformed so as to absorb the applied force. As a result of this, stress concentration on rear surface side connection member 12 and an area in the vicinity thereof can be prevented, and thus, the occurrence of chip cracking, in particular, cracking in insulating film 6I and in barrier metal layer 6B (breakdown of the feedthrough electrode structure) can be prevented.

Figure 14:
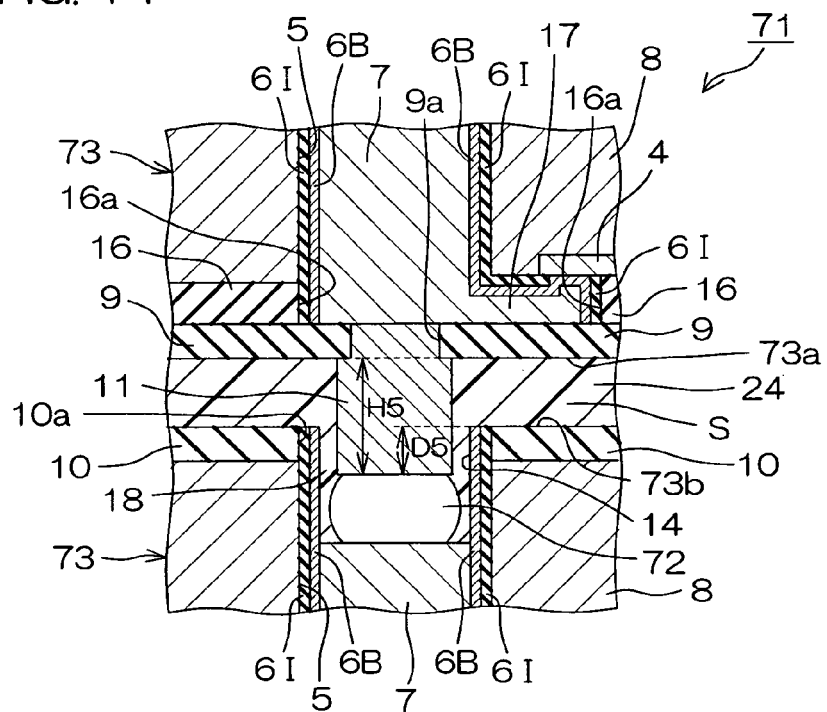
FIG. 14 is an illustrative cross-sectional diagram showing the structure of a semiconductor device according to the fifth embodiment of the present invention.

FIG. 14 is an illustrative cross-sectional diagram showing the structure of a semiconductor device according to the fifth embodiment of the present invention. In FIG. 14, the same reference symbols as those in FIG. 1, FIG. 2(a) and FIG. 2(b) are attached to parts that correspond to the respective parts shown in FIG. 1, FIG. 2(a) and FIG. 2(b) and overlapping descriptions thereof are omitted.

This semiconductor device 71 has a structure which is similar to that of semiconductor device 1 shown in FIG. 1, FIG. 2(a) and FIG. 2(b) and is provided with semiconductor chips 73 instead of semiconductor chips 3. Semiconductor chip 73 has a structure similar to that of semiconductor chip 3 and a rear surface side connection member 72, which is a connection member in depressed spherical form, is provided to feedthrough electrode 7 instead of rear surface side connection member 12 on the rear surface 73b side of semiconductor chip 73.

That is, front surface side connection member 66 which is a connection member in spherical form is provided on the front surface 63a side of semiconductor chip 63 in semiconductor device 61 shown in FIG. 12 and FIG. 13, while rear surface side connection member 72 which is a connection member in spherical form is provided on the rear surface 73*b* side of semiconductor chip 73 in the above-described semiconductor device 71.

The width of rear surface side connection member 72 is smaller than the width of recess 14, and rear surface side connection member 72 is placed so as to provide a gap between rear surface side connection member 72 and the inner sidewall of recess 14.

Rear surface side connection member 72 is placed within through hole 5 (within recess 14 above feedthrough electrode 7) and the top surface of rear surface side connection member 72 is a joining surface for joining to another semiconductor chip 73. This joining surface is located at depth D5 from rear surface 73*b* of semiconductor chip 73. Protrusion height H5 of front surface side connection member 11 from front surface 73*a* (surface of front surface protective film 9) is greater than depth D5 from rear surface 73*b* (surface of rear surface protective film 10) of the joining surface of rear surface side connection member 72. Between two adjacent semiconductor chips 73, front surface side connection member 11 of one semiconductor chip 73 and rear surface side connection member 72 of the other semiconductor chip 73 are joined.

Such a semiconductor device 71 can be manufactured according to a method which is similar to the manufacturing method for semiconductor device 61 (see FIG. 13).

Figure 15:
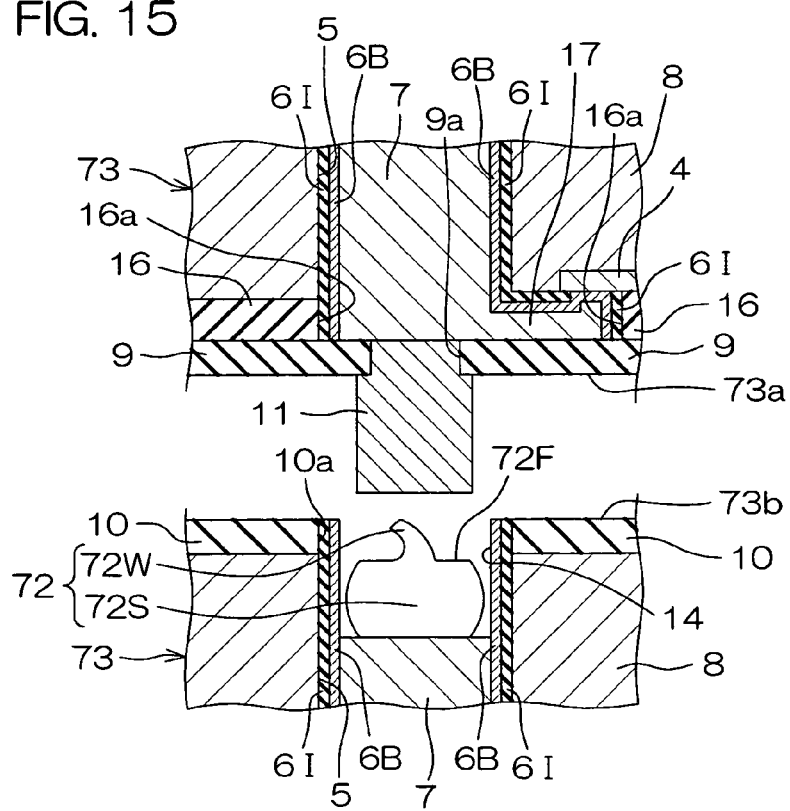
FIG. 15 is an illustrative cross-sectional diagram showing a portion where two semiconductor chips face each other during the manufacturing process for the semiconductor device shown in FIG. 14.

FIG. 15 is an illustrative cross-sectional diagram showing a manufacturing method for semiconductor device 71 and shows a portion where rear surface 73*b* of semiconductor chip 73 on the solid-state device 2 side and front surface 73*a* of semiconductor chip 73 that has been held by bonding tool 32 face each other.

Rear surface side connection member 72 is a so-called ball bump that is formed by using a wire bonding technique. The end of a depressed spherical portion 72S of rear surface side connection member 72 before joining has a protrusion 72W in a short wire form of which the diameter is smaller than that of this spherical portion. The end of rear surface side connection member 72 (protrusion 72W) is located approximately on the plane that includes rear surface 73*b*. Spherical portion 72S has a flat surface 72F around the portion to which protrusion 72W is connected.

Rear surface side connection member 72 in such a form can be manufactured according to the same method as that for front surface side connection member 66 of semiconductor device 61 (see FIG. 13). Here, it is necessary to place spherical portion 72S within recess 14, and therefore, it is necessary for both the width of the capillary and the maximum width of spherical portion 72S to be smaller than the width of recess 14.

At the time when front surface side connection member 11 and rear surface side connection member 72 are joined, protrusion 72W at the end of rear surface side connection member 72 is initially pressed against front surface side connection member 11. Protrusion 72W in wire form can be easily deformed so as to absorb the applied force. Protrusion 72W is sufficiently small in comparison to the width of recess 14, and therefore, can be deformed without being restricted by the inner sidewall of recess 14. In addition, spherical portion 72S is placed so as to provide a gap between spherical portion 72S and the inner sidewall of recess 14, and thereby, spherical portion 72S is also easily deformed in comparison with rear surface side connection member 12 (see FIG. 2(*b*) and FIG. 5).

As described above, even in the case where rear surface side connection member 72 is deformed more easily than front surface side connection member 11, the stress concentration on rear surface side connection member 72 and an area in the vicinity thereof can be prevented and the generation of chip cracking, in particular, cracking in insulating film 6I and barrier metal layer 6B (breakdown of the feedthrough electrode structure) can be prevented.

FIG. 16(*a*) and FIG. 16(*b*) are illustrative cross-sectional diagrams showing the structure of a semiconductor device according to the sixth embodiment of the present invention. In FIG. 16(*a*) and FIG. 16(*b*), the same reference symbols as those in FIG. 1, FIG. 2(*a*) and FIG. 2(*b*) are attached to parts that correspond to the respective parts shown in FIG. 1, FIG. 2(*a*) and FIG. 2(*b*) and overlapping descriptions thereof are omitted.

This semiconductor device 81 has a structure which is similar to that of semiconductor device 1 shown in FIG. 1, FIG. 2(*a*) and FIG. 2(*b*) and is provided with semiconductor chips 83 instead of semiconductor chips 3. FIG. 16(*a*) shows the entire structure of semiconductor device 81 and FIG. 16(*b*) shows a portion where two adjacent semiconductor chips 83 are joined.

In reference to FIG. 16(*b*), semiconductor chip 83 has a structure which is similar to that of semiconductor chip 3 and is provided with front surface side connection member 86 instead of front surface side connection member 11. Front surface side connection member 86 includes a solder portion 86S made of a solder material of which the solidus temperature (melting point) is in a range from 60° C. to 370° C. and a high melting point metal portion 86H made of a metal of which the solidus temperature is higher than that of solder portion 86S (for example, a high melting point metal such as copper). High melting point metal portion 86H is connected to feedthrough electrode 7 via opening 9*a* of front surface protective film 9, has an external form which is in pillar form, and protrudes from front surface 83*a* (surface of front surface protective film 9) of semiconductor chip 83.

Between two adjacent semiconductor chips 83, high melting point metal portion 86H of one semiconductor chip 83 and rear surface side connection member 12 of the other semiconductor chip 83 are joined (connected) via solder portion 86S which has been placed therebetween. Solder portion 86S makes contact with the end surface of high melting point metal portion 86H as well as the sides in the vicinity thereof and approximately the entirety of the surface of rear surface side connection member 12.

Semiconductor device 81 is further provided with a semiconductor chip (hereinafter referred to as "top layer chip") 83U which has a structure similar to that of semiconductor chip 15 instead of semiconductor chip 15 (see FIG. 1) of semiconductor device 1 (see FIG. 16(*a*)). Top layer chip 83U has the same structure as that of semiconductor chip 83 except that top layer chip 83U is not provided with through hole 5 and feedthrough electrode 7 and is provided with a front surface side connection member 86 where a solder portion 86S is formed at the end. Rear surface side connection member 12 of semiconductor chip 83 and high melting point metal portion 86H of top layer chip 83U are joined (connected) via solder portion 86S between semiconductor chip 83 and top layer chip 83U.

This semiconductor device 81 can be manufactured as described below.

Figure 17A:
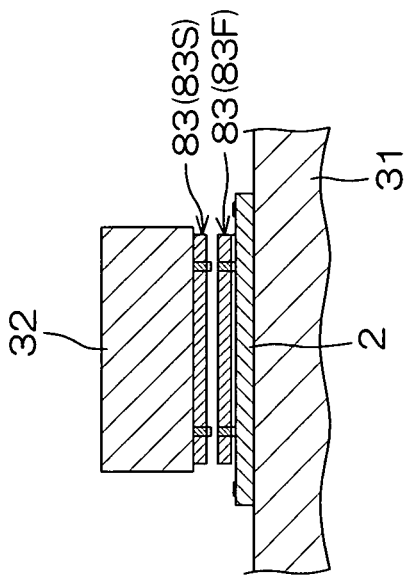
FIG. 17(a) and FIG. 17(b) are illustrative cross-sectional diagrams showing a portion where two semiconductor chips face each other during the manufacturing process for the semiconductor device shown in FIG. 16(a) and FIG. 16(b)
Figure 17B:
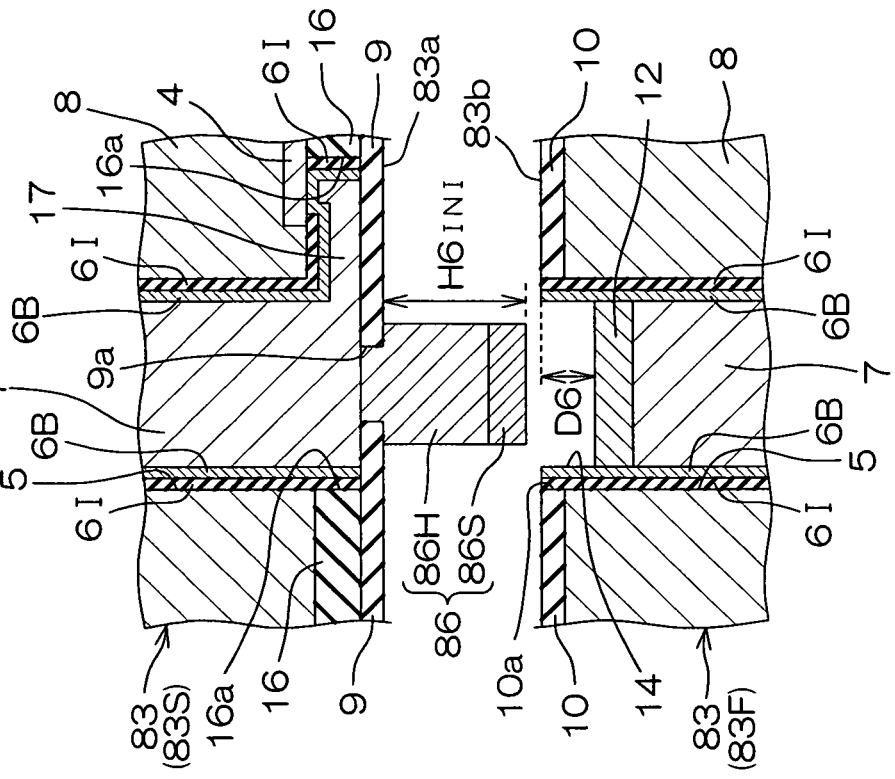

FIG. 17(*a*) and FIG. 17(*b*) are illustrative cross-sectional diagrams showing a manufacturing method for semiconductor device 81 and show first and second semiconductor chips 83 (hereinafter respectively referred to as "first semiconductor chip 83F" and "second semiconductor chip 83S") which are placed facing each other. FIG. 17(*a*) shows the entirety of solid-state device 2, as well as first and second semiconductor chips 83F and 83S, while FIG. 17(*b*) shows a portion where rear surface 83*b* of first semiconductor chip 83F and front surface 83*a* of second semiconductor chip 83S which has been held by bonding tool 32 face each other in an enlarged manner.

First, in the same manner as in the manufacturing method for semiconductor device 1, solid-state device 2 is placed on bonding stage 31 (see FIG. 17(*a*)). Then, first semiconductor chip 83 (first semiconductor chip 83F) is held in a state where rear surface 83*b* thereof is held by suction by bonding tool 32. A heater is incorporated inside bonding tool 32 in the vicinity of the surface to which semiconductor chip 83 is held by suction. At the time when first semiconductor chip 83F is held by suction no heat is applied by the heater.

Next, bonding tool 32 is moved so that front surface 83*a* of first semiconductor chip 83F and front surface 2*a* of solid-state device 2 that has been placed on bonding stage 31 are made to face each other. Subsequently, solid-state device side connection member 13 and corresponding front surface side connection member 86 of first semiconductor chip 83F are positioned relative to each other.

First semiconductor chip 83F in this state is lowered by bonding tool 32 so that first semiconductor chip 83F is temporarily placed on solid-state device 2. At this time, almost no load is applied to first semiconductor chip 83F.

Subsequently, another semiconductor chip 83 (second semiconductor chip 83S) is held by bonding tool 32 and is made to face first semiconductor chip 83F that has been temporarily placed on solid-state device 2.

In reference to FIG. 17(*b*), solder portion 86S is formed in film form on the end surface of high melting point metal portion 86H in front surface side connection member 86 before joining. The volume of recess 14 above feedthrough electrode 7 is sufficiently greater than the volume of the melt that is caused by melting of solder portion 86S on rear surface 83*b* of semiconductor chip 83.

Protrusion height $H6_{INI}$ of front surface side connection member 86 from front surface 83*a* (surface of front surface protective film 9) is greater than depth D6 from rear surface 83*b* (surface of rear surface protective film 10) of rear surface side connection member 12 in semiconductor chip 83 before joining. The region occupied by front surface side connection member 86 has the sizes that can be included in the region occupied by rear surface side connection member 12 (recess 14) in a plan view where semiconductor chips 83 are viewed vertically from the top. As a result of positioning, the region occupied by front surface side connection member 86 is completely included within the region occupied by rear surface side connection member 12 in this plan view.

Second semiconductor chip 83S in this state is lowered by bonding tool 32 and second semiconductor chip 83S is temporarily placed on top of first semiconductor chip 83F that has been temporarily placed on solid-state device 2. Front surface side connection member 86 of second semiconductor chip 83S makes contact with rear surface side connection member 12 of first semiconductor chip 83F.

In the same manner, a third semiconductor chip (hereinafter, referred to as "third semiconductor chip") 83 is temporarily placed on second semiconductor chip 83S. In the case where any semiconductor chip 83 is temporarily placed, no heat is applied by the heater of bonding tool 32 and almost no load is applied to semiconductor chip 83.

Prior to semiconductor chip 83 being temporarily placed on solid-state device 2 or another semiconductor chip 83, a flux may be transferred to the end of front surface side connection member 86. In this case, front surface side connection member 86 can be temporarily secured to solid-state device side connection member 13 or rear surface side connection member 12 by means of adhesion of the flux.

After that, top layer chip 83U, semiconductor chips 83 and solid-state device 2 are collectively joined.

FIG. 18 is an illustrative cross-sectional diagram showing a method for joining top layer chip 83U, semiconductor chips 83 and solid-state device 2 to each other.

First, top layer chip 83U is held by bonding tool 32 in the same manner as in the case of semiconductor chip 83. Subsequently, top layer chip 83U is heated to a temperature which is not lower than the solidus temperature of solder portion 86S and which is not higher than the solidus temperature of high melting point metal portion 86H by means of heater H that has been incorporated inside bonding tool 32. As a result of this, solder portion 86S of top layer chip 83U is melted, thus generating melt.

In this state, bonding tool 32 is moved so that front surface side connection member 86 of top layer chip 83U and rear surface side connection member 12 of third semiconductor chip 83T make contact with each other and a state is obtained where the melt of solder portion 86S intervenes between this rear surface side connection member 12 and high melting point metal portion 86H of top layer chip 83U.

In addition, heat from bonding tool 32 is conveyed to third, second and first semiconductor chips 83T, 83S and 83F and melt is also generated from solder portions 86S of respective semiconductor chips 83. As a result of this, a state is obtained where melt of solder portions 86S intervenes between rear surface side connection member 12 and high melting point metal portion 86H of each pair of two adjacent semiconductor chips 83 as well as between solid-state device side connection member 13 of solid-state device 2 and high melting point metal portion 86H of first semiconductor chip 83F. The volume of recess 14 above feedthrough electrode 7 is sufficiently greater than the volume of the melt of solder portion 86S, and thereby, the melt of solder portion 86S does not overflow from recess 14.

Heating by bonding tool 32 is completed after the heating has continued for a predetermined period of time. As a result of this, the melt of solder portion 86S is solidified, and thus, solid-state device side connection member 13 and rear surface side connection member 12 are joined to high melting point metal portion 86H by means of solder portion 86S.

In the case where the volume of solder portion 86S is small, in the case where the joining temperature is high or in the case where the joining time is long, solder portion 86S disappears as a result of formation of an alloy with solid-state device side connection member 13, rear surface side connection member 12 and high melting point metal portion 86H. In such a case, solid-state device side connection member 13 and rear surface side connection member 12 are joined to high melting point metal portion 86H by means of an alloy layer which is formed of metal atoms that form solder portion 86S, metal atoms that form solid-state device side connection member 13 or rear surface side connection member 12 and metal atoms that form high melting point metal portion 86H.

As described above, solid-state device side connection member 13 and rear surface side connection member 12 are joined to high melting point metal portion 86H by the melting and solidification of solder portion 86S, and therefore, it is not necessary to apply pressure to semiconductor chips 83 and top layer chip 83U at the time of joining. Accordingly, it becomes furthermore difficult for chip cracking to occur in comparison with the case (see, for example, FIG. 3B and FIG. 3D) where solid-state device side connection member 13 and rear surface side connection member 12 or 72 are joined to front surface side connection member 11 or 66 by applying pressure.

A heater may be incorporated inside bonding stage 31, and in this case, heat may be additionally applied by bonding stage 31 simultaneously with the heating by means of heater H of bonding tool 32.

In addition, in the case where solder portion 86S of a semiconductor chip 83 which is located below top layer chip 83U is not sufficiently melted merely by applying heat via top layer chip 83U, heat may be applied to each of these semiconductor chips 83 and top layer chip 83U every time when each semiconductor chip 83 or top layer chip 83U is joined.

Furthermore, joining (melting of solder portion 86S) of solid-state device 2, semiconductor chips 83 and top layer chip 83U to each other may be collectively carried out by means of heating in an oven or a reflow furnace after all semiconductor chips 83 and top layer chip 83U are stacked and temporarily placed on solid-state device 2. In such a case, only the weight of semiconductor chips 83 and top layer chip 83U which are located above a joining portion is applied to this joining portion at the time when solid-state device side connection member 13 and rear surface side connection member 12 are joined to front surface side connection member 86.

After this, the steps following the joining of solid-state device 2 and wiring substrate 21 to each other are carried out in the same manner as in the manufacturing method for semiconductor device 1, and thereby, semiconductor device 81 shown in FIG. 16(*a*) is obtained.

Figure 19B:
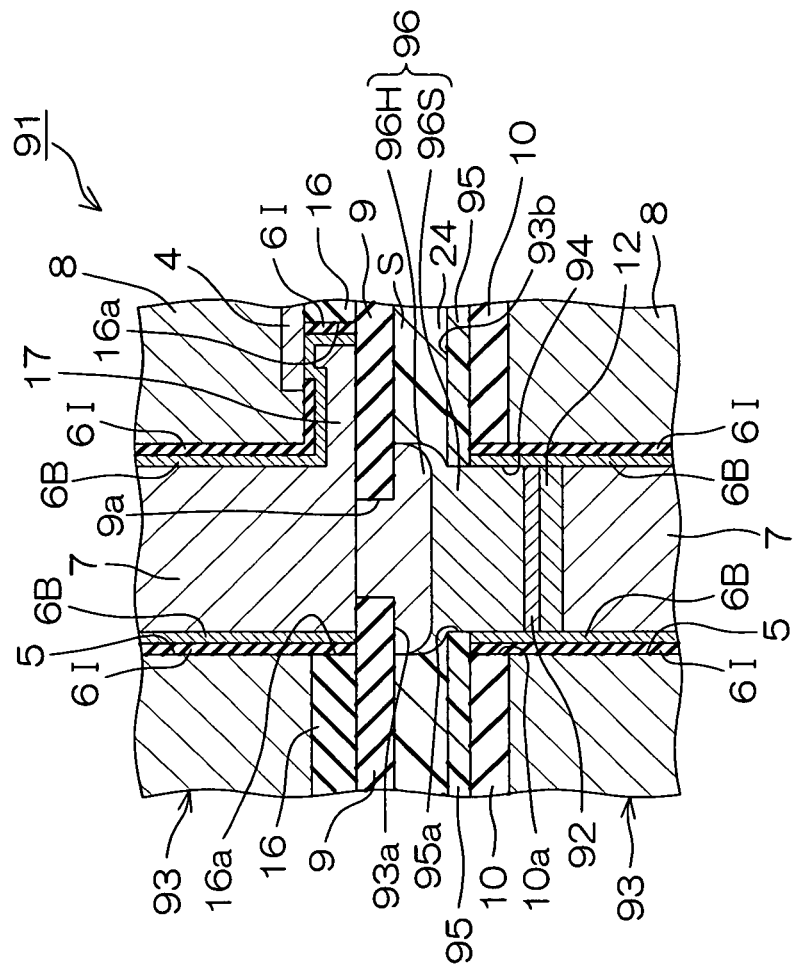
FIG. 19(a) and FIG. 19(b) are illustrative cross-sectional diagrams showing the structure of a semiconductor device according to the seventh embodiment of the present invention.
Figure 19A:
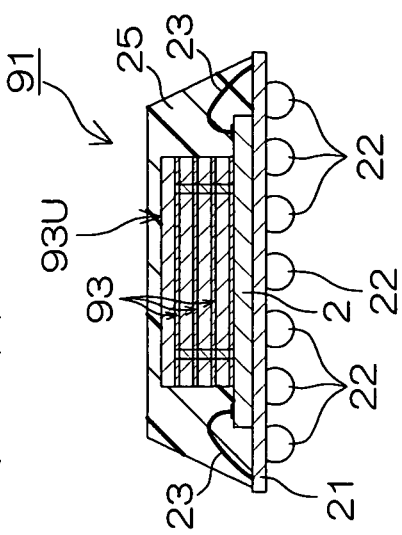

FIG. 19(*a*) and FIG. 19(*b*) are illustrative cross-sectional diagrams showing the structure of a semiconductor device according to the seventh embodiment of the present invention.

This semiconductor device 91 has a structure that is similar to that of semiconductor device 81 shown in FIG. 16(*a*) and FIG. 16(*b*), and is provided with semiconductor chips 93 instead of semiconductor chips 83. Semiconductor chip 93 has a structure which is similar to that of semiconductor chip 83, and is provided with a front surface side connection member 96 instead of front surface side connection member 86.

Front surface side connection member 96 includes a solder portion 96S made of a solder material of which the solidus temperature is in a range from 60° C. to 370° C., and a high melting point metal portion 96H of which the solidus temperature is higher than that of solder portion 96S. High melting point metal portion 96H is connected to feedthrough electrode 7 via opening 9*a* of front surface protective film 9, and protrudes from front surface 93*a* (surface of front surface protective film 9) of semiconductor chip 93.

High melting point metal portion 96H has an external form in a mushroom form where the width spreads to a great extent outside of opening 9*a* in comparison with in opening 9*a*. A recess 94 is formed above feedthrough electrode 7 (rear surface side connection member 12) on the rear surface 93*b* side of semiconductor chip 93. The region occupied by high melting point metal portion 96H is greater than the region occupied by recess 94 or rear surface side connection member 12 in a plan view where semiconductor chips 93 are viewed vertically from the top.

A solder resist 95 is formed on the rear surface 93*b* side (on rear surface protective film 10) of semiconductor chip 93.

Between two adjacent semiconductor chips 93, solder portion 96S intervenes between high melting point metal portion 96H of one semiconductor chip 93 and rear surface side connection member 12 of the other semiconductor chip 93. Furthermore, an alloy layer 92 which includes metal atoms that form solder portion 96S and metal atoms that form rear surface side connection member 12 is formed between solder portion 96S and rear surface side connection member 12. High melting point metal portion 96H and rear surface side connection member are joined (connected) to each other via solder portion 96S and alloy layer 92.

The inside of recess 94 is filled in almost full with alloy layer 92 and solder portion 96S. Solder portion 96S slightly spreads to the outside of recess 94 so as to cover the surface of high melting point metal portion 96H.

In addition, semiconductor device 91 is provided with top layer chip 93U (see FIG. 19(*a*)) that corresponds to top layer chip 83U (see FIG. 16(*a*)) of semiconductor device 81. Top layer chip 93U has a structure which is the same as that of semiconductor chip 93, except that top layer chip 93U is not provided with through hole 5 and feedthrough electrode 7, and is provided with front surface side connection member 96 where solder portion 96S is formed at the end.

This semiconductor device 91 can be manufactured according to a method which is the same as the manufacturing method for semiconductor device 81 (see FIG. 17(*a*) and FIG. 17(*b*)). Solid-state device side connection member 13 and rear surface side connection member 12 can be joined to front surface side connection member 96 by the melting and solidification of solder portion 96S.

FIG. 20(*a*) and FIG. 20(*b*) are illustrative cross-sectional diagrams showing a manufacturing method for semiconductor device 91. FIG. 20(*a*) and FIG. 20(*b*) show semiconductor chip 93 (hereinafter referred to as "first semiconductor chip 93F") which is temporarily placed on solid-state device 2, and semiconductor chip 93 (hereinafter referred to as "second semiconductor chip 93S") which is held by bonding tool 32 so as to face first semiconductor chip 93F.

FIG. 20(*a*) shows the entirety of solid-state device 2, as well as first and second semiconductor chips 93F and 93S, while FIG. 20(*b*) shows a portion where rear surface 93*b* of first semiconductor chip 93F and front surface 93*a* of second semiconductor chip 93S that has been held by bonding tool 32 face each other in an enlarged manner.

In reference to FIG. 20(*b*), in front surface side connection member 96 before being joined to solid-state device side connection member 13 or rear surface side connection member 12, solder portion 96S has a hemispherical form that protrudes from front surface 93*a*, and is connected to high melting point metal portion 96H. The region occupied by solder portion 96S approximately overlaps the region occupied by high melting point metal portion 96H in a plan view where semiconductor chips 93 are viewed vertically from the top. Accordingly, the region occupied by solder portion 96S is greater than the region occupied by recess 94 in this plan view.

The upper surface of rear surface side connection member 12 is a joining surface for joining to another semiconductor chip. This joining surface is located at depth D7 from rear surface 93*b*. The volume of solder portion 96S is slightly greater than the volume of recess 94. Protrusion height $H7_{INI}$ of front surface side connection member 96 from front surface 93*a* may be smaller than depth D7, as long as the above condition is satisfied.

After rear surface side connection member 12 of first semiconductor chip 93F and front surface side connection member 96 of second semiconductor chip 93S have been positioned relative to each other, bonding tool 32 is lowered, so that second semiconductor chip 93S is temporarily placed on top of first semiconductor chip 93F. At this time, pressure is not applied to semiconductor chip 93 by bonding tool 32, and a state is obtained where the end portion of front surface side connection member 96 (solder portion 96S) of second semiconductor chip 93S is inserted into recess 94 of first semiconductor chip 93F.

In the same manner, another semiconductor chip (hereinafter referred to as "third semiconductor chip") 93 is temporarily placed on top of second semiconductor chip 93S that has been temporarily placed on first semiconductor chip 93F.

Next, in the same manner as in the manufacturing method for semiconductor device 81 (see FIG. 18), top layer chip 93U is held by bonding tool 32, and solder portions 96S of top layer chip 93U and semiconductor chips 93 are melted by means of heat applied by bonding tool 32, and thus, solid-state device 2, semiconductor chips 93 and top layer chip 93U are joined.

Solder portion 96S gains fluidity when it is melted, and easily flows into recess 94 even if only slight force is applied. Accordingly, at this time, edge portions of recess 94 (such as of rear surface protective film 10) are not damaged.

Although the melt of solder portion 96S slightly overflows from recess 94, the melt of solder portion 96S that has overflowed from recess 94 does not get wet to and spread over rear surface 93b of semiconductor chip 93 because of the formation of solder resist 95 on the rear surface 93b side of semiconductor chip 93.

In addition, high melting point metal portion 96H does not enter recess 94, and makes contact with solder resist 95 on the edge portions of recess 94. As a result of this, the gap between rear surface 93b of semiconductor chip 93 and front surface 93a of another semiconductor chip 93 or the top layer chip is regulated so as to be greater than the predetermined size. Therefore, the melt of solder portion 96S that has overflowed from recess 94 does not make contact with front surface 93a of semiconductor chip 93 or the top layer chip that is located above the melt, and the melt of solder portion 96S does not spread over this front surface 93a.

In the case where there is a risk that the melt of solder portion 96S may reach front surface 93a, solder resist 95 may be also provided on the front surface 93a side. In this manner, solder resist 95 is provided on rear surface 93b (and front surface 93a, if necessary) of semiconductor chip 93, and thereby, a state where solder portion 96S after solidification spreads in directions along rear surface 93b can be prevented, and therefore, reduction in the pitch of front surface side connection members 96 (feedthrough electrodes 7) can be achieved.

The melt of solder portion 96S makes contact with rear surface side connection member 12, and thereby, alloy layer 92 is formed between solder portion 96S and rear surface side connection member 12. In the same manner, an alloy layer is formed between solid-state device side connection member 13 and solder portion 96S. Furthermore, an alloy layer (not shown) is formed between high melting point metal portion 96 and solder portion 96S.

Application of heat by bonding tool 32 is completed after it has been continued for a predetermined period of time. As a result of this, the melt of solder portion 96S is solidified, and solid-state device side connection member 13 and high melting point metal portion 96H, as well as rear surface side connection member 12 and high melting point metal portion 96H, are joined, respectively, by means of solder portion 96S.

In the case where solder portion 96S is made of a metal that is easily deformed (such as indium (In) or eutectic solder of tin (Sn) and lead (Pb)) in the above-described embodiments, solder portion 96S may be deformed as it is pushed into recess 94 by means of application of pressure by bonding tool 32 at the time when another semiconductor chip 93 or top layer chip 93U is temporarily placed on semiconductor chip 93. As a result of this, solder portion 96S becomes a state where it is caulked with recess 94 so that it becomes difficult for semiconductor chips 93 or the top layer chip to shift relative to each other.

Figure 21:
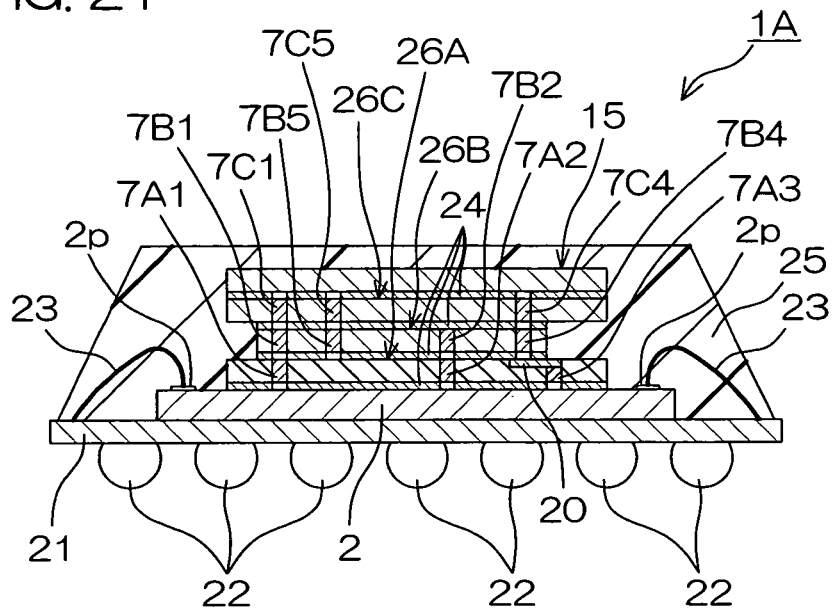
FIG. 21 is an illustrative cross-sectional diagram showing the structure of a semiconductor device according to the eighth embodiment of the present invention.

FIG. 21 is an illustrative cross-sectional diagram showing the structure of a semiconductor device according to the eighth embodiment of the present invention. In FIG. 21, the same reference symbols as those in FIG. 1 are attached to parts that correspond to the respective parts shown in FIG. 1, and descriptions thereof are omitted.

This semiconductor device 1A has a BGA type package form and a multi-chip stack structure. Four semiconductor chips 26A to 26C and 15 are sequentially stacked on solid-state device 2, starting from the solid-state device 2 side. Semiconductor chips 26A to 26C and 15 are joined in a so-called face-down style, where the front surfaces (surfaces where functional elements are formed) of all the chips 26A to 26C and 15 are made to face the solid-state device 2 side.

Semiconductor chips 26A to 26C have a structure which is the same as that of semiconductor chip 3 (see FIG. 2(a) and FIG. 2(b)), except for the arrangement of feedthrough electrodes 7. Semiconductor chips 26A, 26C and 15 have approximately the same form and size, and are placed so as to approximately overlap each other in a plan view where semiconductor chips 26A, 26C and 15 are viewed vertically from the top. Meanwhile, semiconductor chip 26B is smaller than semiconductor chips 26A, 26C and 15 in a plan view where semiconductor chips 26A to 26C and 15 are viewed vertically from the top.

Semiconductor chip 26A is provided with three feedthrough electrodes 7A1, 7A2 and 7A3, semiconductor chip 26B is provided with four feedthrough electrodes 7B1, 7B2, 7B4 and 7B5, and semiconductor chip 26C is provided with three feedthrough electrodes 7C1, 7C4 and 7C5.

Feedthrough electrodes 7A1, 7B1 and 7C1 are arranged so as to approximately overlap (correspond to) each other, feedthrough electrodes 7A2 and 7B2 are arranged so as to approximately overlap each other, feedthrough electrodes 7B4 and 7C4 are arranged so as to approximately overlap each other, and feedthrough electrodes 7B5 and 7C5 are arranged so as to approximately overlap each other, in a plan view where semiconductor chips 26A to 26C are viewed vertically from the top.

In each pair of adjacent semiconductor chips 26A to 26C, the corresponding feedthrough electrodes are joined via a front surface side connection member 11 and a rear surface side connection member 12 (see FIG. 2(a)), in the same manner as in semiconductor device 1.

On the other hand, feedthrough electrodes are not provided in positions of semiconductor chip 26C that correspond to feedthrough electrodes 7A2 and 7B2 of semiconductor chips 26A and 26B (that overlap in a plan view where semiconductor chips 26A to 26C are viewed vertically from the top), and feedthrough electrodes are not provided in positions of semiconductor chip 26A that respectively correspond to feedthrough electrodes 7B4 and 7C4, as well as feedthrough electrodes 7B5 and 7C5, of semiconductor chips 26B and 26C. Feedthrough electrode 7B4 and feedthrough electrode 7A3 are electrically connected by means of a wire 20 that is provided on the rear surface (surface where a functional element is not formed) of semiconductor chip 26A.

As described above, it is not necessary for all semiconductor chips 26A to 26C to be provided with feedthrough electrodes in positions that correspond to each other.

In the case where semiconductor chips 26A and 26B are easily warped, dummy front surface side connection members 11D (see FIG. 6(a) to FIG. 6(c)) may be provided in positions on the front surfaces of semiconductor chips 26A and 26B that correspond to feedthrough electrodes 7B5 and 7C5 of semiconductor chips 26B and 26C, as well as in a position on the front surface of semiconductor chip 26A that corresponds to feedthrough electrodes 7B4 and 7C4 of semiconductor chips 26B and 26C.

The rear surfaces of semiconductor chips 26A to 26C and 15 are made to face the side opposite from solid-state device 2, and thereby, this semiconductor device 1A can be manufactured by holding the rear surfaces of semiconductor chips 26A to 26C and 15 using bonding tool 32 so that they are sequentially joined to solid-state device 2, in the same manner as in the case of semiconductor device 1.

Figure 22:
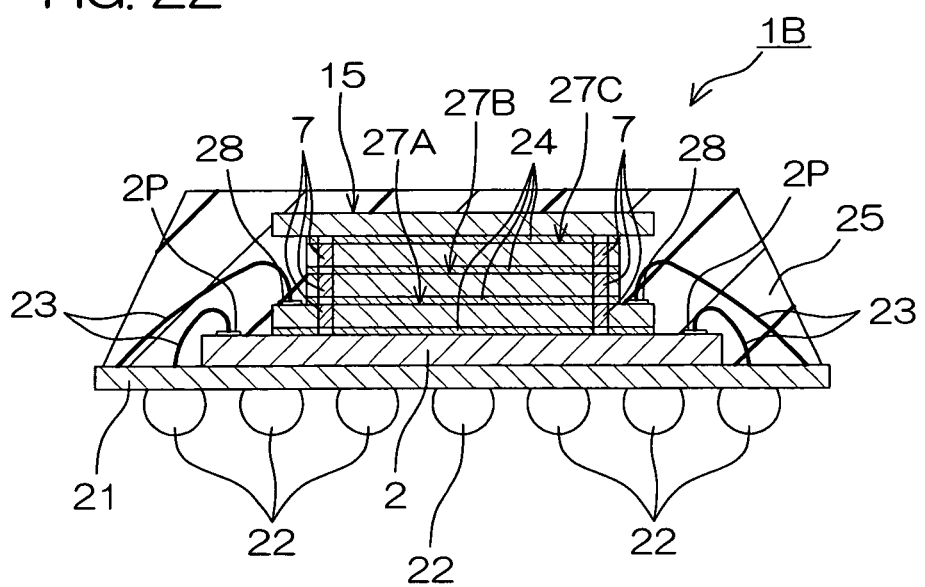
FIG. 22 is an illustrative cross-sectional diagram showing the structure of a semiconductor device according to the ninth embodiment of the present invention.

FIG. 22 is an illustrative cross-sectional diagram showing the structure of a semiconductor device according to the ninth embodiment of the present invention. In FIG. 22, the same reference symbols as those in FIG. 1 are attached to parts that correspond to the respective parts shown in FIG. 1, and overlapping descriptions thereof are omitted.

This semiconductor device 1B has a structure that is similar to that of semiconductor device 1 shown in FIG. 1, and includes four semiconductor chips 27A, 27B, 27C and 15 that have been sequentially stacked on top of solid-state device 2. The front surfaces (surfaces where functional elements are formed) of all semiconductor chips 27A, 27B, 27C and 15 are made to face the solid-state device 2 side. Semiconductor chips 27A to 27C have structures which are similar to that of semiconductor chip 3 (see FIG. 2(*a*) and FIG. 2(*b*)).

The areas of semiconductor chips 27B and 27C are smaller than those of semiconductor chips 27A and 15 in a plan view where semiconductor chips 27A to 27C and 15 are viewed vertically from the top. The peripheral portion of the rear surface of semiconductor chip 27A has a region which does not face semiconductor chips 27B and 27C, and external connection pads 28 are formed in this region. External connection pads 28 are connected to electrode pads, not shown, which are provided on wiring substrate 21, by means of bonding wires 23, and at the same time, are connected to the predetermined feedthrough electrodes 7 of semiconductor chip 27A by means of wiring members, not shown, which are provided on the rear surface of semiconductor chip 27A.

In such a structure, it is possible to make a direct electrical connection from semiconductor chip 27A to wiring substrate 21 without intervention by solid-state device 2.

Such a semiconductor device 1B can be manufactured according to a method that is the same as the manufacturing method for semiconductor device 1. Here, wiring substrate 21 and solid-state device 2 are joined before semiconductor chips 27A to 27C and 15 are joined to solid-state device 2. Wire bonding between external connection pads 28 and wiring substrate 21 can be carried out after semiconductor chip 27A is placed on and joined to solid-state device 2 before semiconductor chip 15 is joined.

Figure 23:
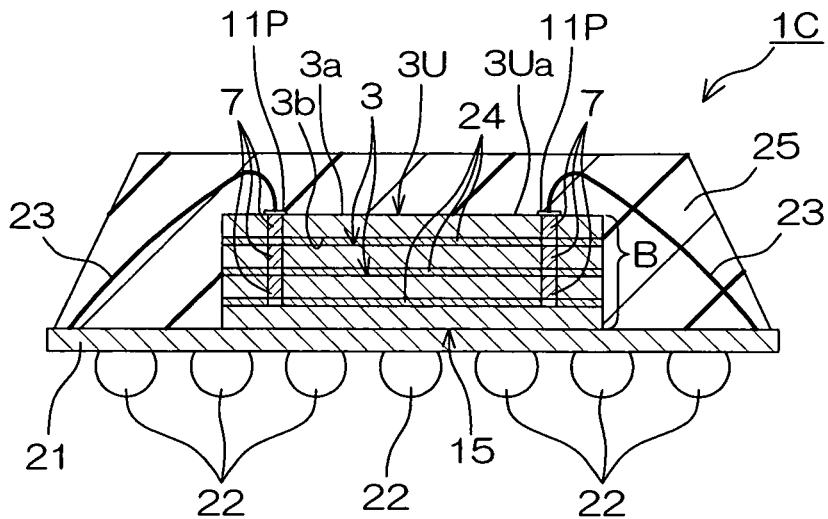
FIG. 23 is an illustrative cross-sectional diagram showing the structure of a semiconductor device according to the tenth embodiment of the present invention.

FIG. 23 is an illustrative cross-sectional diagram showing the structure of a semiconductor device according to the tenth embodiment of the present invention. In FIG. 23, the same reference symbols as those in FIG. 1 are attached to parts that correspond to the respective parts shown in FIG. 1, and overlapping descriptions thereof are omitted.

This semiconductor device 10 has a structure which is similar to that of semiconductor device 1 shown in FIG. 1 and has a BGA type package form and a multi-chip stack structure. Semiconductor device 10 includes four semiconductor chips 15, 3 and 3U, and does not include solid-state device 2. Respective semiconductor chips 15, 3 and 3U are joined in a so-called face-up style, where the front surfaces (surface where functional elements are formed) are made to face the side opposite from wiring substrate 21.

Semiconductor chip 15, which has no feedthrough electrode, is placed on and die bonded to wiring substrate 21 on top of which three semiconductor chips 3 and 3U are stacked and joined. Semiconductor chip 3U is placed in the top layer (farthest from wiring substrate 21).

Although semiconductor chip 3U has a structure which is similar to that of semiconductor chip 3 (see FIG. 2(*a*) and FIG. 2(*b*)), it is provided with external connection pads 11P in film form, instead of front surface side connection members 11 (see FIG. 2(*a*) and FIG. 2(*b*)). External connection pads 11P are formed in regions which are greater than the regions occupied by through holes 5 in a plan view where semiconductor chip 3U is viewed vertically from the top. External connection pads 11P and electrode pads, not shown, which are provided on wiring substrate 21 are connected by means of bonding wires 23.

Such a semiconductor device 10 can be manufactured as described below.

First, a block B is manufactured by stacking and joining four semiconductor chips 15, 3 and 3U.

Figure 24:
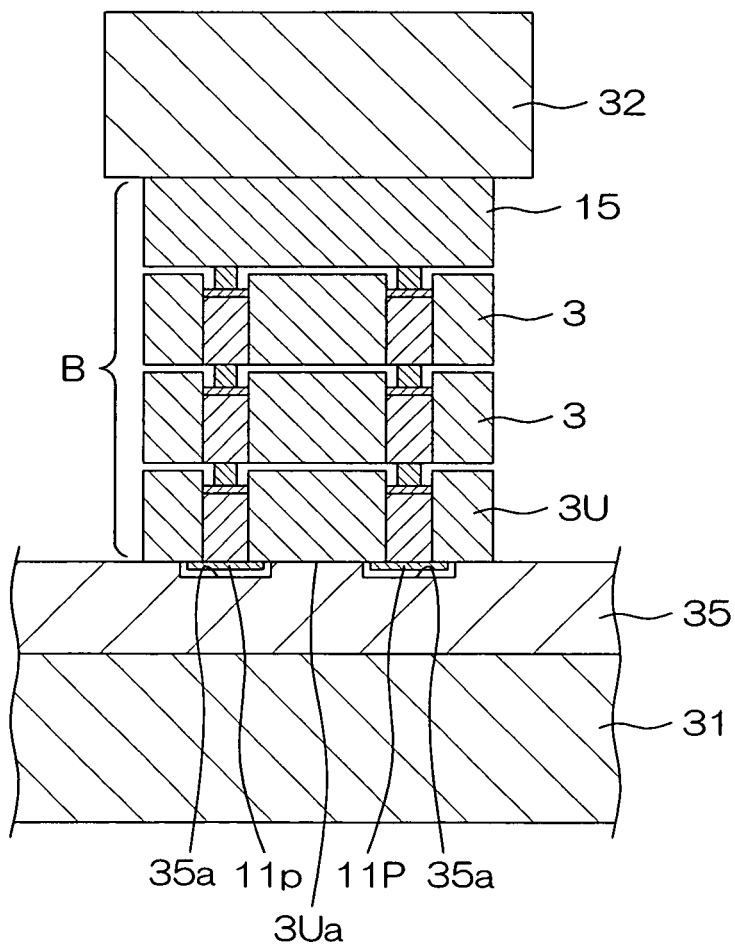
FIG. 24 is an illustrative cross-sectional diagram showing a manufacturing method for a block where a plurality of semiconductor chips are joined.

FIG. 24 is an illustrative cross-sectional diagram showing a manufacturing method for block B.

Semiconductor chips 15, 3 and 3U are joined in reverse order to that of stacking on top of wiring substrate 21. First, semiconductor chip 3U is placed on bonding stage 31 in a state where the rear surface thereof (surface where a functional element is not formed) faces upward.

Semiconductor chip 3U is held in a manner where stress is not concentrated on external connection pads 11P. Concretely, a member 35 in plate form where recesses 35a that can contain external connection pads 11P are formed in the surface is made to intervene, for example, between bonding stage 31 and semiconductor chip 3U, and thereby, semiconductor chip 3U is placed on top of this member 35 in plate form in a state where external connection pads 11P are contained in these recesses 35a.

A resin film made of a material which is the same as that of resin material layer 55 of semiconductor device 51 may be made to intervene instead of member 35 in plate form as described above. In such a case, the resin film is deformed, and thereby, stress can be prevented from being concentrated on external connection pads 11P.

Next, semiconductor chip 3 that is to be placed in the third position from the wiring substrate 21 side in semiconductor device 1C is held by bonding tool 32 in a state where front surface 3a of the chip faces downward. Subsequently, bonding tool 32 is lowered so that front surface side connection member 11 of semiconductor chip 3 that is held by bonding tool 32 and rear surface side connection member 12 of semiconductor chip 3U that is placed on bonding stage 31 are pressed against each other so as to be joined.

Furthermore, semiconductor chips 3 and 15 are sequentially joined in the same manner as in the manufacturing method for semiconductor device 1 (see FIG. 3C and FIG. 3D), and thus, block B is formed.

Next, the position of this block B is inverted so that it is upside down and the rear surface of semiconductor chip 15 is die bonded to wiring substrate 21 as a joining surface.

At this time, a collet that can grasp block B from the sides (sides of semiconductor chips 3U, 3 and 15) or a collet that can hold block B by suction by making contact with a region of a small area of front surface 3Ua of semiconductor chip 3U where external connection pads 11P are not formed is used in order to hold block B so that block B is moved to the top of wiring substrate 21.

At the time of die bonding, it is not necessary to apply a force as large as that in the case where front surface side connection member 11 and rear surface side connection member 12 are joined between wiring substrate 21 and block B, and also, it is not necessary to apply a force uniformly from the entirety of front surface 3Ua of semiconductor chip 3U in block B. Therefore, wiring substrate 21 and block B can be excellently joined, by carrying out die bonding using a collet as described above.

After that, an interlayer sealing material 24 is formed, and external connection pads 11P and electrode pads, not shown, which are provided on wiring substrate 21 are connected by means of bonding wires 23. Subsequently, the steps following the mold formation of sealing resin 25 are carried out in the same manner as in the manufacturing method for semiconductor device 1, and thereby, semiconductor device 10 shown in FIG. 23 is obtained.

In the above-described manufacturing method, rear surfaces 3b of semiconductor chips 3 and 15 are held by bonding tool 32 at the time when block B is formed by joining semiconductor chips 3U, 3 and 15 to each other. Therefore, semiconductor device 10 where semiconductor chips 3U, 3 and 15 are joined in face-up style can be manufactured without causing short-circuiting defects resulting from deformation of front surface side connection member 11, chip cracking, or joining defects resulting from contamination of rear surface side connection member 12.

Figure 25:
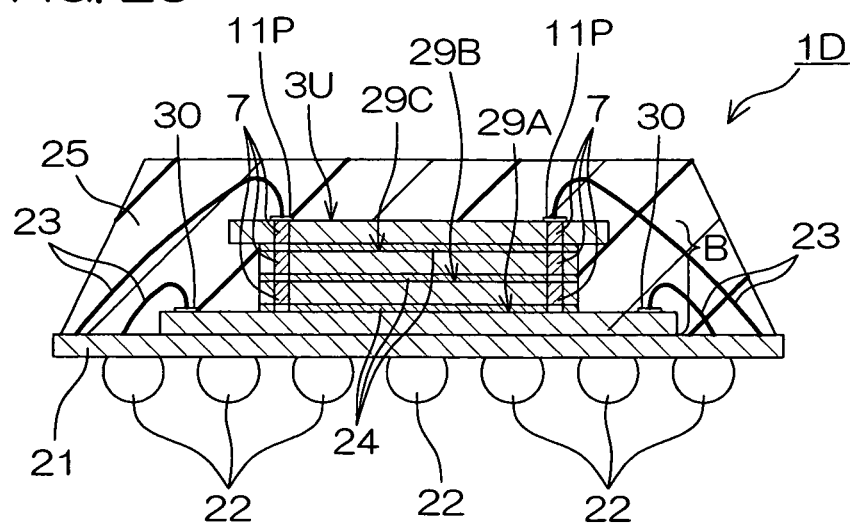
FIG. 25 is an illustrative cross-sectional diagram showing the structure of a semiconductor device according to the eleventh embodiment of the present invention.

FIG. 25 is an illustrative cross-sectional diagram showing the structure of a semiconductor device according to the eleventh embodiment of the present invention. In FIG. 25, the same reference symbols as those in FIG. 1 are attached to parts that correspond to the respective parts shown in FIG. 1, and descriptions thereof are omitted.

This semiconductor device 1D has a structure which is similar to that of semiconductor device 1B shown in FIG. 23, and includes wiring substrate 21 and semiconductor chips 29A to 29C and 3U which have been sequentially stacked on and joined to this substrate 21. Semiconductor chips 29A to 29C and 3U are joined in a so-called face-up style, where the front surfaces (surfaces where functional elements are formed) are made to face the side opposite from wiring substrate 21. Semiconductor chips 29B and 29C have structures which are similar to that of semiconductor chip 3, and are provided with feedthrough electrodes 7. Meanwhile, semiconductor chip 29A has a structure which is similar to that of semiconductor chip 15, and is not provided with feedthrough electrode 7.

Semiconductor chip 29A adjacent to wiring substrate is larger than semiconductor chip 3U in the top layer (farthest from wiring substrate 21), and semiconductor chips 29B and 29C which are placed between semiconductor chip 29A and semiconductor chip 3U are smaller than semiconductor chip 3U in a plan view where semiconductor chips 29A to 29C and 3U are viewed vertically from the top. Therefore, a region which does not face semiconductor chips 29B, 29C and 15 exists in the peripheral portion of the front surface of semiconductor chip 29A, and external connection pads 30 are provided in this region. External connection pads 30 and electrode pads, not shown, of wiring substrate 21 are directly connected by means of bonding wires 23.

In addition, external connection pads 11P of semiconductor chip 3U in the top layer and electrode pads, not shown, of wiring substrate 21 are connected by means of bonding wires 23.

A plurality of semiconductor chips 29A and 3U are connected to wiring substrate 21 by means of bonding wires 23, and thereby, semiconductor device 10 as described above has a high level of freedom in terms of wiring.

As a modification of this semiconductor device 10, a region which does not face semiconductor chips 29B, 29C and/or 3U, which are located above an arbitrary semiconductor chip 29A, 29B 29C or 3U is secured in this arbitrary semiconductor chip, so that external connection pads 30 can be provided in this region. Arbitrary semiconductor chip 29A, 29B, 29C or 3U and wiring substrate 21 can be electrically connected directly by means of wire bonding via these external connection pads 30.

This semiconductor device 10 can be manufactured according to a method that is the same as the manufacturing method for semiconductor device 10 (see FIG. 24). That is, after the formation of block B, where semiconductor chips 29A to 29C and 3U are joined, this block B is die bonded to wiring substrate 21. Next, external connection pads 30 of semiconductor chip 29A and external connection pads 11P of semiconductor chip 3U are wire bonded to electrode pads of wiring substrate 21. After that, the steps following the mold formation of sealing resin 25 are carried out in the same manner as in the manufacturing method for semiconductor device 1, and thereby, semiconductor device 1D shown in FIG. 25 is obtained.

Figure 26:
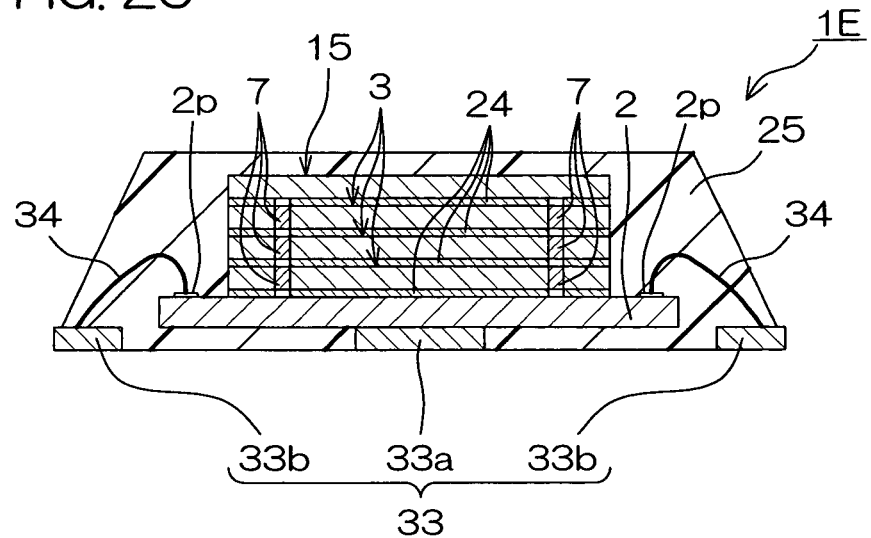
FIG. 26 is an illustrative cross-sectional diagram showing the structure of a semiconductor device according to the twelfth embodiment of the present invention.

FIG. 26 is an illustrative cross-sectional diagram showing the structure of a semiconductor device according to the twelfth embodiment of the present invention. In FIG. 26, the same reference symbols as those in FIG. 1 are attached to parts that correspond to the respective parts shown in FIG. 1, and descriptions thereof are omitted.

This semiconductor device 1E has a structure which is similar to that of semiconductor device 1 shown in FIG. 1, and has a so-called QFN (quad flat non-lead) type package form, where a lead frame 33 is provided instead of wiring substrate 21 and metal balls 22. Lead frame 33 is in plate form, and is placed approximately parallel to solid-state device 2 and semiconductor chips 3 and 15.

Lead frame 33 includes a support portion 33a for supporting solid-state device 2 from below (from the side opposite from semiconductor chip 3), and a plurality of lead terminal portions 33b which are placed to the side of support portion 33a on approximately the same plane.

Support portion 33a is smaller than solid-state device 2 in a plan view where support portion 33a and solid-state device 2 are viewed vertically from the top, and supports approximately the center portion of solid-state device 2 in the cross section of FIG. 26. Lead terminal portions 33b and solid-state device 2 do not face each other, and external connection pads 2P of solid-state device 2 and lead terminal portions 33b are connected by means of bonding wires 34.

Lead frame 33 is exposed from sealing resin 25 on the bottom (surface on the side where lead frame 33 is placed) of semiconductor device 1E, and the exposed surface of lead frame 33 and the surface of sealing resin 25 are on approximately the same plane. Lead terminal portions 33b are also exposed from the sides of semiconductor device 1E. Solder plating has been carried out on the exposed portions of lead terminal portions 33b, and semiconductor device 1E can be mounted on another wiring substrate or the like via this solder.

The gaps between support portion 33a and lead terminal portions 33b are designed so as to be gaps which prevent support portion 33a and lead terminal portions 33b from being electrically short-circuited through solder at the time when this semiconductor device 1E is mounted. As long as there is no risk that support portion 33a and lead terminal portions 33b may electrically be short-circuited through solder, support portion 33a may be greater than solid-state device 2, and the gaps between support portion 33a and lead terminal portions 33b may be made smaller in a plan view where support portion 33a and solid-state device 2 are viewed vertically from the top.

This semiconductor device 1E can be manufactured by replacing wiring substrate 21 with lead frame 33 according to the manufacturing method for semiconductor device 1.

Figure 27:
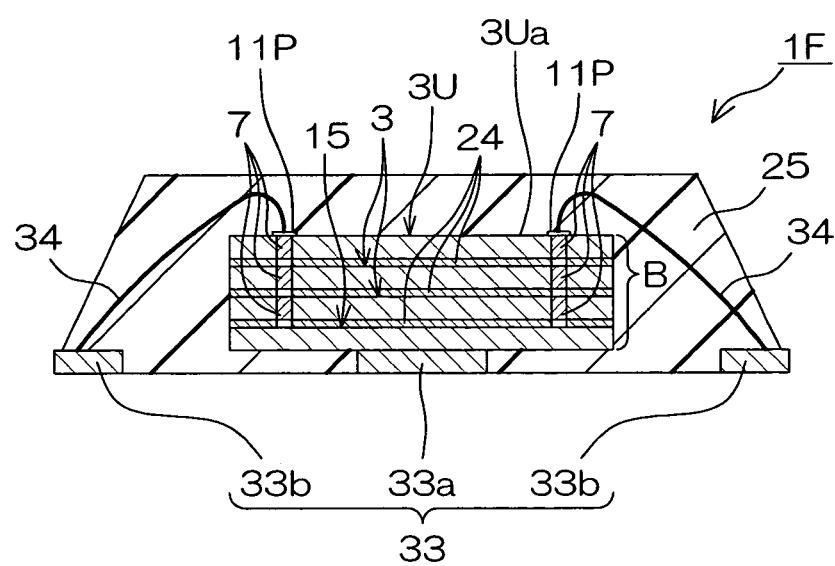
FIG. 27 is an illustrative cross-sectional diagram showing the structure of a semiconductor device according to the thirteenth embodiment of the present invention.

FIG. 27 is an illustrative cross-sectional diagram showing the structure of a semiconductor device according to the thirteenth embodiment of the present invention. In FIG. 27, the same reference symbols as those in FIG. 23 and FIG. 26 are attached to parts that correspond to the respective parts shown in FIG. 23 and FIG. 26, and overlapping descriptions thereof are omitted.

This semiconductor device 1F has a structure which is similar to that of semiconductor device 10 shown in FIG. 23, and has a so-called QFN (quad flat non-lead) type package form where a lead frame 33 is provided instead of wiring substrate 21 and metal balls 22.

Four semiconductor chips 15, 3 and 3U, which are the same as those in semiconductor device 10, are sequentially stacked on and joined to support portion 33a of lead frame 33. All semiconductor chips 15, 3 and 3U are joined in a so-called face-up style, where the front surfaces (surfaces where functional elements are formed) are made to face the side opposite from lead frame 33. The rear surface (surface where a functional element is not formed) of semiconductor chip 15 is die bonded to support portion 33a of lead frame 33. External connection pads 11P that have been formed on the front surface of semiconductor chip 3U in the top layer (farthest from the support portion 33a) are connected to lead terminal portions 33b by means of bonding wires 34.

This semiconductor device 1F can be manufactured by replacing wiring substrate 21 with lead frame 33 in the manufacturing method for semiconductor device 1C.

Although examples where the joining surfaces of rear surface side connection members 12, 42 and 72 which are joined to front surface side connection members 11, 66, 86 and 96 are located at a constant depth from rear surfaces 3b, 43b, 53b, 63b, 73b, 83b and 93b of semiconductor chips 3, 43, 53, 63, 73, 83 and 93 are cited in the above description, these joining surfaces may be on the same plane as the rear surfaces of the semiconductor chips.

Figure 28:
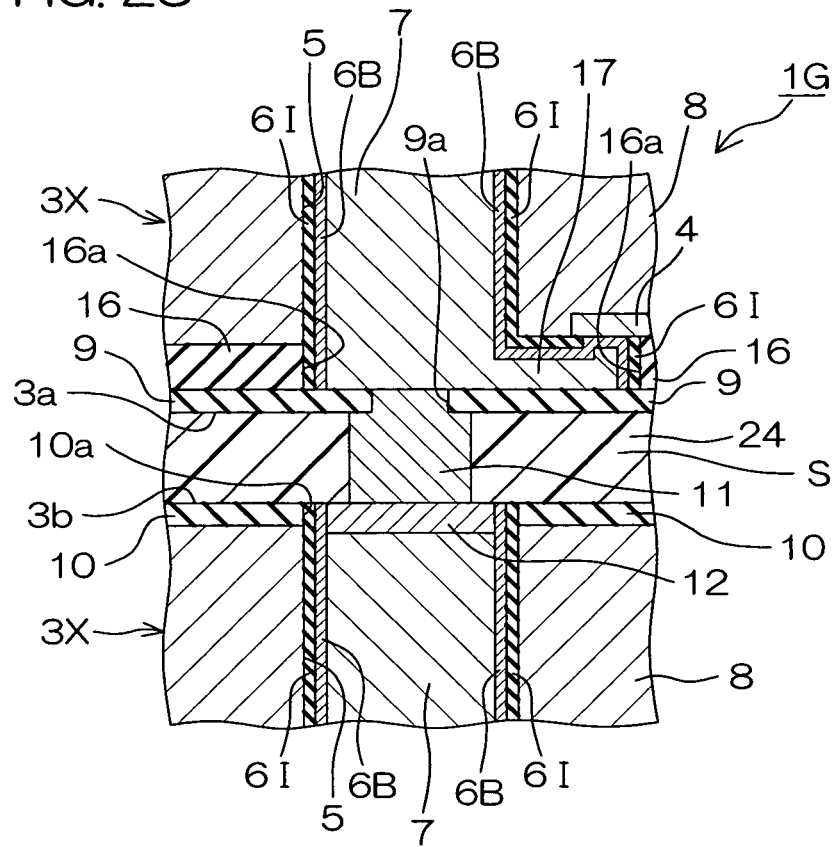
FIG. 28 is an illustrative cross-sectional diagram showing the structure of a semiconductor device according to the fourteenth embodiment of the present invention.

FIG. 28 is an illustrative cross-sectional diagram showing the structure of a semiconductor device according to the fourteenth embodiment of the present invention. In FIG. 28, the same reference symbols as those in FIG. 2(a) and FIG. 2(b) are attached to parts that correspond to the respective parts shown in FIG. 2(a) and FIG. 2(b), and overlapping descriptions thereof are omitted.

This semiconductor device 1G has a structure which is similar to that of semiconductor device 1 according to the first embodiment, and is provided with a semiconductor chip 3X instead of semiconductor chip 3. Semiconductor chip 3X has a structure which is similar to that of semiconductor chip 3, except that the surface of rear surface side connection member 12 (surface that joins to front surface side connection member 11 of another semiconductor chip 3) is approximately on the same plane as rear surface 3b, even though it is within through hole 5 which provides a recess. Accordingly, gap 18 within a recess (see FIG. 2(b)) is not formed as in semiconductor device 1.

Figure 29:
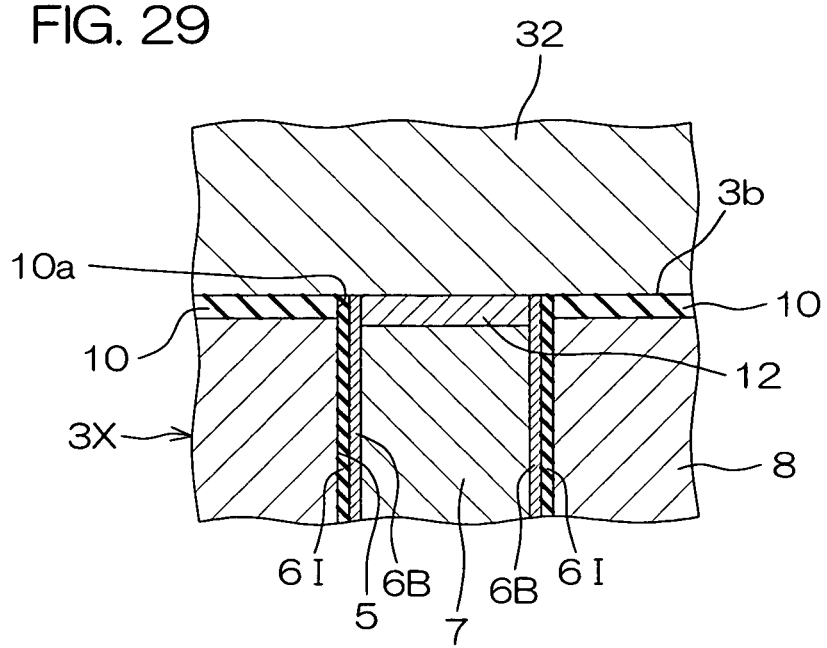
FIG. 29 is an illustrative cross-sectional diagram for explaining a manufacturing method for the semiconductor device shown in FIG. 28.
Figure 30A:
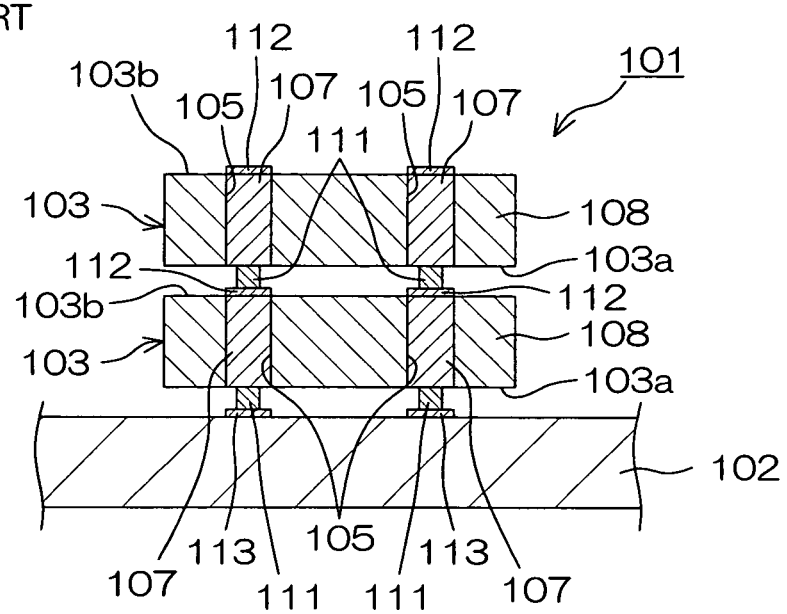
FIG. 30(a) and FIG. 30(b) are illustrative cross-sectional diagrams showing the structure of a conventional semiconductor device having a multi-chip stack structure.
Figure 30B:
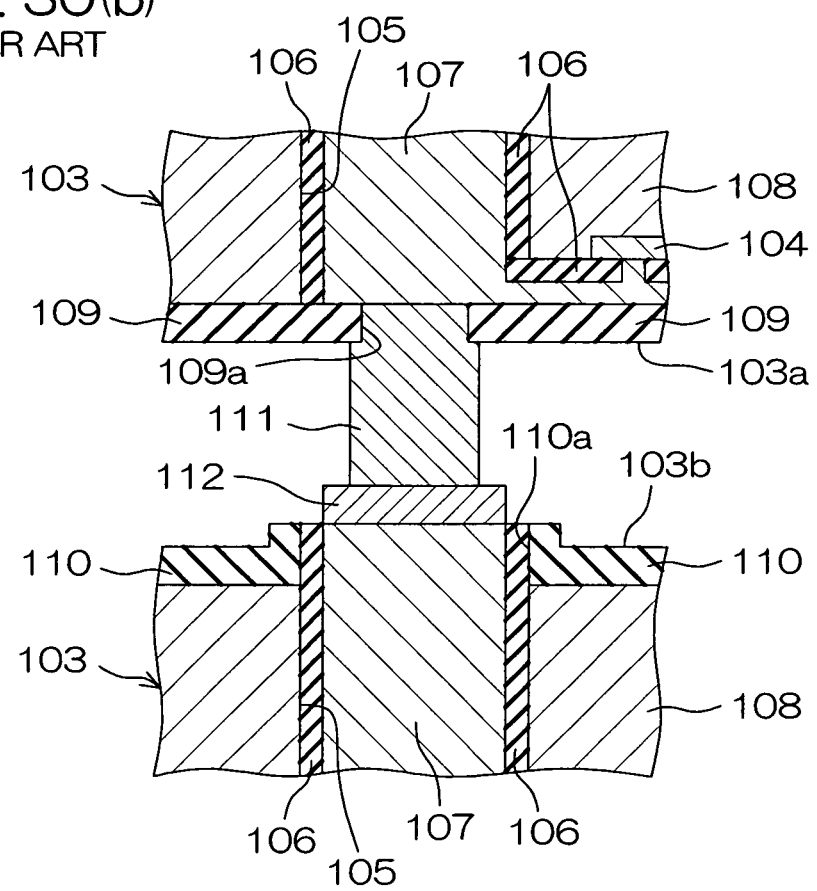

FIG. 29 is an illustrative cross-sectional diagram showing a manufacturing method for semiconductor device 1G. Semiconductor chip 3X can be joined to solid-state device 2 or another semiconductor chip 3X by holding rear surface 3b of this chip 3X using bonding tool 32, in the same manner as in the case of semiconductor chip 3.

In such a case, bonding tool 32 makes contact with rear surface protective film 10 and rear surface side connection member 12, and force that is applied to semiconductor chip 3 by bonding tool 32 is almost uniformly received by rear surface protective film 10 and rear surface side connection member 12, and thus, stress is not concentrated on rear surface side connection member 12. Accordingly in this case also, rear surface side connection member 12 is not deformed, and two adjacent rear surface side connection members 12 are not electrically short-circuited.

Such a semiconductor chip 3X where a joining surface (upper surface) of rear surface side connection member 12 and rear surface 3b are on the same plane can be manufactured in the following manner, for example.

A state is obtained where recesses are formed above feedthrough electrodes 7 on the rear surface 3b side of semiconductor substrate 8, and a metal film made of the metal that forms rear surface side connection member 12 is formed on the entirety of the rear surface 3b side of this semiconductor substrate 8 by means of a dry process, such as sputtering or chemical vapor deposition (CVD) or a wet process, such as electrolytic plating. In the case where a metal film is formed by means of electrolytic plating, a seed layer is formed in advance on the entirety of the rear surface 3b side by means of sputtering.

As a result of this, a state is obtained where the recesses above feedthrough electrodes 7 are completely filled with the metal film. After that, the surface on which this metal film has been formed is polished by means of mechanical polishing or CMP (chemical mechanical polishing) so that the metal film which is not in the recesses is removed. The remaining portions of the metal film form rear surface side connection members 12, and the upper surface of rear surface side connection members 12 is on the same plane as rear surface 3b.

Although the embodiments of the present invention are described above, the present invention can be implemented in other forms. In the second embodiment, for example, rear surface side connection members which are members separated from additional wires 40 and connected to additional wires 40 (for example, spherical connection members) may be provided instead of rear surface side connection members 42 which are exposed portions of additional wires 40 from openings 46a. In such a case, the joining surfaces of these rear surface side connection members can be approximately on the same plane as rear surface 43b, or can be located deeper than rear surface 43b by sufficiently increasing the thickness of rear surface protective film 46.

In addition, in semiconductor device 61 of the fourth embodiment and in semiconductor device 71 of the fifth embodiment, metal balls which are in approximately spherical form and do not have protrusions 66W and 72W in wire form may be provided as front surface side connection members or rear surface side connection members instead of front surface side connection members 66 or rear surface side connection members 72 which are ball bumps.

Although it is more difficult for such metal balls to be deformed than front surface side connection members 66 which have protrusions 66W, the closer to the end (end portion on the side that makes contact with a rear surface side connection member 12 or the like) of the balls, the smaller the diameter becomes, and thereby, the metal balls are deformed more easily than front surface side connection members 11 in pillar form (see FIG. 5, FIG. 9(a) and FIG. 9(b)).

Such metal balls may be formed of a high melting point metal, such as copper, or may be made of a solder material.

In addition, the metal balls may be spherical bodies made of a high melting point metal, such as copper, of which the surface is coated with a solder material, or may be spherical bodies made of copper, of which the surface is coated with nickel and gold. Furthermore, spherical bodies made of an insulator, such as a resin, of which the surface is coated with a metal may be used instead of metal balls.

In addition, it is not necessary for front surface side connection members 11, 66, 86 and 96 to be directly joined to feedthrough electrodes 7, but rather, they may be connected via additional wires which are the same as additional wires 40 shown in FIG. 7(*a*) and FIG. 7(*b*) on front surfaces 3*a*, 44*a*, 53*a*, 63*a*, 73*a*, 83*a* and 93*a*. In such a case, front surface side connection members 11, 66, 86 and 96 can be provided in arbitrary positions away from feedthrough electrodes 7 in a plan view where semiconductor chips 3, 44, 53, 63, 73, 83 and 93 are viewed vertically from the top.

Semiconductor chips 3X, 43, 44, 53, 63, 73, 83 and 93 may be used in semiconductor devices 1A to 1F, which have the variety of structures and package forms shown in FIG. 21 to FIG. 27.

Rear surface side connection members made of a cured conductive paste may be provided instead of rear surface side connection members 12. In such a case, the rear surface side connection members can be in an uncured state at the time of joining to front surface side connection members 11. In such a case, although it is more difficult (harder) for front surface side connection members 11 to be deformed than the rear surface side connection members, the uncured conductive paste easily flows, and therefore, can easily enter gaps between front surface side connection members 11 and the inner walls of recesses 14.

Accordingly, also in such a case, contact areas between front surface side connection members 11 and the rear surface side connection members can be increased, and as a result, stress is not concentrated on the joining portions and the vicinity thereof at the time of joining, and insulating film 6I and barrier metal layer 6B are not damaged.

Although the embodiments of the present invention are described in detail, they are merely concrete examples which are used to clarify the technical contents of the present invention, and the present invention should not be limited to these examples when being interpreted, rather, the spirit and the scope of the present invention are limited only by the attached claims.

This application corresponds to Japanese Patent Application 2004-87474, which was filed on Mar. 24, 2004 in the Japanese Patent Office, and the entire disclosure of this application is incorporated herein by reference.

What is claimed is:

1. A semiconductor device, comprising:
 a first semiconductor chip, which has a first front surface and a first rear surface, and is provided with a first semiconductor substrate, a first functional element formed on the first front surface side of the first semiconductor substrate, and a first feedthrough electrode which is placed within a first through hole that penetrates the first semiconductor substrate in a direction of a first thickness thereof and which is electrically connected to the first functional element, wherein the first semiconductor chip further comprises
  a rear surface side connection member which is electrically connected to the first feedthrough electrode and which has a joining surface within a recess that is formed in the first rear surface, and
  a rear surface protective film on the first rear surface side, covering at least part of the rear surface side connection member, wherein the recess includes an opening in the rear surface protective film,
  wherein the rear surface side connection member includes a first portion exposed though the opening formed in the rear surface protective film to provide the joining surface, and a second portion which extends laterally along the first rear surface side of the first semiconductor substrate and is connected to the first feedthrough electrode, and which is covered by the rear surface protective film;
 a second semiconductor chip, which has a second front surface and a second rear surface, and is provided with a second semiconductor substrate, a second functional element formed on the second front surface side of the second semiconductor substrate, and a second feedthrough electrode which is placed within a second through hole that penetrates the second semiconductor substrate in a direction of a second thickness thereof and which is electrically connected to the second functional element, wherein the second semiconductor chip further comprises
  a front surface side connection member which protrudes from the second front surface and a device connection member which is provided between a bottom of the recess that is formed in the first rear surface of the first semiconductor chip and the second front surface of the second semiconductor chip in a manner that a gap within the recess is formed at least partially between an inner wall surface of the recess and the front surface side connection member and that electrically connects the first feedthrough electrode of the first semiconductor chip to the second feedthrough electrode of the second semiconductor chip through the rear surface side connection member, the bottom of the recess located deeper in the first semiconductor chip than the first rear surface of the first semiconductor chip in said direction of a first thickness of the first semiconductor substrate; and
 an external connection member of the semiconductor device, which is electrically connected to the first and second semiconductor chips.

2. A semiconductor device according to claim 1, wherein the external connection member is a lead frame.

3. A semiconductor chip having a front surface and a rear surface, comprising:
 a semiconductor substrate;
 a functional element formed on the front surface side of this semiconductor substrate;
 a feedthrough electrode which is placed within a through hole that penetrates the semiconductor substrate in a direction of a thickness thereof and which is electrically connected to the functional element;
 a front surface side connection member which is electrically connected to the feedthrough electrode and which protrudes from the front surface; and
 a rear surface side connection member which is electrically connected to the feedthrough electrode and displaced therefrom in a direction parallel to the rear surface of the semiconductor chip, and which has a joining surface within a recess that is formed in the rear surface; and
 a rear surface protective film on the rear surface side, covering at least part of the rear surface side connection member, wherein the recess includes an opening in the rear surface protective film,
 wherein the rear surface side connection member includes a first portion exposed though the opening formed in the rear surface protective film to provide the joining surface, and a second portion which extends laterally along the rear surface side of the semiconductor surface and is connected to the feedthrough electrode, and which is covered by the rear surface protective film.

4. A semiconductor chip according to claim 3, wherein a depth from the rear surface of the joining surface of the rear surface side connection member is smaller than a protrusion height from the front surface of the front surface side connection member.

5. A semiconductor chip according to claim 3, wherein a region occupied by the rear surface side connection member has a size that can include a region occupied by the front surface side connection member in a plan view where the semiconductor chip is viewed vertically from the top.

6. A semiconductor chip according to claim 3, wherein the front surface side connection member is made of a material that is deformed more easily than that of the rear surface side connection member.

7. A semiconductor chip according to claim 3, wherein at least one of the front surface side connection member and the rear surface side connection member includes a spherical connection member.

8. A semiconductor chip according to claim 3, wherein at least one of the front surface side connection member and the rear surface side connection member includes a solder material.

9. A semiconductor chip according to claim 8, wherein a solder resist is formed on the rear surface.

10. A semiconductor chip according to claim 3, wherein the rear surface side is covered with a resin material layer.

11. A semiconductor device, comprising:
  first and second semiconductor chips, each of which has a front surface and a rear surface, and is provided with
  a semiconductor substrate,
  a functional element formed on the front surface side of the semiconductor substrate, and
  a feedthrough electrode which is placed within a through hole that penetrates the semiconductor substrate in a direction of a thickness thereof and which is electrically connected to the functional element,
  wherein a width of the through hole is substantially constant throughout the respective semiconductor chip in the direction of thickness thereof;
  a connection member which is provided between a bottom of a recess that is formed in the rear surface of the first semiconductor chip and the front surface of the second semiconductor chip in a manner that a gap within the recess is formed at least partially between an inner wall surface of the recess and the connection member and which electrically connects the feedthrough electrode of the first semiconductor chip to the feedthrough electrode of the second semiconductor chip, the bottom of the recess located deeper in the first semiconductor chip than the rear surface of the first semiconductor chip in said direction of a thickness of the semiconductor substrate thereof,
  wherein the connection member includes an extended portion which extends along the rear surface side of the semiconductor substrate of the first semiconductor chip and is connected to the feedthrough electrode,
  a protective film on the rear surface side of the first semiconductor chip, covering the extended portion, wherein the recess includes an opening in the rear surface protective film,
  wherein the extended portion of the connection member extends laterally to the feedthrough electrode of the first semiconductor chip, which is covered by the protective film; and
  an external connection member of the semiconductor device, which is electrically connected to the first and second semiconductor chips.

\* \* \* \* \*